US007830281B2

(12) United States Patent
Sakaguchi

(10) Patent No.: US 7,830,281 B2
(45) Date of Patent: Nov. 9, 2010

(54) VARIABLE-LENGTH CODE DECODING APPARATUS, VARIABLE-LENGTH CODE DECODING METHOD, AND PROGRAM

(75) Inventor: Hiroaki Sakaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 30 days.

(21) Appl. No.: 12/417,262

(22) Filed: Apr. 2, 2009

(65) Prior Publication Data
US 2009/0261995 A1 Oct. 22, 2009

(30) Foreign Application Priority Data
Apr. 3, 2008 (JP) ............................ P2008-097062

(51) Int. Cl.
*H03M 7/40* (2006.01)
(52) U.S. Cl. ...................... 341/67; 382/246; 712/200
(58) Field of Classification Search ............. 341/50–90; 382/246; 712/200, 209, 300
See application file for complete search history.

(56) References Cited

U.S. PATENT DOCUMENTS 5,784,631 A * 7/1998 Wise ........................... 382/246

FOREIGN PATENT DOCUMENTS

JP 6 104769 4/1994

* cited by examiner

*Primary Examiner*—Lam T Mai
(74) *Attorney, Agent, or Firm*—Frommer Lawrence & Haug LLP; William S. Frommer; Thomas F. Presson

(57) ABSTRACT

Disclosed herein is a variable-length code decoding apparatus including: a code buffer that holds a variable-length code in which the same bit value continues for a given number of bits from the most significant bit; code word detectors each of which reads the variable-length code from the code buffer to detect whether the variable-length code matches a specified code word; a decoded code word determination block that determines a code word decoded; and a configuration information holding section that holds configuration information containing the specified code words and code lengths of the specified code words as arranged in an ascending order of code length.

10 Claims, 53 Drawing Sheets

FIG. 5

CCMAP

| 127 | 126 | 125 | 124 | 123 | 122 | 121 | 120 | 119 | 118 | 117 | 116 | 115 | 114 | 113 | 112 |
|---|---|---|---|---|---|---|---|---|---|---|---|---|---|---|---|
| CCMAP (EID) | CCMAP (16) | CCMAP (15) | CCMAP (14) | CCMAP (13) | CCMAP (12) | CCMAP (11) | CCMAP (10) | CCMAP (9) | CCMAP (8) | CCMAP (7) | CCMAP (6) | CCMAP (5) | CCMAP (4) | CCMAP (3) | CCMAP (2) |

| 111 | 110 |
|---|---|
| CCMAP (1) | CCMAP (0) |

VLDCTX

| 109 | 108 | 107 | 106 | 105 | 104 | 103 | 102 | 101 | 100 | 99 | 98 | 97 | 96 |
|---|---|---|---|---|---|---|---|---|---|---|---|---|---|
| D(16) | D(15) | D(14) | D(13) | D(12) | D(11) | D(10) | D(8) | D(7) | | D(6) | D(5) | | D(4) |

| 95 | 94 | 93 | 92 | 91 | 90 | 89 | 88 | 87 | 86 | 85 | 84 | 83 | 82 | 81 | 80 |
|---|---|---|---|---|---|---|---|---|---|---|---|---|---|---|---|
| D(3) | | D(2) | | CL(9)-1 | | | | CL(1)-1 | | | | CL(0)-1 | | | |

| 79 | 78 | 77 | 76 | 75 | 74 | 73 | 72 | 71 | 70 | 69 | 68 | 67 | 66 | 65 | 64 |
|---|---|---|---|---|---|---|---|---|---|---|---|---|---|---|---|
| GP(13) | GC(13) | | | GP(9) | GC(9) | | | GP(5) | GC(5) | | | GP(0) | GC(0) | | UC(16) |

| 63 | 62 | 61 | 60 | 59 | 58 | 57 | 56 | 55 | 54 | 53 | 52 | 51 | 50 | 49 | 48 |
|---|---|---|---|---|---|---|---|---|---|---|---|---|---|---|---|
| UC(15) | | | | UC(14) | | | | UC(13) | | | | UC(12) | | | |

| 47 | 46 | 45 | 44 | 43 | 42 | 41 | 40 | 39 | 38 | 37 | 36 | 35 | 34 | 33 | 32 |
|---|---|---|---|---|---|---|---|---|---|---|---|---|---|---|---|
| UC(11) | | | | UC(10) | | | | UC(9) | | | | UC(8) | | | |

| 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|
| UC(7) | | | | UC(6) | | | | UC(5) | | | | UC(4) | | | |

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| UC(3) | | | | UC(2) | | | | UC(1) | | | | UC(0) | | | |

| INSTRUCTION FORMAT | OPERANDS | OPERATION |
|---|---|---|
| vld_decode cc,vrs | cc:3bit<br>vrs:3bit | VLD_DECODE(cc,vrs,No)<br>PC=PC+4 |
| vld_decode_cascade cc,vrs | cc:3bit<br>vrs:3bit | VLD_DECODE(cc,vrs,Yes)<br>PC=PC+4 |
| vld_baseaddr rs | rs:5bit | table_base=R[rs]<br>PC=PC+4 |
| vld_show rd,offset,except | rs:5bit<br>offset:8bit,<br>except:8bit | VLD_SHOW(rd,table_base,offset,except)<br>PC=PC+4 |
| vld_show_s rd,offset,except | rs:5bit<br>offset:8bit,<br>except:8bit | VLD_SHOW_S(rd,table_base,offset,except)<br>PC=PC+4 |
| vld_show_ss rd,offset,except | rs:5bit<br>offset:8bit,<br>except:8bit | VLD_SHOW_SS(rd,table_base,offset,except)<br>PC=PC+4 |
| vld_get rd,offset,except | rs:5bit<br>offset:8bit,<br>except:8bit | VLD_GET(rd,table_base,offset,except)<br>PC=PC+4 |
| vld_get_s rd,offset,except | rs:5bit<br>offset:8bit,<br>except:8bit | VLD_GET_S(rd,table_base,offset,except)<br>PC=PC+4 |
| vld_get_ss rd,offset,except | rs:5bit<br>offset:8bit,<br>except:8bit | VLD_GET_SS(rd,table_base,offset,except)<br>PC=PC+4 |
| showbits rd,rs | rd:5bit<br>rs:5bit | R[rd]=SHOWBITS(R[rs]);<br>PC=PC+4 |
| getbits rd,rs | rd:5bit<br>rs:5bit | R[rd]=GETBITS(R[rs]);<br>PC=PC+4 |
| get_stream rs,rt | rs:5bit<br>rt:5bit | [CLEARS CODE BUFFER, CONFIGURES DMAC WITH STARTING ADDRESS OF TREAM DATA AS R[rs] AND SIZE AS R[rt],AND STARTS TO FILL CODE BUFFER WITH STREAM DATA] PC=PC+4 |
| load_v vrd,offset(rs) | vrd:5bit<br>rs:5bit<br>offset:16bit | [READS 16 BYTES OF DATA FROM ADDRESS offset+R[rs] ON MEMORY,AND STORES IT IN 128-BIT REGISTER VR[vrd]] PC=PC+4 |
| store_v vrs,offset(base) | vrd:5bit<br>rs:5bit<br>offset:16bit | [REFERS TO CONTENT OF 128-BIT REGISTER VR[vrs], AND WRITES IT INTO 16-BYTE AREA STARTING WITH ADDRESS offset+R[base]ON MEMORY] PC=PC+4 |
| vld_br tf,cc,offset | tf:1bit<br>cc:3bit<br>offset:signed 16bit | PC=PC+4*(CCR[cc]=tf? offset:1) |

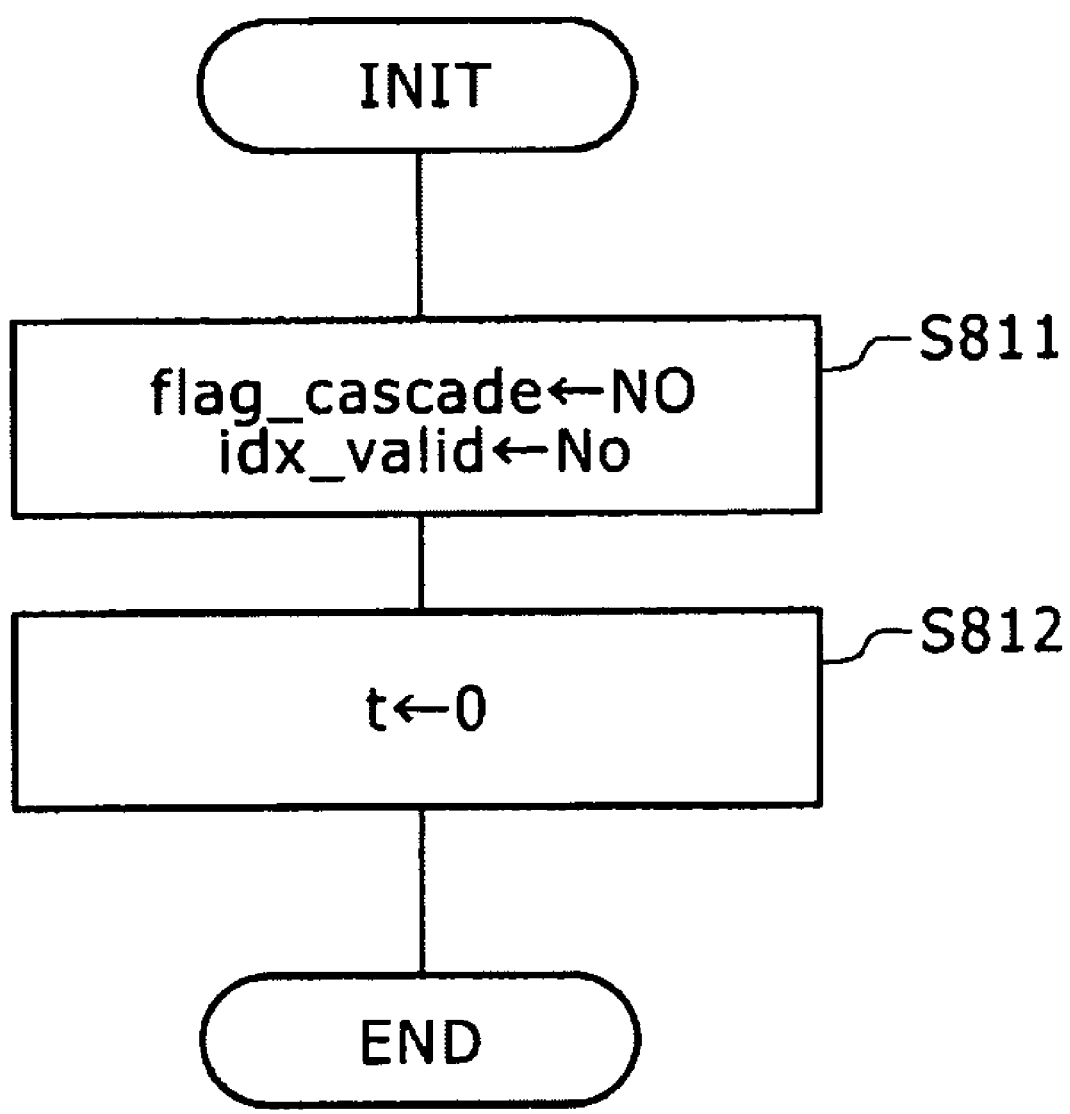
F I G. 10

F I G. 11
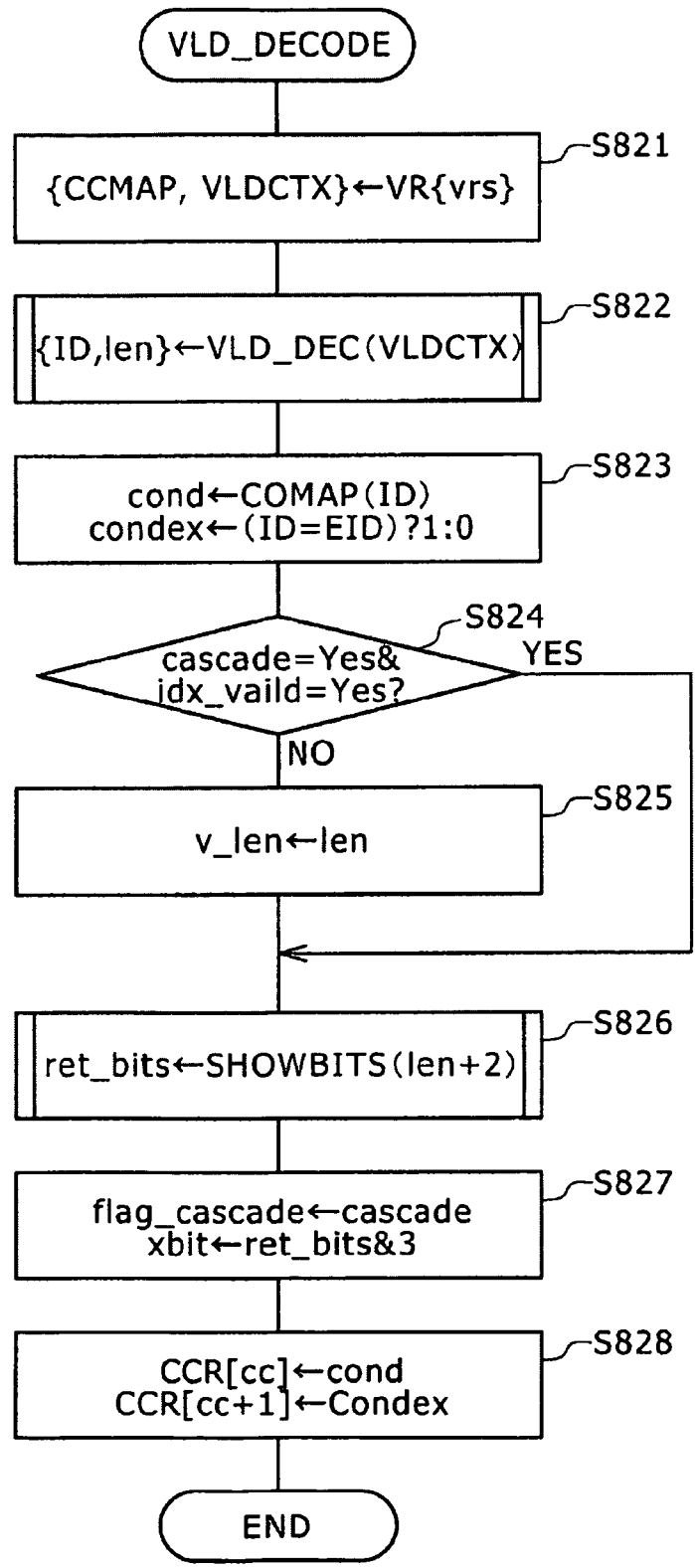

F I G. 17
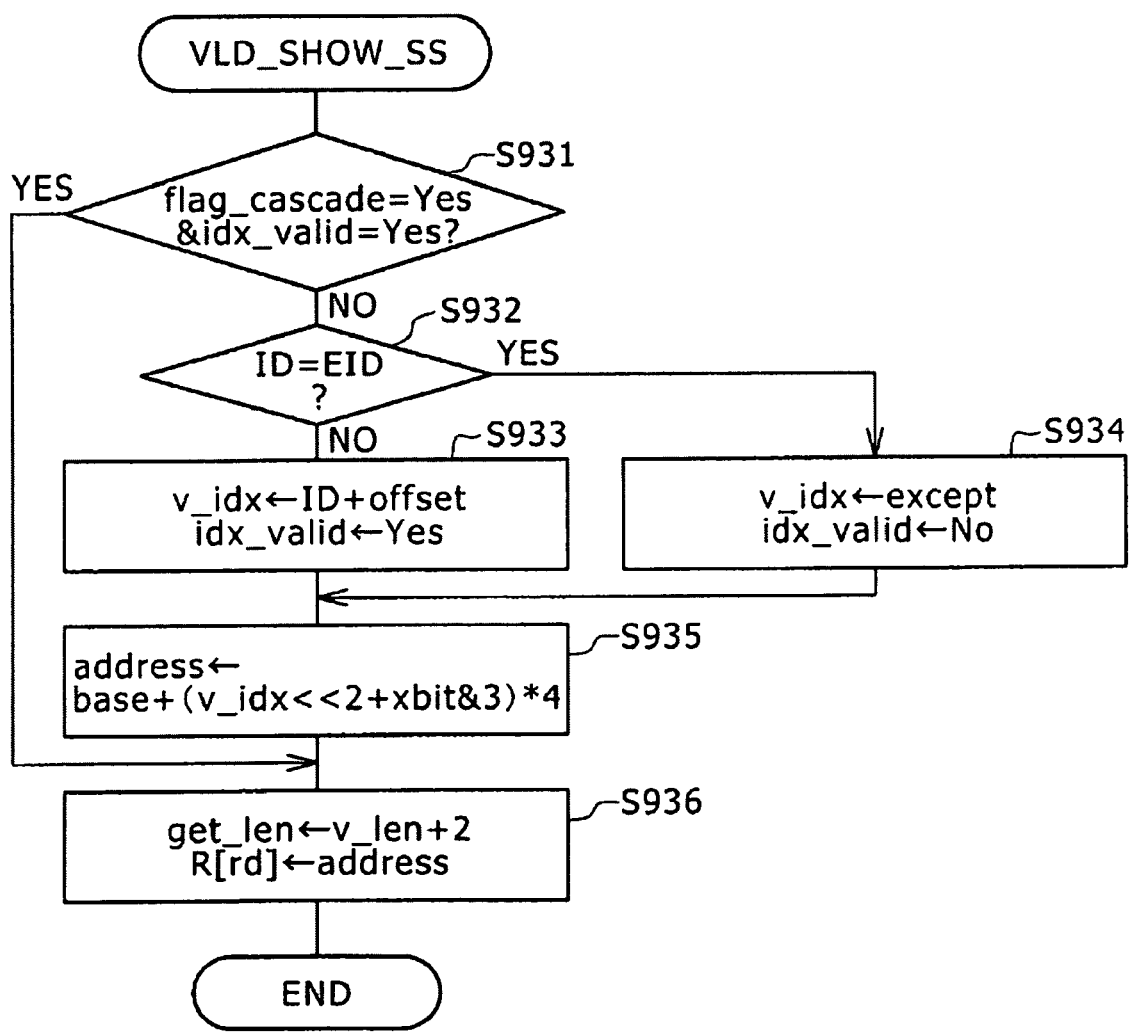

F I G. 18
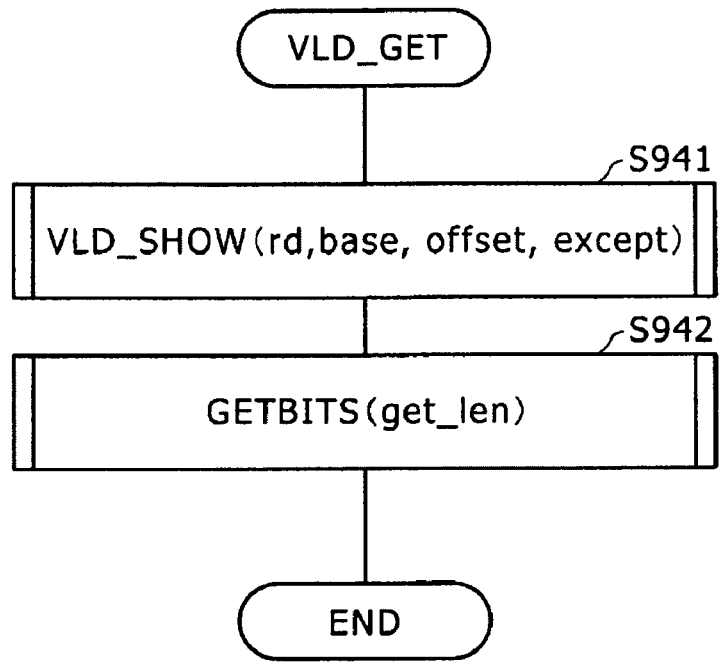
F I G. 19
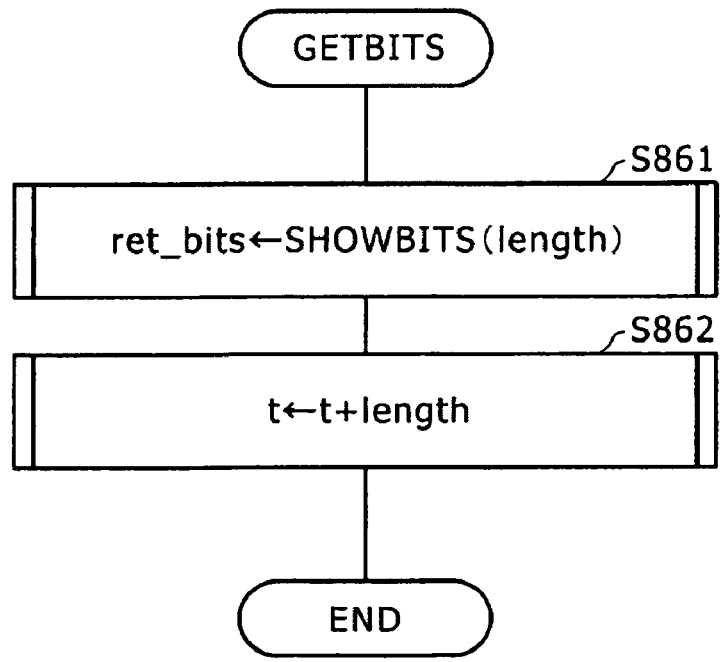

FIG. 22

| BUILT-IN FUNCTION | DESCRIPTION |
|---|---|
| void vld_baseaddr(int*addr) | STORESS addr IN R[rs] AND THEREAFTER EXECUTES "vld_baseaddr rs" |
| int vld_decode(int cxt); | EXECUTES "vld_decode cc, vrs" WITH REGISTER NUMBER INDICATED BY ctx AS vrs<br>RETURNS CCR[cc] AND CCR[cc+1] AS RETURN VALUES |
| int vld_decode_cascade(int ctx); | EXECUTES "vld_decode_cascade cc, vrs" WITH REGISTER NUMBER INDICATED BY ctx AS vrs<br>RETURNS CCR[cc] AND CCR[cc+1] AS RETURN VALUES |
| int vld_get(int offset, int except); | EXECUTES "vld_get rd, offset, except", AND RETURNS R[rd] AS RETURN VALUE |
| int vld_get_s(int offset,int except); | EXECUTES "vld_get_s rd, offset, except", AND RETURNS R[rd] AS RETURN VALUE |
| int vld_show(int offset,int except); | EXECUTES "vld_show rd, offset, except", AND RETURNS R[rd] AS RETURN VALUE |
| int vld_show_s(int offset,int except); | EXECUTES "vld_show_s rd, offset, except", AND RETURNS R[rd] AS RETURN VALUE |
| int showbits(int len); | STORES len IN R[rs] AND THEREAFTER EXECUTES "showbits rd, rs", AND RETURNS R[rd] AS RETURN VALUE |
| int getbits(int len); | STORES len IN R[rs] AND THEREAFTER EXECUTES "getbits rd, rs", AND RETURNS R[rd] AS RETURN VALUE |
| void load_v(int ctx,int*addr); | SETS offset AND R[rs] SO THAT offset+R[rs] WILL COINCIDE WITH addr, WITH REGISTER NUMBER INDICATED BY ctx AS vrd, AND EXECUTES "load_v vrd, offset(rs)" |
| void store_v(int ctx,int*addr); | SETS offset AND R[rs] SO THAT offset+R[rs] WILL COINCIDE WITH addr, WITH REGISTER NUMBER INDICATED BY ctx AS vrd, AND EXECUTES "store_v vrd, offset(rs)" |

FIG. 23

| DECODING INFORMATION | CODE WORD |
|---|---|
| 1 | 1 |
| 2 | 011 |
| 3 | 010 |
| 4 | 0011 |
| 5 | 1010 |
| 6 | 0001 1 |
| 7 | 0001 0 |
| 8 | 0000 111 |
| 9 | 0000 110 |
| 10 | 0000 1011 |
| 11 | 0000 1010 |
| 12 | 0000 1001 |
| 13 | 0000 1000 |
| 14 | 0000 0111 |
| 15 | 0000 0110 |
| 16 | 0000 0101 11 |
| 17 | 0000 0101 10 |
| 18 | 0000 0101 01 |
| 19 | 0000 0101 00 |
| 20 | 0000 0100 11 |
| 21 | 0000 0100 10 |
| 22 | 0000 0100 011 |
| 23 | 0000 0100 010 |
| 24 | 0000 0100 001 |
| 25 | 0000 0100 000 |
| 26 | 0000 0011 111 |
| 27 | 0000 0011 110 |
| 28 | 0000 0011 101 |
| 29 | 0000 0011 100 |
| 30 | 0000 0011 011 |
| 31 | 0000 0011 010 |
| 32 | 0000 0011 001 |
| 33 | 0000 0011 000 |
| 34 | 0000 0001 111 |
| 35 | 0000 0001 000 |

FIG. 25A

| DECODED CODE NUMBER | DECODING INFORMATION | CODE WORD | DECODED CODE VALUE | DECODED CODE LENGTH | CL(ID)/D(ID) | GP(ID) | GC(ID) | UC(ID) | CCMAP | CLASSIFICATION |
|---|---|---|---|---|---|---|---|---|---|---|
| 0 | 1 | 1 | 1 | 1 | CL(0)=1 | | | 0001b | 0 | CODELEAF |
| 1 | 2 | 011 | 011 | 3 | CL(1)=3 | 0b | 00b | 0011b | 0 | CODELEAF |
| 2 | 3 | 010 | 010 | 3 | D(2)=0 | | | 0010b | 0 | CODELEAF |
| 3 | 4 | 0011 | 0011 | 4 | D(3)=1 | | | 0011b | 0 | CODELEAF |
| 4 | 5 | 0010 | 0010 | 4 | D(4)=0 | | | 0010b | 0 | CODELEAF |
| 5 | 6 | 0001 1 | 0 0011 | 5 | D(5)=1 | | | 0011b | 0 | CODELEAF |
| 6 | 7 | 0001 0 | 0 0010 | 5 | D(6)=0 | | | 0010b | 0 | CODELEAF |
| 7 | 16-25 | 0001 01 * | 00 0001 | 6 | D(7)=1 | | | 0001b | 1 | CODENODE |
| 8 | 8 | 0000 111 | 0 00 0111 | 7 | D(8)=1 | 0b | 00b | 0111b | 0 | CODELEAF |
| 9 | 9 | 0000 110 | 0 00 0110 | 7 | CL(9)=7 | | | 0110b | 0 | CODELEAF |
| 10 | 26-33 | 0000 0011 * | 00 00 0011 | 8 | D(10)=1 | | | 0011b | 1 | CODENODE |
| 11 | 10 | 0000 1011 | 00 00 1011 | 8 | D(11)=0 | 0b | 00b | 1011b | 0 | CODELEAF |
| 12 | 11 | 0000 1010 | 00 00 1010 | 8 | D(12)=0 | | | 1010b | 0 | CODELEAF |
| 13 | 12 | 0000 1001 | 00 00 1001 | 8 | D(13)=0 | 0b | 00b | 1001b | 0 | CODELEAF |
| 14 | 13 | 0000 1000 | 00 00 1000 | 8 | D(14)=0 | | | 1000b | 0 | CODELEAF |
| 15 | 14 | 0000 0111 | 00 00 0111 | 8 | D(15)=0 | | | 0111b | 0 | CODELEAF |
| 16 | 15 | 0000 0110 | 00 00 0110 | 8 | D(16)=0 | | | 0110b | 0 | CODELEAF |
| 32 | 34,35 | - | - | 0 | - | - | - | - | 1 | EID |

FIG. 25B

| DECODING INFORMATION | CODE WORD | SUFFIX | RESIDUAL CODE LENGTH |
|---|---|---|---|
| 16 | 0000 01 01 11 | 01 11 | 4 |
| 17 | 0000 01 01 10 | 01 10 | 4 |
| 18 | 0000 01 01 01 | 01 01 | 4 |
| 19 | 0000 01 01 00 | 01 00 | 4 |
| 20 | 0000 01 00 11 | 00 11 | 4 |
| 21 | 0000 01 00 10 | 00 10 | 4 |
| 22 | 0000 01 00 011 | 00 011 | 5 |
| 23 | 0000 01 00 010 | 00 010 | 5 |
| 24 | 0000 01 00 001 | 00 001 | 5 |
| 25 | 0000 01 00 000 | 00 000 | 5 |

FIG. 25C

| DECODING INFORMATION | CODE WORD | SUFFIX | RESIDUAL CODE LENGTH |
|---|---|---|---|
| 26 | 0000 0011 111 | 111 | 3 |
| 27 | 0000 0011 110 | 110 | 3 |
| 28 | 0000 0011 101 | 101 | 3 |
| 29 | 0000 0011 100 | 100 | 3 |
| 30 | 0000 0011 011 | 011 | 3 |
| 31 | 0000 0011 010 | 010 | 3 |
| 32 | 0000 0011 001 | 001 | 3 |
| 33 | 0000 0011 000 | 000 | 3 |

FIG. 25D

| DECODING INFORMATION | CODE WORD | CODE LENGTH |
|---|---|---|
| 34 | 0000 0001 111 | 11 |
| 35 | 0000 0001 000 | 11 |

FIG. 29

```
int decEID(int c){return (getbits(8)==0x0f) ? 34 : 35;}
int dec7(int c){return 25 - c*2 - getbits((c==0) ? 2: 1);}
int dec10(int c){return 33 - c;} int VCTX0[4]={C0,C1,C2,C3} union {int value;int(*func)(int);} VLDTBL;
union VLDTBL vld_table[18] ={
 {func:decEID},1,2,3,4,5,6,7,{func:dec7},
 8,9,{func:dec10},10,11,12,13,14,15};

int vld(void){
  int cond0;
  union VLDTBL *tblp;

vld_baseaddr(&vld_table[0]);
  load_v(0, VCTX0);

cond0 = vld_decode(0);
  tblp = vld_get(1,0);
  if(cond0)
      return tblp->func(getbits(3));
  else
      return tblp->value;
}
```

FIG. 30A

| DECODED CODE NUMBER | DECODING INFORMATION | CODE WORD | DECODED CODE VALUE | DECODED CODE LENGTH | CL(ID)/D(ID) | GP(ID) | GC(ID) | UC(ID) | CCMAP | CLASSIFICATION |
|---|---|---|---|---|---|---|---|---|---|---|
| 0 | 1 | 1 | 1 | 1 | CL(0)=1 | | | 00001b | 0 | CODELEAF |
| 1 | 2 | 011 | 011 | 3 | CL(1)=3 | 0b | 00b | 00011b | 0 | CODELEAF |
| 2 | 3 | 010 | 010 | 3 | D(2)=0 | | | 00010b | 0 | CODELEAF |
| 3 | 4 | 0011 | 0011 | 4 | D(3)=1 | | | 00011b | 0 | CODELEAF |
| 4 | 5 | 0010 | 0010 | 4 | D(4)=0 | | | 00010b | 0 | CODELEAF |
| 5 | 6 | 00011 | 00011 | 5 | D(5)=1 | 0b | 00b | 00011b | 0 | CODELEAF |
| 6 | 7 | 00010 | 00010 | 5 | D(6)=0 | | | 00010b | 0 | CODELEAF |
| 7 | 8 | 0000 111 | 0000 111 | 7 | D(7)=2 | | | 00111b | 0 | CODELEAF |
| 8 | 9 | 0000 110 | 0000 110 | 7 | D(8)=0 | | | 00110b | 0 | CODELEAF |
| 9 | 10 | 0000 1011 | 0000 1011 | 8 | CL(9)=8 | 0b | 00b | 10111b | 0 | CODELEAF |
| 10 | 11 | 0000 1010 | 0000 1010 | 8 | D(10)=0 | | | 10010b | 0 | CODELEAF |
| 11 | 12 | 0000 1001 | 0000 1001 | 8 | D(11)=0 | | | 10011b | 0 | CODELEAF |
| 12 | 13 | 0000 1000 | 0000 1000 | 8 | D(12)=0 | | | 10000b | 0 | CODELEAF |
| 13 | 14 | 0000 0111 | 0000 0111 | 8 | D(13)=0 | 0b | 00b | 01111b | 0 | CODELEAF |
| 14 | 15 | 0000 0110 | 0000 0110 | 8 | D(14)=0 | | | 01110b | 0 | CODELEAF |
| 15 | - | . | 0000 0110 0 | 9 | D(15)=1 | | | 11000b | 0 | CODELEAF |
| 16 | 34 | 0000 0001 11* | 0000 0001 11 | 10 | D(16)=1 | | | 01100b | 1 | CODENODE |
| 32 | cascade | - | - | 0 | - | - | - | - | 0 | EID |

FIG. 30B

| DECODING INFORMATION | CODE WORD | SUFFIX | RESIDUAL CODE LENGTH |
|---|---|---|---|
| 34 | 0000 0001 111 | 1 | 1 |

FIG. 30C

| DECODED CODE NUMBER | DECODING INFORMATION | CODE WORD | DECODED CODE VALUE | DECODED CODE LENGTH | CL(ID)/D(ID) | GP(ID) | GC(ID) | UC(ID) | CCMAP | CLASSIFICATION |
|---|---|---|---|---|---|---|---|---|---|---|
| 0 | 35 | 0000 0001 00* | 0000 0001 00 | 10 | CL(0)=10 |  |  | 0100b | 1 | CODENODE |
| 1 | 26-27 | 0000 0011 11* | 0000 0011 11 | 10 | CL(1)=10 |  |  | 1111b | 1 | CODENODE |
| 2 | 28-29 | 0000 0011 10* | 0000 0011 10 | 10 | D(2)=0 | 0b | 00b | 1110b | 1 | CODENODE |
| 3 | 30-31 | 0000 0011 01* | 0000 0011 01 | 10 | D(3)=0 |  |  | 1101b | 1 | CODENODE |
| 4 | 32-33 | 0000 0011 00* | 0000 0011 00 | 10 | D(4)=0 |  |  | 1100b | 1 | CODENODE |
| 5 | 16 | 0000 0101 11 | 0000 0101 11 | 10 | D(5)=0 |  |  | 0111b | 0 | CODELEAF |
| 6 | 17 | 0000 0101 10 | 0000 0101 10 | 10 | D(6)=0 | 0b | 01b | 0110b | 0 | CODELEAF |
| 7 | 18 | 0000 0101 01 | 0000 0101 01 | 10 | D(7)=0 |  |  | 0101b | 0 | CODELEAF |
| 8 | 19 | 0000 0101 00 | 0000 0101 00 | 10 | D(8)=0 |  |  | 0100b | 0 | CODELEAF |
| 9 | 20 | 0000 0100 11 | 0000 0100 11 | 10 | CL(9)=10 |  |  | 0011b | 0 | CODELEAF |
| 10 | 21 | 0000 0100 10 | 0000 0100 10 | 10 | D(10)=0 | 0b | 01b | 0010b | 0 | CODELEAF |
| 11 | . | . | . | . | D(11)=0 |  |  | 0010b | 0 | . |
| 12 | . | . | . | . | D(12)=0 |  |  | 0010b | 0 | . |
| 13 | 22 | 0000 0100 011 | 0000 0100 011 | 11 | D(13)=1 |  |  | 0011b | 0 | CODELEAF |
| 14 | 23 | 0000 0100 010 | 0000 0100 010 | 11 | D(14)=0 | 0b | 10b | 0010b | 0 | CODELEAF |
| 15 | 24 | 0000 0100 001 | 0000 0100 001 | 11 | D(15)=0 |  |  | 0001b | 0 | CODELEAF |
| 16 | 25 | 0000 0100 000 | 0000 0100 000 | 11 | D(16)=0 |  |  | 0000b | 0 | CODELEAF |
| 32 | . | . | . | 0 | . | . | . | . | 0 | EID |

F I G. 30D

| DECODING INFORMATION | CODE WORD | SUFFIX | RESIDUAL CODE LENGTH |
|---|---|---|---|
| 35 | 0000 0001 000 | 0 | 1 |

F I G. 30E

| DECODING INFORMATION | CODE WORD | SUFFIX | RESIDUAL CODE LENGTH |
|---|---|---|---|
| 26 | 0000 0011 111 | 1 | 1 |
| 27 | 0000 0011 110 | 0 | 1 |

F I G. 30F

| DECODING INFORMATION | CODE WORD | SUFFIX | RESIDUAL CODE LENGTH |
|---|---|---|---|
| 28 | 0000 0011 101 | 1 | 1 |
| 29 | 0000 0011 100 | 0 | 1 |

F I G. 30G

| DECODING INFORMATION | CODE WORD | SUFFIX | RESIDUAL CODE LENGTH |
|---|---|---|---|
| 30 | 0000 0011 011 | 1 | 1 |
| 31 | 0000 0011 010 | 0 | 1 |

F I G. 30H

| DECODING INFORMATION | CODE WORD | SUFFIX | RESIDUAL CODE LENGTH |
|---|---|---|---|
| 32 | 0000 0011 001 | 1 | 1 |
| 33 | 0000 0011 000 | 0 | 1 |

F I G. 31

```
int VCTX0[4]={C0,C1,C2,C3};
int VCTX1[4]={C4,C5,C6,C7};

int vld_table[17+17]={
    1,2,3,4,5,6,7,8,9,10,11,12,13,14,15,0,35,
    35,27,29,31,33,16,17,18,19,20,21,0,0,22,23,24,25};
};

int vld(void){
    int cond0, cond2;
    int *tblp;

vld_baseaddr(&vld_table[0]);
    load_v(0, VCTX0);
    load_v(1, VCTX1);

cond0 = vld_decode(0);
    tblp  = vld_show(0,15);
    cond2 = vld_decode_cascasde(1);
    tblp  = vld_get(17,15);
    if(cond0 || cond2){
       return *tblp - getbits(1);
    else
       return *tblp;
}
```

FIG. 32

| DECODING INFORMATION | CODE WORD |
|---|---|
| 0 | 0111 0 |
| 1 | 1110 10 |
| 2 | 1110 11 |
| 3 | 1100 1 |
| 4 | 0110 0 |
| 5 | 1101 0 |
| 6 | 0111 1 |
| 7 | 1111 |
| 8 | 0110 1 |
| 9 | 1100 0 |
| 10 | 1101 1 |
| 11 | 000 |
| 12 | 1110 0 |
| 13 | 001 |
| 14 | 010 |
| 15 | 10 |

FIG. 34

| DECODED CODE NUMBER | DECODING INFORMATION | CODE WORD | DECODED CODE VALUE | DECODED CODE LENGTH | CL(ID)/D(ID) | GP(ID) | GC(ID) | UC(ID) | CCMAP | CLASSIFICATION |
|---|---|---|---|---|---|---|---|---|---|---|
| 0 | 15 | 10 | 10 | 2 | CL(0)=2 | | | 0010b | 0 | CODELEAF |
| 1 | 14 | 010 | 010 | 3 | CL(1)=3 | | | 0010b | 0 | CODELEAF |
| 2 | 13 | 001 | 001 | 3 | D(2)=0 | 0b | 00b | 0001b | 0 | CODELEAF |
| 3 | 11 | 000 | 000 | 3 | D(3)=0 | | | 0000b | 0 | CODELEAF |
| 4 | 7 | 1111 | 1111 | 4 | D(4)=1 | | | 1111b | 0 | CODELEAF |
| 5 | 4 | 0110 0 | 0110 0 | 5 | D(5)=1 | | | 1100b | 0 | CODELEAF |
| 6 | 8 | 0110 1 | 0110 1 | 5 | D(6)=0 | 0b | 00b | 1101b | 0 | CODELEAF |
| 7 | 0 | 0111 0 | 0111 0 | 5 | D(7)=0 | | | 1110b | 0 | CODELEAF |
| 8 | 6 | 0111 1 | 0111 1 | 5 | D(8)=0 | | | 1111b | 0 | CODELEAF |
| 9 | 9 | 1100 0 | 1100 0 | 5 | CL(9)=5 | | | 1000b | 0 | CODELEAF |
| 10 | 3 | 1100 1 | 1100 1 | 5 | D(10)=0 | 1b | 11b | 1001b | 0 | CODELEAF |
| 11 | 5 | 1101 0 | 1101 0 | 5 | D(11)=0 | | | 1010b | 0 | CODELEAF |
| 12 | 10 | 1101 1 | 1101 1 | 5 | D(12)=0 | | | 1011b | 0 | CODELEAF |
| 13 | 12 | 1110 0 | 1110 0 | 5 | D(13)=0 | | | 1100b | 0 | CODELEAF |
| 14 | 1 | 1110 10 | 1110 10 | 6 | D(14)=1 | 1b | 11b | 1010b | 0 | CODELEAF |
| 15 | 2 | 1110 11 | 1110 11 | 6 | D(15)=0 | | | 1011b | 0 | CODELEAF |
| 16 | - | - | - | 6 | D(16)=0 | | | - | 0 | - |
| 32 | - | | | 0 | | | | - | 0 | |

FIG. 35

```
int VCTX0[4]={C0,C1,C2,C3};

int vld_table[16]={15,14,13,11,7,4,8,0,6,9,3,5,10,12,1,2};

int vld(void){
  int *tblp;

vld_baseaddr(&vld_table[0]);
  load_v(0, VCTX0);

vld_decode(0);
  tblp = vld_get(0,0);
  return *tblp;
}
```

FIG. 36

| DECODING INFORMATION | CODE WORD |
|---|---|
| 0 | 1101 10 |
| 1 | 1100 01 |
| 2 | 00 |
| 3 | 1101 111 |
| 4 | 1100 000 |
| 5 | 1101 0 |
| 6 | 01 |
| 7 | 10 |
| 8 | 1100 0011 |
| 9 | 1100 0010 1 |
| 10 | 1100 0010 0 |
| 11 | 1101 1100 |
| 12 | 1100 1 |
| 13 | 1101 1101 |
| 14 | 1110 |
| 15 | 1111 |

FIG. 38A

| DECODED CODE NUMBER | DECODING INFORMATION | CODE WORD | DECODED CODE VALUE | DECODED CODE LENGTH | CL(ID)/D(ID) | GP(ID) | GC(ID) | UC(ID) | CCMAP | CLASSIFICATION |
|---|---|---|---|---|---|---|---|---|---|---|
| 0 | 2 | 00 | 00 | 2 | CL(0)=2 | | | 0000b | 0 | CODELEAF |
| 1 | 6 | 01 | 01 | 2 | CL(1)=2 | 0b | 00b | 0001b | 0 | CODELEAF |
| 2 | 7 | 10 | 10 | 2 | D(2)=0 | | | 0010b | 0 | CODELEAF |
| 3 | 14 | 1110 | 1110 | 4 | D(3)=2 | | | 1110b | 0 | CODELEAF |
| 4 | 15 | 1111 | 1111 | 4 | D(4)=1 | | | 1111b | 0 | CODELEAF |
| 5 | 5 | 1101 0 | 1 1010 | 5 | D(5)=1 | 0b | 11b | 1010b | 0 | CODELEAF |
| 6 | 12 | 1100 1 | 1 1001 | 5 | D(6)=0 | | | 1001b | 0 | CODELEAF |
| 7 | 0 | 1101 10 | 11 0110 | 6 | D(7)=1 | 1b | 10b | 0110b | 0 | CODELEAF |
| 8 | 1 | 1101 01 | 11 0001 | 6 | D(8)=0 | | | 0001b | 0 | CODELEAF |
| 9 | 4 | 1100 000 | 110 0000 | 7 | CL(9)=7 | | | 0000b | 0 | CODELEAF |
| 10 | 3 | 1101 111 | 110 1111 | 7 | D(10)=0 | 1b | 00b | 1111b | 0 | CODELEAF |
| 11 | 11,13 | 1101 110* | 110 1110 | 7 | D(11)=0 | | | 1110b | 1 | CODENODE |
| 12 | - | - | 110 1110 | 7 | D(12)=0 | | | 1110b | 0 | - |
| 13 | 8 | 1100 0011 | 1100 0011 | 8 | D(13)=1 | | | 0011b | 0 | CODELEAF |
| 14 | 10,9 | 1100 0010* | 1100 0010 | 8 | D(14)=0 | | | 0010b | 1 | CODENODE |
| 15 | - | - | 1100 0010 | 8 | D(15)=0 | | | 0010b | 0 | - |
| 16 | - | - | 1100 0010 | 8 | D(16)=0 | | | 0010b | 0 | - |
| 32 | - | - | - | 0 | - | - | - | - | - | - |

FIG. 38B

| DECODING INFORMATION | CODE WORD | SUFFIX | RESIDUAL CODE LENGTH |
|---|---|---|---|
| 11 | 1101 110 0 | 0 | 1 |
| 13 | 1101 110 1 | 1 | 1 |

FIG. 38C

| DECODING INFORMATION | CODE WORD | SUFFIX | RESIDUAL CODE LENGTH |
|---|---|---|---|
| 9 | 1100 0010 1 | 1 | 1 |
| 10 | 1100 0010 0 | 0 | 1 |

F I G. 39

```
int dec11(int c){return 11 + c*2;}
int dec14(int c){return 10 - c;} int VCTX0[4]={C0,C1,C2,C3} union {int value;int (*func)(int);} VLDTBL;
union VLDTBL vld_table[15] ={
    2,6,7,14,15,5,12,0,1,4,3,{func:dec11},0,8,{func:dec14}};

int vld(void){
    int cond0;
    union VLDTBL *tblp;

vld_baseaddr(&vld_table[0]);
    load_v(0, VCTX0);

cond0 = vld_decode(0);
    tblp = vld_get(0,12);
    if(cond0){
        int c = getbits(1);
        return tblp->func(c);
    }else{
        return tblp->value;
    }
}
```

FIG. 40

| DECODING INFORMATION | CODE WORD |
|---|---|
| 0 | 1 |
| 0.5 | 010 |
| -0.5 | 011 |
| 1 | 0010 |
| -1 | 0011 |
| 1.5 | 0001 0 |
| -1.5 | 0001 1 |
| 2 | 0000 110 |
| -2 | 0000 111 |
| 2.5 | 0000 1010 |
| -2.5 | 0000 1011 |
| 3 | 0000 1000 |
| -3 | 0000 1001 |
| 3.5 | 0000 0110 |
| -3.5 | 0000 0111 |
| 4 | 0000 0101 10 |
| -4 | 0000 0101 11 |
| 4.5 | 0000 0101 00 |
| -4.5 | 0000 0101 01 |
| 5 | 0000 0100 10 |
| -5 | 0000 0100 11 |
| 5.5 | 0000 0100 010 |
| -5.5 | 0000 0100 011 |
| 6 | 0000 0100 000 |
| -6 | 0000 0100 001 |
| 6.5 | 0000 0011 110 |
| -6.5 | 0000 0011 111 |
| 7 | 0000 0011 100 |
| -7 | 0000 0011 101 |
| 7.5 | 0000 0011 010 |
| -7.5 | 0000 0011 011 |
| 8 | 0000 0011 000 |
| -8 | 0000 0011 001 |
| 8.5 | 0000 0010 110 |
| -8.5 | 0000 0010 111 |
| 9 | 0000 0010 100 |
| -9 | 0000 0010 101 |
| 9.5 | 0000 0010 010 |
| -9.5 | 0000 0010 011 |
| 10 | 0000 0010 000 |
| -10 | 0000 0010 001 |
| 10.5 | 0000 0001 110 |
| -10.5 | 0000 0001 111 |
| 11 | 0000 0001 100 |
| -11 | 0000 0001 101 |
| 11.5 | 0000 0001 010 |
| -11.5 | 0000 0001 011 |
| 12 | 0000 0001 000 |
| -12 | 0000 0001 001 |
| 12.5 | 0000 0000 1110 |
| -12.5 | 0000 0000 1111 |
| 13 | 0000 0000 1100 |
| -13 | 0000 0000 1101 |
| 13.5 | 0000 0000 1010 |
| -13.5 | 0000 0000 1011 |
| 14 | 0000 0000 1000 |
| -14 | 0000 0000 1001 |
| 14.5 | 0000 0000 0110 |
| -14.5 | 0000 0000 0111 |
| 15 | 0000 0000 0100 |
| -15 | 0000 0000 0101 |
| 15.5 | 0000 0000 0011 0 |
| -15.5 | 0000 0000 0011 1 |
| 16 | 0000 0000 0010 0 |
| -16 | 0000 0000 0010 1 |

F I G. 41A

| DECODED CODE NUMBER | DECODING INFORMATION | CODE WORD | DECODED CODE VALUE | DECODED CODE LENGTH | CL(ID)/D(ID) | GP(ID) | GC(ID) | UC(ID) | CCMAP | CLASSIFICATION |
|---|---|---|---|---|---|---|---|---|---|---|
| 0 | 5.5 | 0000 0100 01s | 0000 0100 01 | 1 | CL(0)=10 | | | 0001b | 1 | CODENODE1 |
| 1 | 0 | 1 | 1 | 2 | CL(1)=1 | | | 0001b | 0 | CODELEAF |
| 2 | 0.5 | 01s | 01 | 3 | D(2)=1 | | | 0001b | 1 | CODENODE1 |
| 3 | 1 | 001s | 001 | 4 | D(3)=1 | 0b | 01b | 0001b | 1 | CODENODE1 |
| 4 | 1.5 | 0001s | 0001 | 5 | D(4)=1 | | | 0001b | 1 | CODENODE1 |
| 5 | 2 | 0000 11s | 0000 11 | 6 | D(5)=2 | | | 0011b | 1 | CODENODE1 |
| 6 | 2.5 | 0000 101s | 0000 101 | 7 | D(6)=1 | 0b | 00b | 0101b | 1 | CODENODE1 |
| 7 | 3 | 0000 100s | 0000 100 | 7 | D(7)=0 | | | 0100b | 1 | CODENODE1 |
| 8 | 3.5 | 0000 011s | 0000 011 | 7 | D(8)=0 | | | 0011b | 1 | CODENODE1 |
| 9 | 4 | 0000 0101 1s | 0000 0101 1 | 8 | CL(9)=9 | | | 1011b | 1 | CODENODE1 |
| 10 | 4.5 | 0000 0101 0s | 0000 0101 0 | 9 | D(10)=0 | 0b | 00b | 1010b | 1 | CODENODE1 |
| 11 | 5 | 0000 0100 1s | 0000 0100 1 | 9 | D(11)=0 | | | 1001b | 1 | CODENODE1 |
| 12 | 6.5 | 0000 0011 11s | 0000 0011 11 | 10 | D(12)=1 | | | 1111b | 1 | CODENODE1 |
| 13 | 7 | 0000 0011 10s | 0000 0011 10 | 10 | D(13)=0 | | | 1110b | 1 | CODENODE1 |
| 14 | 7.5 | 0000 0011 01s | 0000 0011 01 | 10 | D(14)=0 | 0b | 00b | 1101b | 1 | CODENODE1 |
| 15 | 8 | 0000 0011 00s | 0000 0011 00 | 10 | D(15)=0 | | | 1100b | 1 | CODENODE1 |
| 16 | 8.5 | 0000 0010 11s | 0000 0010 11 | 10 | D(16)=0 | | | 1011b | 1 | CODENODE1 |
| 32 | CASCADE | - | - | 0 | - | - | - | - | 1 | - |

F I G. 41B

| DECODED CODE NUMBER | DECODING INFORMATION | CODE WORD | DECODED CODE VALUE | DECODED CODE LENGTH | CL(ID)/D(ID) | GP(ID) | GC(ID) | UC(ID) | CCMAP | CLASSIFICATION |
|---|---|---|---|---|---|---|---|---|---|---|
| 0 | 8 | 0000 0100 0ss | 0000 0100 0 | 9 | CL(0)=9 | | | 1000b | 1 | CODENODE2 |
| 1 | 9 | 0000 0010 10s | 0000 0010 10 | 10 | CL(1)=10 | 0b | 00b | 1010b | 0 | CODENODE1 |
| 2 | 9.5 | 0000 0010 01s | 0000 0010 01 | 10 | D(2)=0 | | | 1001b | 0 | CODENODE1 |
| 3 | 10 | 0000 0010 00s | 0000 0010 00 | 10 | D(3)=0 | | | 1000b | 0 | CODENODE1 |
| 4 | 10.5 | 0000 0001 11s | 0000 0001 11 | 10 | D(4)=0 | 0b | 00b | 0111b | 0 | CODENODE1 |
| 5 | 11 | 0000 0001 10s | 0000 0001 10 | 10 | D(5)=0 | | | 0110b | 0 | CODENODE1 |
| 6 | 11.5 | 0000 0001 01s | 0000 0001 01 | 10 | D(6)=0 | | | 0101b | 0 | CODENODE1 |
| 7 | 12 | 0000 0001 00s | 0000 0001 00 | 10 | D(7)=0 | 0b | 00b | 0100b | 0 | CODENODE1 |
| 8 | 12.5 | 0000 0000 111s | 0000 0000 111 | 11 | D(8)=1 | | | 0111b | 0 | CODENODE1 |
| 9 | 13 | 0000 0000 110s | 0000 0000 110 | 11 | CL(9)=11 | | | 0110b | 0 | CODENODE1 |
| 10 | 13.5 | 0000 0000 101s | 0000 0000 101 | 11 | D(10)=0 | | | 0101b | 0 | CODENODE1 |
| 11 | 14 | 0000 0000 100s | 0000 0000 100 | 11 | D(11)=0 | 0b | 00b | 0100b | 0 | CODENODE1 |
| 12 | 14.5 | 0000 0000 011s | 0000 0000 011 | 11 | D(12)=0 | | | 0011b | 0 | CODENODE1 |
| 13 | 15 | 0000 0000 010s | 0000 0000 010 | 12 | D(13)=0 | | | 0011b | 0 | CODENODE1 |
| 14 | 15.5 | 0000 0000 0011s | 0000 0000 0011 | 12 | D(14)=1 | | | 0010b | 0 | CODENODE1 |
| 15 | 16 | 0000 0000 0010s | 0000 0000 0010 | 12 | D(15)=0 | | | 0010b | 0 | CODENODE1 |
| 16 | · | · | 0000 0000 0010 | 0 | D(16)=0 | · | · | · | 0 | · |
| 32 | | | | | | | | | | |

F I G. 44

```
int VCTX0[4]={C0,C1,C2,C3};
int VCTX0[4]={C4,C5,C6,C7};

int vld_table[(17+16)*2] ={
  5.5,-5.5,0,0,0.5,-0.5,1,-1,1.5,-1.5,2,-2,2.5,-2.5,3,-3
  ,3.5,-3.5,4,4.5,-4.5,5,-5,6.5,-6.5,7,-7,7.5,-7.5,8,-8,
  8.5,-8.5,
  6,-6,9,-9,9.5,-9.5,10,-10,10.5,-10.5,11,-11,11.5,-11.5,
  12,-12,12.5,-12.5,13,-13,13.5,-13.5,14,-14,14.5,-14.5,
  15,-15,15.5,-15.5,16,-16
};

int vld(void){
  int cond0,cond2;
  int *tblp;

vld_baseaddr(&vld_table[0]);
  load_v(0, VCTX0);
  load_v(1, VCTX1);

cond0 = vld_decode(0);
  tblp  = vld_show_s(0,1*2);
  cond2 = vld_decode_cascade(1);
  if(cond0){
    tblp = vld_get_s(17*2,1*2);
    if(cond2)
      return getbits(1)==1 ? -6 : 6;
    else
      return *tblp;
  }else{
    vld_get(0,1*2);
    return 0;
  }
}
```

VARIABLE-LENGTH CODE DECODING APPARATUS, VARIABLE-LENGTH CODE DECODING METHOD, AND PROGRAM

BACKGROUND OF THE INVENTION

1. Field of the Invention

The present invention relates to a code decoding apparatus. In particular, the present invention relates to a variable-length code decoding apparatus, a method for variable-length code decoding, and a program for causing a computer to perform the method.

2. Description of the Related Art

Variable-length codes for compression purposes are, like Huffman codes, designed to assign code words with shorter code lengths to pieces of information that occur more frequently. Since the pieces of information that occur more frequently are represented by shorter codes, the number of pieces of data that are represented by long codes is not large, and on average, data coded is smaller in size than the data in its original form, i.e., data compression is achieved. Thus, in the case of the variable-length codes, it takes shorter to decode codes with higher frequencies and longer to decode codes with lower frequencies, which shortens the average decoding time. Moreover, the codes with greater frequencies have shorter code lengths, and can therefore be represented with fewer bits.

A variable-length code decoding apparatus can be implemented in a very small size, by forming a code table with a combinational circuit. Forming the code table with the combinational circuit, however, requires that the code table be fixed. In contrast, code tables are sometimes stored in a memory in order to allow subsequent support of various code tables. The simplest mode of storing the code table in the memory is to store all pairs of code values and code lengths. However, when a fixed number of bits is allocated to both the code values and the code lengths, a relatively large capacity is required, and in addition, retrieval need be done by reading and examining each code value and code length. While a time for the retrieval can be reduced by sorting the data by code length or the like, several cycles are still required. Use of an associative memory or the like is conceivable as a way of accomplishing the retrieval with fewer cycles, but that will involve a problem of an increase in circuit area.

Another conceivable mode is to store only the code lengths of the code words in the memory while arranging for the code values to coincide with offset addresses of the memory. In this mode, code values whose code length is shorter compared to the number of bits of the address are stored on the most significant bit (MSB) side, while low-order bits of the same code length are stored redundantly as an address indicating that code word. This has an advantage in that the retrieval can be accomplished instantly using the code values, but the memory needs to have an address bit corresponding to a maximum code length. The longer the address bit is, the larger amount of redundant data is involved.

As such, a decoding apparatus has been proposed that does not store the entire code table but stores, for each code length, the maximum code value and an offset address for decoding information corresponding thereto (see Japanese Patent Laid-open No. Hei 6-104769 (FIG. 1), for example). In this related art technique, without the code lengths being stored, the maximum value of the code lengths is stored at a location whose unit number or address corresponds to the code length. Then, decoding operations corresponding to a plurality of code lengths are performed at a time, in order to shorten the decoding time.

SUMMARY OF THE INVENTION

However, the above related art technique has a problem in that the amount of information as a whole is large since the code word is stored in each of units that operate in parallel.

The present invention addresses the above-identified, and other problems associated with the methods and apparatuses of the past, and aims, in a decoding apparatus equipped with a plurality of code word detectors, to shorten the average decoding time while compressing configuration information for each of the code word detectors.

According to one embodiment of the present invention, there is provided a variable-length code decoding apparatus including: a code buffer configured to hold a variable-length code in which the same bit value continues for a given number of bits from the most significant bit; a plurality of code word detectors each of which is configured to read the variable-length code from the code buffer to detect whether or not the variable-length code matches a specified code word; a decoded code word determination block configured to determine a code word decoded, based on detection results of the plurality of code word detectors; and a configuration information holding section configured to hold configuration information containing the specified code words to be detected in the plurality of code word detectors and code lengths of the specified code words as arranged in an ascending order of code length, wherein, in the configuration information, only one bit is held for the bit value that continues for the given number of bits, and at least one of the code lengths is defined by a difference from another one of the code lengths. This makes it possible to compress the configuration information for the code word detectors and hold it in the configuration information holding section.

According to another embodiment of the present invention, there is provided a computer including: a code buffer configured to hold a variable-length code in which the same bit value continues for a given number of bits from the most significant bit; a plurality of code word detectors each of which is configured to read the variable-length code from the code buffer to detect whether or not the variable-length code matches a specified code word; a decoded code word determination block configured to determine a code word decoded, based on detection results of the plurality of code word detectors; and a configuration information holding section configured to hold configuration information containing the specified code words to be detected in the plurality of code word detectors and code lengths of the specified code words as arranged in an ascending order of code length, wherein the computer executes an instruction to, in the configuration information, recover one or more of the code lengths that are defined by a difference from another one of the code lengths, and recover the given number of consecutive bits of the same bit value in accordance with the code length, based on one bit held for the bit value that continues for the given number of bits, and thereafter cause the plurality of code word detectors to perform the detection. This makes it possible to compress the configuration information for the code word detectors and hold it in the configuration information holding section, and cause a decoding process to be performed in accordance with machine language instructions.

According to yet another embodiment of the present invention, there is provided a program for causing a computer that includes a code buffer configured to hold a variable-length code in which the same bit value continues for a given number of bits from the most significant bit, a plurality of code word detectors each of which is configured to read the variable-length code from the code buffer to detect whether or not the variable-length code matches a specified code word, a decoded code word determination block configured to determine a code word decoded, based on detection results of the plurality of code word detectors, and a configuration information holding section configured to hold configuration information containing the specified code words to be detected in the plurality of code word detectors and code lengths of the specified code words as arranged in an ascending order of code length, the program, including the steps of: in the configuration information, recovering one or more of the code lengths that are defined by a difference from another one of the code lengths; in the configuration information, recovering the given number of consecutive bits of the same bit value in accordance with the code length, based on one bit held for the bit value that continues for the given number of bits; and causing the plurality of code word detectors to perform the detection. This makes it possible to compress the configuration information for the code word detectors and hold it in the configuration information holding section.

According to further another embodiment of the present invention, there is provided a variable-length code decoding method employed in a variable-length code decoding apparatus that includes a code buffer configured to hold a variable-length code in which the same bit value continues for a given number of bits from the most significant bit, a plurality of code word detectors each of which is configured to read the variable-length code from the code buffer to detect whether or not the variable-length code matches a specified code word, a decoded code word determination block configured to determine a code word decoded, based on detection results of the plurality of code word detectors, and a configuration information holding section configured to hold configuration information containing the specified code words to be detected in the plurality of code word detectors and code lengths of the specified code words as arranged in an ascending order of code length, the method including the steps of: in the configuration information, recovering one or more of the code lengths that are defined by a difference from another one of the code lengths; in the configuration information, recovering the given number of consecutive bits of the same bit value in accordance with the code length, based on one bit held for the bit value that continues for the given number of bits; and causing the plurality of code word detectors to perform the detection. This makes it possible to compress the configuration information for the code word detectors and hold it in the configuration information holding section.

The present invention makes it possible, in a decoding apparatus equipped with a plurality of code word detectors, to compress the configuration information for the code word detectors and at the same time shorten an average decoding time.

BRIEF DESCRIPTION OF THE DRAWINGS

FIG. 5 illustrates an example of configuration information according to this embodiment of the present invention;

FIG. 7 illustrates an example of the configuration information for a code word register in each of the code word detectors according to this embodiment of the present invention;

FIG. 9 illustrates instructions related to decoding of a variable-length code in an instruction set possessed by a processor according to this embodiment of the present invention;

FIG. 10 illustrates an exemplary procedure of process "INIT" according to this embodiment of the present invention;

FIG. 11 illustrates an exemplary procedure of process "VLD_DECODE" according to this embodiment of the present invention;

FIG. 17 illustrates an exemplary procedure of process "VLD_SHOW_SS" according to this embodiment of the present invention;

FIG. 18 illustrates an exemplary procedure of process "VLD_GET" according to this embodiment of the present invention;

FIG. 19 illustrates an exemplary procedure of process "GETBITS" according to this embodiment of the present invention;

FIG. 22 illustrates exemplary built-in functions of a C language compiler supposing the instruction set according to this embodiment of the present invention;

FIG. 23 illustrates a code table of MBAI defined in the MPEG standard, as an exemplary code that is to be decoded in this embodiment of the present invention;

FIGS. 25A, 25B, 25C, and 25D illustrate an example of correspondences between the configuration information, decoded code values, decoding information, and code words, when the code defined by the code table of FIG. 23 is decoded;

FIG. 29 illustrates an exemplary C language program for decoding the code that is defined by the code table of FIG. 23;

FIGS. 30A, 30B, 30C, 30D, 30E, 30F, 30G, and 30H illustrate another example of the correspondences between the configuration information, the decoded code values, the decoding information, and the code words, when the code defined by the code table of FIG. 23 is decoded;

FIG. 31 illustrates another example of the C language program for decoding the code that is defined by the code table of FIG. 23;

FIG. 32 illustrates a second example of the code that is to be decoded in this embodiment of the present invention;

FIG. 34 illustrates an example of correspondences between the configuration information, the decoded code values, the decoding information, and the code words, when the code defined by the code table of FIG. 32 is decoded;

FIG. 35 illustrates an exemplary C language program for decoding the code that is defined by the code table of FIG. 32;

FIG. 36 illustrates a third example of the code that is to be decoded in this embodiment of the present invention;

FIGS. 38A, 38B, and 38C illustrate an example of correspondences between the configuration information, the decoded code values, the decoding information, and the code words, when the code defined by the code table of FIG. 36 is decoded;

FIG. 39 illustrates an exemplary C language program for decoding the code that is defined by the code table of FIG. 36;

FIG. 40 illustrates a fourth example of the code that is to be decoded in this embodiment of the present invention;

FIGS. 41A and 41B illustrate an example of correspondences between the configuration information, the decoded code values, the decoding information, and the code words, when the code defined by the code table of FIG. 40 is decoded;

FIG. 44 illustrates an exemplary C language program for decoding the code that is defined by the code table of FIG. 40.

DETAILED DESCRIPTION OF THE PREFERRED EMBODIMENTS

Next, preferred embodiments of the present invention will be described in detail with reference to the accompanying drawings.

Figure 1:
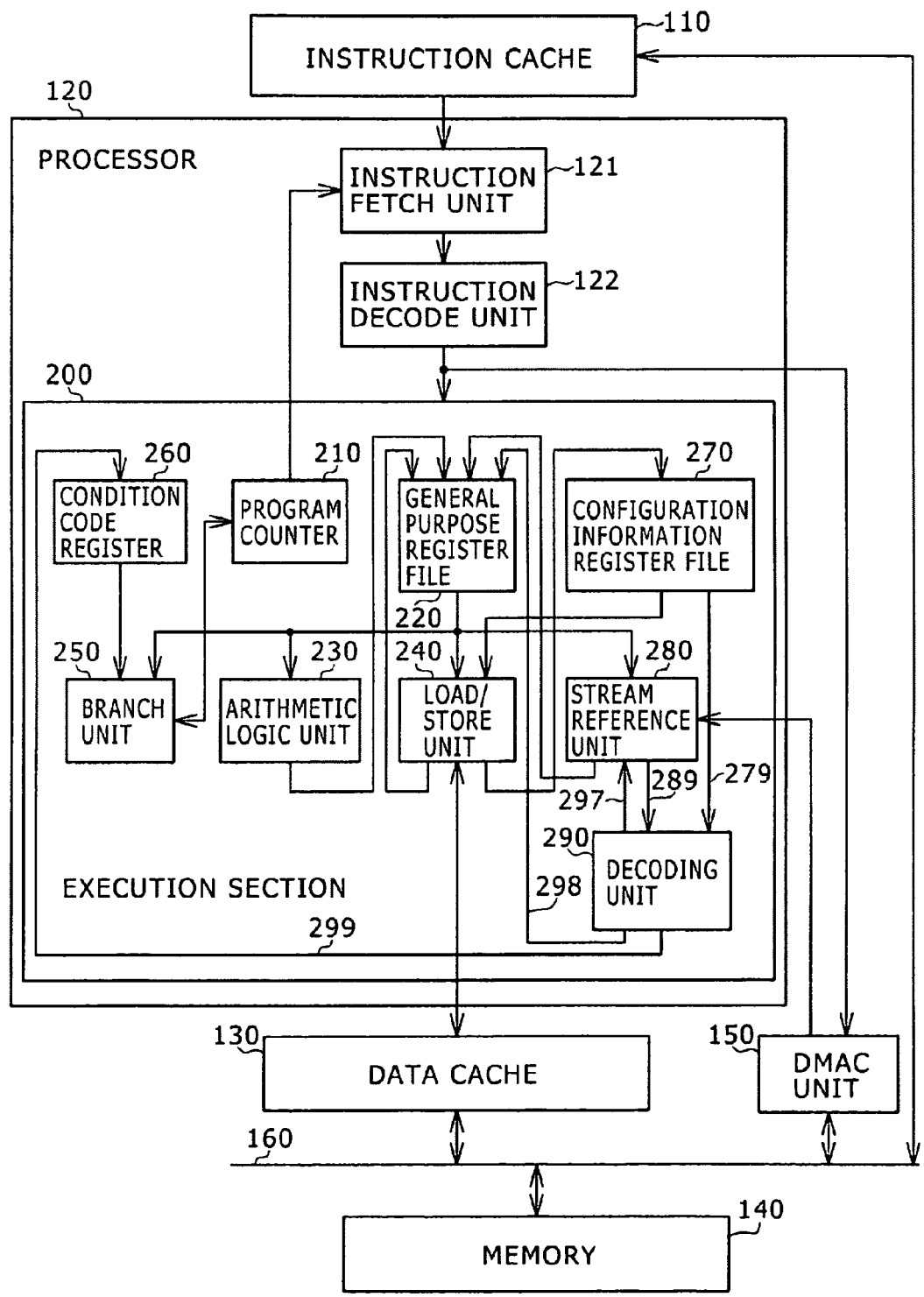
FIG. 1 illustrates an exemplary structure of a decoding apparatus according to an embodiment of the present invention.

FIG. 1 illustrates an exemplary structure of a decoding apparatus according to an embodiment of the present invention. The decoding apparatus includes an instruction cache 110, a processor 120, a data cache 130, a memory 140, a DMAC unit 150, and a bus 160. The instruction cache 110 is a cache memory for holding a series of instructions of a program stored in an instruction storage space on the memory 140. The processor 120 performs a decoding process in accordance with the series of instructions of the program as supplied from the instruction cache 110. The data cache 130 is a cache memory for holding data corresponding to a data storage space on the memory 140. The memory 140 is a memory that has: the instruction storage space for storing the series of instructions of the program as executed by the processor 120; and the data storage space, which is a work data area for the processor 120. The DMAC unit 150 is a direct memory access controller (DMAC) for controlling direct memory access (DMA) transfer between the processor 120 and the memory 140. The DMAC unit 150 performs a process of inputting a stream of coded data. The bus 160 is a bus for connecting the instruction cache 110, the DMAC unit 150, the data cache 130, and the memory 140 to one another.

The processor 120 has, as an instruction set, a collection of instructions designed for a variable-length code decoding process. It is assumed that the instructions handled by the processor 120 have a fixed instruction length of 32 bits. The processor 120 includes an instruction fetch unit 121, an instruction decode unit 122, and an execution section 200. The instruction fetch unit 121 reads the series of instructions of the program from the instruction cache 110. The instruction decode unit 122 interprets the series of instructions of the program as read by the instruction fetch unit 121, and supplies a control signal to the execution section 200 and the DMAC unit 150.

The execution section 200 executes the instructions sequentially, while arbitrating a conflict between resources (e.g., registers, computing units, etc.) required for the execution of the instructions and controlling each relevant unit, in accordance with processing contents of the instructions as interpreted by the instruction decode unit 122. The execution section 200 includes a program counter 210, a general purpose register file 220, an arithmetic logic unit 230, a load/store unit 240, a branch unit 250, a condition code register 260, a configuration information register file 270, a stream reference unit 280, and a decoding unit 290.

The program counter 210 holds an instruction address of the instruction that is being executed in the execution section 200. It is assumed that the program counter 210 has a bit width of 32 bits. A value of the program counter 210 is supplied to the instruction fetch unit 121. The instruction fetch unit 121 reads a subsequent instruction from the instruction cache 110, in accordance with the value of the program counter 210.

The general purpose register file 220 is a collection of general purpose registers used for processing in the processor 120. The general purpose register file 220 includes thirty-two general purpose registers with a bit width of 32 bits. Thus, an address in the general purpose register file 220 can be represented with 5 bits. Therefore, an integer type (int) of C language programs described later represents 4 bytes.

The arithmetic logic unit 230 is a computing unit for performing an arithmetic operation or a logical operation. The arithmetic logic unit 230 performs the arithmetic operation or the logical operation using an operand as read from the general purpose register file 220, and writes its result to the general purpose register file 220.

The load/store unit 240 passes data between the data cache 130 and each register file (i.e., the general purpose register file 220 and the configuration information register file 270). Specifically, the load/store unit 240 loads (reads) data from the memory 140 into each register file via the data cache 130, and reads data from each register file and stores (writes) the read data into the memory 140 via the data cache 130. The load/store unit 240 is capable of 32-bit load/store for the general purpose register file 220 and 128-bit load/store for the configuration information register file 270.

The branch unit 250 processes a branch instruction to control the program counter 210. How a branch direction is determined depends on the instruction. Examples of branch instructions include: a branch instruction where values in the general purpose register file 220 are compared; a branch instruction where a branch is caused depending on whether a value of each bit in the condition code register 260 is "0" or "1"; and a branch instruction where a branch is caused unconditionally. As for a branch target address, an immediate value contained in an instruction code may be added as an offset to the program counter 210, or a value in the general purpose register file 220 may be set in the program counter 210, for example. When any other instruction than the branch instructions has been executed, "4" is added to the program counter 210, and a next instruction is fetched and executed.

The condition code register 260 is a register for holding a condition code that is referred to by the branch instruction. The condition code is supplied from the decoding unit 290, and each bit in the condition code indicates whether or not a branch is to be caused. The condition code register 260 has a bit width of 8 bits. A bit address that points to each bit therein can be represented with 3 bits.

The configuration information register file 270 holds configuration information for the decoding unit 290. The configuration information register file 270 has eight registers with a bit width of 128 bits. An address of each of the registers can be represented with 3 bits. The configuration information register file 270 is an example of a configuration information holding section as recited in the appended claims. The configuration information will be described later.

The stream reference unit 280 sequentially refers to the stream data as supplied from the DMAC unit 150. The stream reference unit 280 has a 32-bit code buffer provided therein, and is capable of referring to the stream data, with a maximum of 32 bits as a unit. This code buffer may have two pairs with 16 bits as a unit, for example, and be controlled not to execute a new instruction until 16 bits are accumulated therein. The data referred to is supplied to the general purpose register file 220 and the decoding unit 290. When a starting address and size for the stream are specified, the DMAC unit 150 sequentially reads data starting with the starting address on the memory 140, and takes and holds the data until the code buffer is filled therewith. Upon a data request from any computing unit, the content of the code buffer is outputted to that computing unit, and the content outputted is deleted from the code buffer. Then, a new stream that still remains is sequentially read from the memory 140 and put into a resulting free space on the code buffer, so that the code buffer is filled. Note here that the computing unit as mentioned here is the decoding unit 290, for example, but may be either a decoding computing unit provided separately or the stream reference unit 280 itself. Once the stream of the specified size is entirely read from the memory 140, no more data will be read from the memory 140. If a free space is present in the code buffer, the space is filled with dummy data (e.g., "0").

The decoding unit 290 decoded the stream data as supplied from the stream reference unit 280. As will be described later, the decoding unit 290 has a plurality of code word detectors, and a function of each of the code word detectors is defined by the configuration information as held in the configuration information register file 270. The decoding unit 290 executes: a vld_decode instruction for determining a decoded code word and the condition code; a vld_show instruction for translating a decoded code number into an address (hereinafter referred to as a "table address") of a corresponding piece of data within a decoding information table, which will be described later; a vld_get instruction for performing a process of advancing the reading of the stream by a decoded code length, in conjunction with the vld_show process; and so on. Details of these instructions will be described later. The condition code generated in the decoding unit 290 is supplied to the condition code register 260. The table address generated in the decoding unit 290 is supplied to the general purpose register file 220. The decoding unit 290 has an internal register base_addr for indicating a base address of the decoding information table, which is used to calculate the table address.

Figure 2:
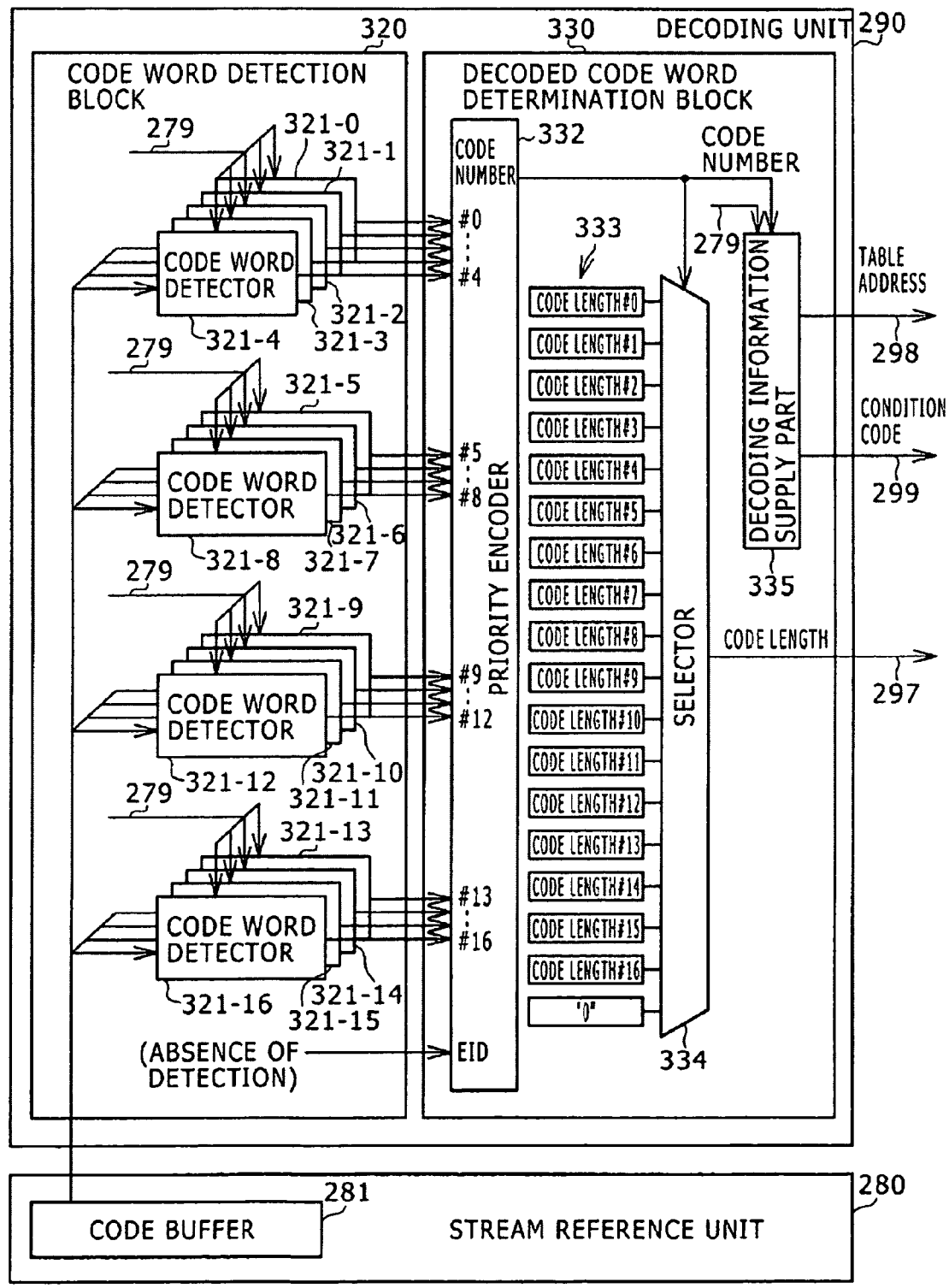
FIG. 2 illustrates an exemplary functional structure of a decoding unit and its surroundings according to this embodiment of the present invention.

FIG. 2 illustrates an exemplary functional structure of the decoding unit 290 and its surroundings according to this embodiment of the present invention. The decoding unit 290 includes a code word detection block 320 and a decoded code word determination block 330.

The code word detection block 320 detects code words in the stream data supplied from a code buffer 281 in the stream reference unit 280. The code word detection block 320 includes N code word detectors 321-0 to 321-(N−1) (hereinafter referred to collectively as a "code word detector 321"), and outputs a code number and a code length of each detected code.

The code word detector 321 detects the code word included in the stream data as inputted from the code buffer 281 in the stream reference unit 280. In this embodiment, it is assumed that there are seventeen code word detectors, i.e., the code word detectors 321-0 to 321-16, as the code word detectors 321. The number of code word detectors 321 is assumed to be seventeen in order to limit the size of the configuration information to 128 bits. Each of the code word detectors 321 corresponds to a code word in a code table, and the code word detectors 321 detect a match with their corresponding code words in parallel. The code word detectors 321 are classified into four groups. As will be described later, some of the bits in the code words to be detected are common among the code word detectors 321 belonging to the same group. Note, however, that the above is just an example, and that other variations are possible as appropriate depending on system-specific conditions.

The decoded code word determination block 330 selects one of the code words as detected in the code word detection block 320. The decoded code word determination block 330 includes a priority encoder 332, a code length supply part 333, a selector 334, and a decoding information supply part 335.

The priority encoder 332 selects one of the detection results of the code word detectors 321 in accordance with the order of priority. The code word detector 321 permits the corresponding code word to be identical to another code word, or permits the corresponding code word to be a prefix of another code word. In other words, some of the code word detectors 321 may detect a match at the same time. Accordingly, a priority level is assigned to each of the code word detectors 321, and when some of the code word detectors 321 have detected a match at the same time, the code word detected by one of the code word detectors 321 with the highest priority level is selected. The priority encoder 322 accomplishes the above-described function, and outputs a code number ID of the code word detector 321 with the highest priority level of those code word detectors 321 that have detected a match. When none of the code word detectors 321 has detected a match, a code number EID, which represents absence of detection, is outputted.

The code length supply part 333 supplies code lengths corresponding to each of the code word detectors 321. When none of the code word detectors 321 has detected a match, the code length is "0."

The selector 334 selects one of the code lengths as supplied from the code length supply part 333, in accordance with the code number as outputted from the priority encoder 332. As a result, the code number ID of the code word and a code length CL(ID) thereof are outputted as a detection result. The code length is outputted to the stream reference unit 280 via a signal line 297.

As noted earlier, it is assumed that the code word detector 321 permits the corresponding code word to be identical to another code word, or permits the corresponding code word to be the prefix of another code word. In this connection, when the corresponding code words of some of the code word detectors 321 are identical, or when the corresponding code word of any of the code word detectors 321 is the prefix of the corresponding code word of another of the code word detectors 321, the code word detector 321 with the highest priority level of all of them is always selected, while none of the code word detectors 321 with lower priority levels is selected at all. In the case where the number of code words is smaller than the number of code word detectors 321, the superfluous code word detector(s) 321 are assigned the lowest priority level(s) so that they may never be selected. This eliminates the need to use extra control signals, when the number of code words is smaller than the number of code word detectors 321. In other words, code tables with different numbers of code words can be supported flexibly, without the need to prepare additional configuration information for specifying the unused code word detector(s) 321.

The decoding information supply part 335 supplies information required to acquire information necessary for decoding. The decoding information supply part 335 includes the internal register base_addr for indicating the base address of the decoding information table, and based on this, translates the code number obtained by the priority encoder 332 into the table address (i.e., the address of the corresponding piece of data in the decoding information table). The table address is outputted to the general purpose register file 220 via a signal line 298.

In addition, the decoding information supply parts 335 generates a condition code corresponding to the code number as obtained by the priority encoder 332, based on a condition code bitmap acquired from the configuration information register file 270. The condition code is outputted to the condition code register 260 via a signal line 299.

Figure 3:
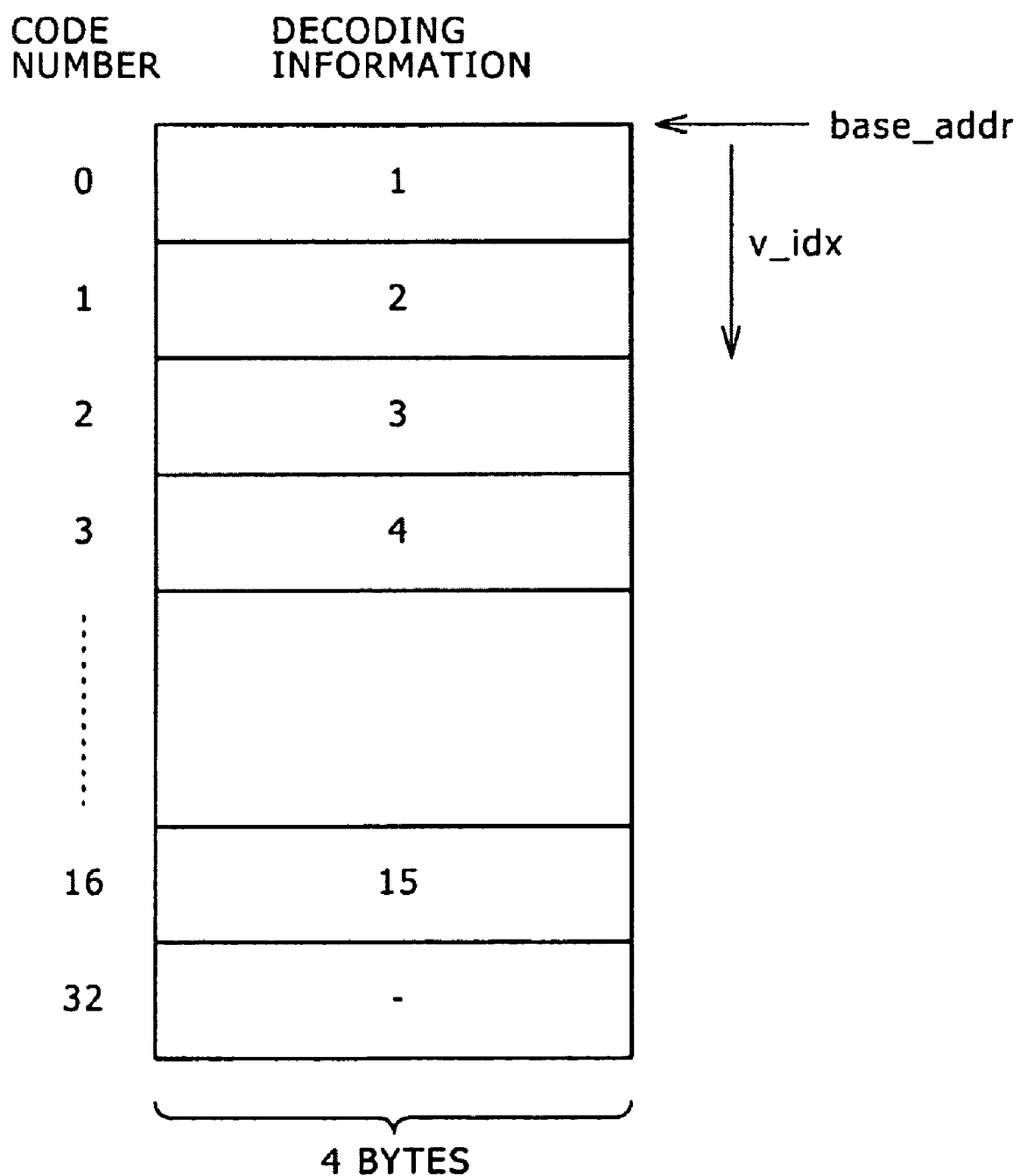
FIG. 3 illustrates an exemplary structure of a decoding information table according to this embodiment of the present invention.

FIG. 3 illustrates an exemplary structure of the decoding information table according to this embodiment of the present invention. The decoding information table holds the decoding information so as to be associated with the code numbers. While the code numbers correspond to the configuration information, the decoding information are numbers corresponding to the code words uniquely.

The decoding information table is stored in the memory 140, and a starting address (i.e., the base address) thereof in the memory 140 is held in the internal register base_addr of the decoding information supply part 335 in the decoded code word determination block 330 of the decoding unit 290.

On the assumption that each piece of decoding information stored in the decoding information table is 4 bytes long, a desired piece of decoding information can be referred to by, when accessing the decoding information table, adding four times an index value v_idx to the value of the internal register base_addr.

Figure 4:
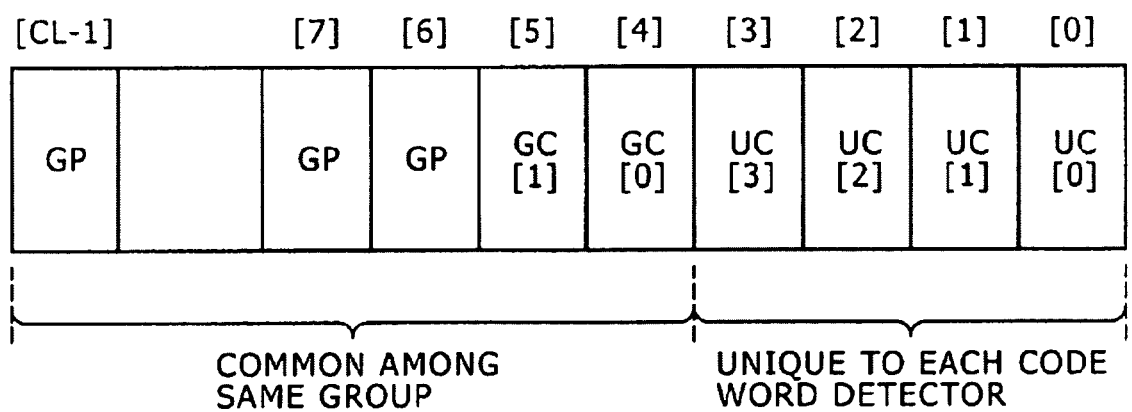
FIG. 4 illustrates an exemplary form of a code value CW according to this embodiment of the present invention.

FIG. 4 illustrates an exemplary form of a code value CW according to this embodiment of the present invention. First, binary symbols are defined as follows:

$UC_i(ID)$, $GC_i(ID)$, $GP(ID)$, $S_i \in \{0, 1\}$, i=0, 1, . . . , ∞

In this embodiment of the present invention, it is assumed that the code value CW(ID) of the code number ID is limited to those that can be represented by a sequence of binary symbols as follows:

$$CW(ID) = \{GP(ID)\}^\infty \{GC(ID)\}\{UC(ID)\}$$
$$= \{ \ldots CW_{FP+FU}(ID)\}$$
$$\{CW_{FP+FU-1}(ID) \ldots CW_{FU}(ID)\}$$
$$\{CW_{FU-1}(ID) \ldots CW_0(ID)\}$$

where
$GC(ID) = GC_{FP-1}(ID) \ldots GC_0(ID)$
$UC(ID) = UC_{FU-1}(ID) \ldots UC_0(ID)$ It is assumed that $\{X\}^Y$ represents a symbol string composed of Y consecutive X's. Any symbol string of an infinite length can thus be defined without giving all symbols.

By giving the code length CL(ID) to the code value CW(ID), it is possible to define a code word CODE(ID) of the code number ID as follows:

$CODE(ID) = CW_{CL(ID)-1}(ID) \ldots CW_0(ID)$

In the example of FIG. 4, it is assumed that 4 bits of UC and 2 bits of GC are provided, while a series of GP is provided on the higher-order side (on the MSB side). This assumption is based on the fact that bit strings on the MSB side tend to have a long part that is common among different code words, and that the code tables tend to have many code words that have a series of 0s or 1s on the MSB side. A conceivable reason for this is that designing of variable-length codes with imbalance in code length can be accomplished simply by forming a code tree in such a manner that the heights of leaves are much greater on the right or left side than on the other side. Here, an estimated probability P(C) of the occurrence of a code word C with a code length L is assumed to be $2^{-L}$: $P(C) = 2^{-L}$. If an actual probability of the occurrence of the code word C is P(C), compression is possible approximately up to entropy. That is, the compression performance of the code depends only on the code length. The height of a leaf is equivalent to the code length of the corresponding code word, and only the height of leaves matters. With the heights of the leaves being equal, the compression performance is not affected even if the distribution of the leaves is uneven or if the leaves concentrate on the left or right side. Therefore, the designing of the code tables is easier with trees whose leaves concentrate on the left or right side.

Since such code tables are expected to be designed frequently, it is possible to reduce the configuration information in size by grouping and defining common pieces of data in the same group in an integrated manner. Moreover, integrating the common pieces of data into one for each group does not make the definition of the code tables considerably more difficult. This is apparent from the fact that, when the code table is represented as a code tree, there are paths, leading from a root towards leaves, that are shared by different leaves, and that such paths are shared by more leaves in lower branches than in higher branches.

As such, in the present example, five code word detectors, the code word detectors 321-0 to 321-4, are classified into a first group; four code word detectors, the code word detectors 321-5 to 321-8, are classified into a second group; four code word detectors, the code word detectors 321-9 to 321-12, are classified into a third group; and four code word detectors, the code word detectors 321-13 to 321-16, are classified into a fourth group. With respect to GP and GC, a common code is assigned among the same group. In contrast, with respect to UC, a unique code is assigned to each of the code word detectors 321.

Here, a comparison-use code word symbol string CMP-CODE(ID) for the code number ID is defined as follows:

$$CMPCODE(ID) = CODE(ID)\{0\}^{\infty}$$
$$= \{CW_{CL(ID)-1}(ID) \ldots CW_0(ID)\}\{0\}^{\infty}$$

In addition, a comparison-use mask symbol string CMPMASK(ID) is defined as follows:

$CMPMASK(ID) = \{1\}^{CL(ID)}\{0\}^{\infty}$

A symbol string STREAM(t), which is a portion, starting with a tth symbol, of a symbol string S $S_1 \ldots S_t S_{t+1} \ldots$, which is composed of code words as joined together in an order in which the code words have been coded, is represented as follows:

$STREAM(t) = S_t S_{t+1} \ldots$

Then, CMPSTREAM(ID), which is a result of performing a logical conjunction (^) operation for each symbol, can be represented as follows:

$$CMPSTREAM(ID) = CMPMASK(ID) \wedge STREAM(t)$$
$$= \{S_t S_{t+1} \ldots S_{t+CL(ID)-1}\}\{0\}^{\infty}$$

Thus, a determination CODEDETECT(ID) of whether or not the code word CODE(ID) of the code number ID has been detected is represented as follows:

CODEDETECT ID=CMPSTREAM(ID)==CMPCODE (ID))?Yes:No

That is, if CMPSTREAM(ID) and CMPCODE(ID) coincide with each other, "Yes" is outputted, whereas if CMPSTREAM(ID) and CMPCODE(ID) do not coincide with each other, "No" is outputted. The code word detector 321 performs the detection via the determination CODEDETECT(ID), while the detection code word CODE(ID) is defined based on the configuration information.

FIG. 5 illustrates an example of the configuration information according to this embodiment of the present invention. The configuration information is held in the configuration information register file 270, and defines the configuration VLDCTX of the code word detectors 321 in the decoding unit 290 and a condition code bitmap CCMAP for the decoded code word determination block 330.

Here, code numbers ID "0" to "16" are assigned to the seventeen code word detectors 321. In the case of EID, "32" is used. It is assumed that the IDs are classified into four groups: "0" to "4," "5" to "8," "9" to "12," and "13" to "16." As to the number of bits for each piece of configuration information, each UC(ID) is 4 bits long, each GC(ID) is 2 bits long, each CL(ID) is 4 bits long, each of D(2), D(3), D(5), and D(7) is 2 bits long, and D(ID) of any other ID is 1 bit long. Each of CCMAP(ID) is 1 bit long.

The code length CL(ID) represents lengths of 1 to 16 bits with 4 bits, with a value reduced by "1" as configuration information. A difference D(ID) is a difference from the code length of the code word detector 321 whose code number is one less than ID.

UC(ID) is made 4 bits long in order to distinguish up to sixteen (one less than seventeen) code words of an equal code length, and to support well even code trees in which the heights of the leaves are relatively even. Note that the number of code word detectors 321 is seventeen, i.e., one more than sixteen, because in the case of a fixed-length code, where all have the same length, one-to-one translation using a table suffices. The reason why eighteen or more code word detectors 321 are not provided is that the configuration information would require more than 128 bits when the number of code word detectors 321 is larger than seventeen. In this example, higher priority levels are assigned to the code word detectors with lower code numbers IDs.

The condition code bitmap CCMAP is composed of 17 bits, which corresponds to the seventeen code word detectors 321, and 1 bit, which corresponds to the code number EID, which is used when no code word has been detected. In this condition code bitmap CCMAP, CCMAP(DID) is supplied to the condition code register 260 in accordance with a decoded code number DID.

Figure 6:
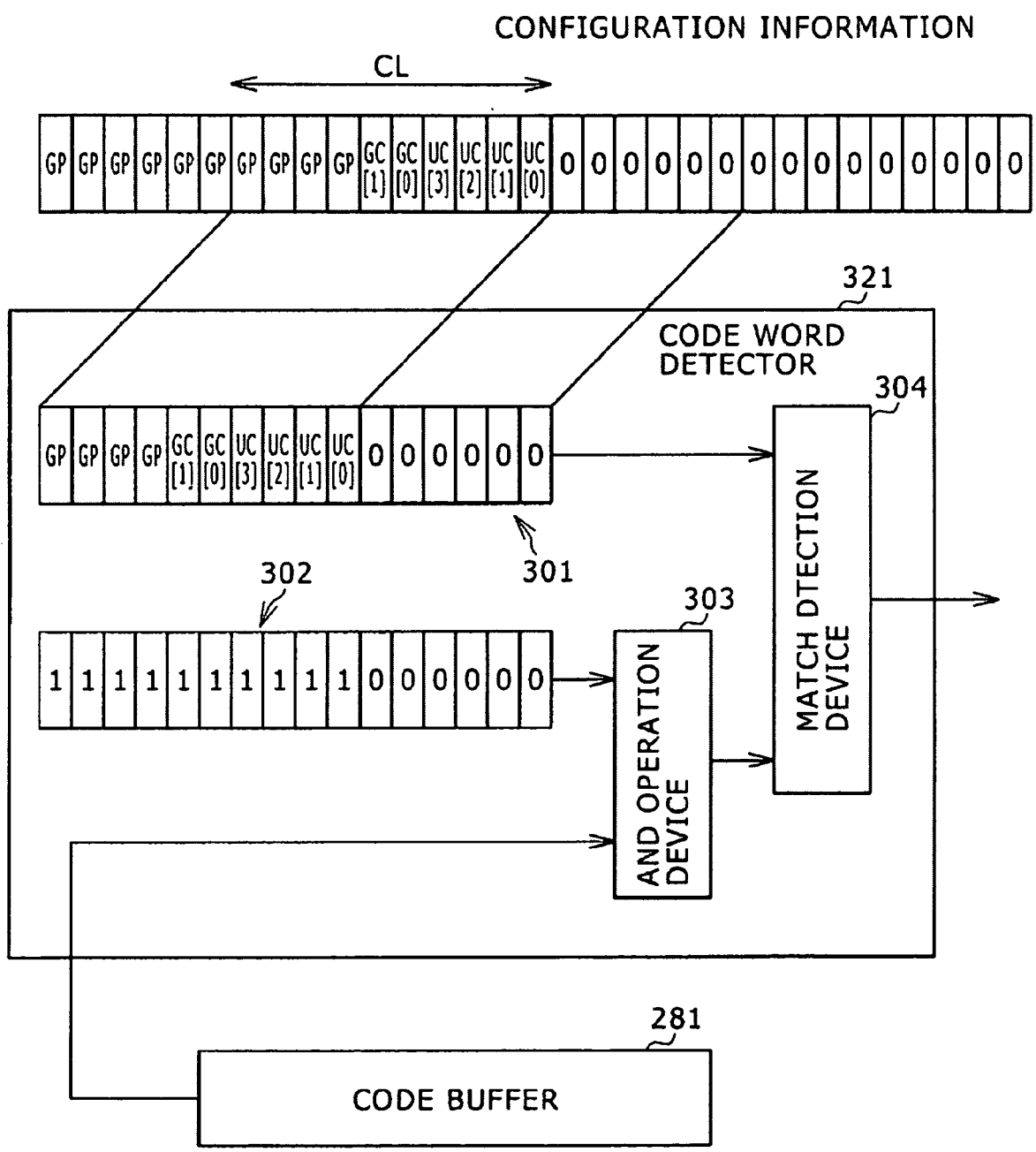
FIG. 6 illustrates an exemplary structure of a code word detector according to this embodiment of the present invention.

FIG. 6 illustrates an exemplary structure of the code word detector 321 according to this embodiment of the present invention. Each of the code word detectors 321 includes a code word register 301, a mask register 302, an AND operation device 303, and a match detection device 304.

The code word register 301 is a register in which a code word that is to be detected by this code word detector 321 is set. The code word register 301 is 16 bits long, and the code word with the code length CL is set on the MSB side, while 0s are set in the remaining bits.

The mask register 302 is a register in which a mask pattern of the stream data is set. The mask register 302 is 16 bits long, and 1s with the code length CL is set on the MSB side, while 0s are set in the remaining bits.

The AND operation device 303 ANDs the stream data as supplied from the code buffer 281 and the mask pattern as set in the mask register 302. As a result, a top portion of the stream data of a length corresponding to the code length CL is outputted from the MSB side, and 0s are outputted thereafter.

The match detection device 304 detects a match between the code word as set in the code word register 301 and the output from the AND operation device 303. That is, if the stream data from the code buffer 281 coincides with the code word as set in the code word register 301, a notification of this matching is outputted from the match detection device 304.

Figure 7:
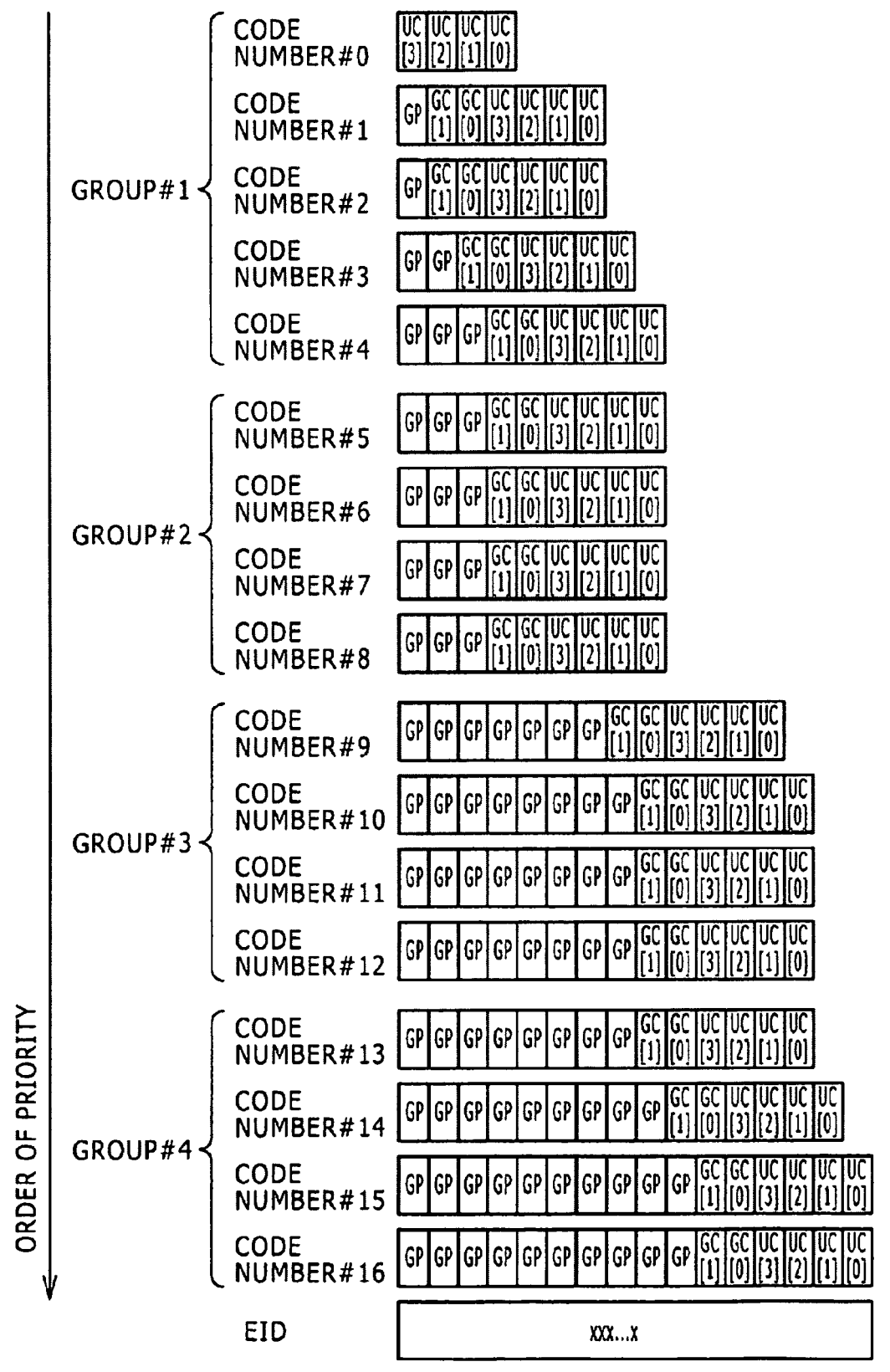

FIG. 7 illustrates an example of the configuration information for the code word register 301 in each of the code word detectors 321 according to this embodiment of the present invention. A value is set in the code word register 301 in each of the seventeen code word detectors 321-0 to 321-16 in accordance with the configuration information as held in the configuration information register file 270.

In the 4 bits of UC, a value unique to each of the code word detectors 321 is set. Specifically, 0th to 3rd bits of the configuration information are set in the UC portion of the code word register 301 in the code word detector 321-0; 4th to 7th bits of the configuration information are set in the UC portion of the code word register 301 in the code word detector 321-1; 8th to 11th bits of the configuration information are set in the UC portion of the code word register 301 in the code word detector 321-2; 12th to 15th bits of the configuration information are set in the UC portion of the code word register 301 in the code word detector 321-3; 16th to 19th bits of the configuration information are set in the UC portion of the code word register 301 in the code word detector 321-4; 20th to 23rd bits of the configuration information are set in the UC portion of the code word register 301 in the code word detector 321-5; 24th to 27th bits of the configuration information are set in the UC portion of the code word register 301 in the code word detector 321-6; 28th to 31st bits of the configuration information are set in the UC portion of the code word register 301 in the code word detector 321-7; 32nd to 35th bits of the configuration information are set in the UC portion of the code word register 301 in the code word detector 321-8; 36th to 39th bits of the configuration information are set in the UC portion of the code word register 301 in the code word detector 321-9; 40th to 43rd bits of the configuration information are set in the UC portion of the code word register 301 in the code word detector 321-10; 44th to 47th bits of the configuration information are set in the UC portion of the code word register 301 in the code word detector 321-11; 48th to 51st bits of the configuration information are set in the UC portion of the code word register 301 in the code word detector 321-12; 52nd to 55th bits of the configuration information are set in the UC portion of the code word register 301 in the code word detector 321-13; 56th to 59th bits of the configuration information are set in the UC portion of the code word register 301 in the code word detector 321-14; 60th to 63rd bits of the configuration information are set in the UC portion of the code word register 301 in the code word detector 321-15; and 64th to 67th bits of the configuration information are set in the UC portion of the code word register 301 in the code word detector 321-16.

In 2 bits of GC and 1 bit of GP, a value shared by the code word detectors 321 belonging to the same group is set. Specifically, 68th to 70th bits of the configuration information are set in the GC and GP portion of the code word register 301 in each of the code word detectors 321-0 to 321-4; 71st to 73rd bits of the configuration information are set in the GC and GP portion of the code word register 301 in each of the code word detectors 321-5 to 321-8; 74th to 76th bits of the configuration information are set in the GC and GP portion of the code word register 301 in each of the code word detectors 321-9 to 321-12; and 77th to 79th bits of the configuration information are set in the GC and GP portion of the code word register 301 in each of the code word detectors 321-13 to 321-16. Note that the length of the code word set therein depends on the code length. In other words, in the case where the code length is 8 or more bits, more than one GP is set on the MSB side repetitively. On the other hand, in the case where the code length is 6 or fewer bits, the code word is set on the LSB side while an extra portion of the code word on the MSB side is not set.

As noted previously, the priority levels are assigned to the code word detectors 321-0 to 321-16 such that code word detectors with smaller code numbers are assigned higher priority levels, and when a match has been detected by a certain one of the code word detectors 321, the results in other ones of the code word detectors 321 with larger code numbers are ignored. In the case where none of the code word detectors 321 has detected a match, EID, which represents the absence of a match, is outputted.

Figure 8:
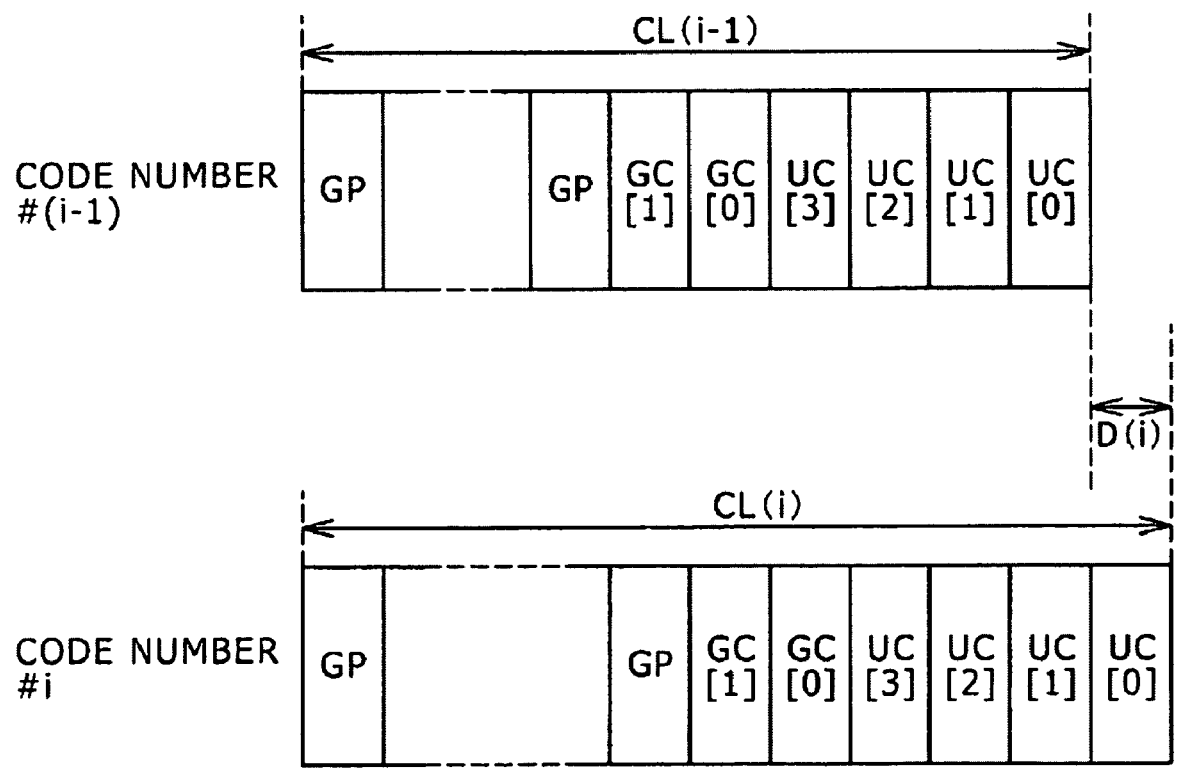
FIG. 8 illustrates a relationship between different codes according to this embodiment of the present invention.

FIG. 8 illustrates a relationship between different codes according to this embodiment of the present invention. Here, a consideration is given to how to define a code length CL(I) of a code word detector 321 with code number I by using a difference D(I) from a code length CL(I−1) of a code word detector 321 with code number I−1, which is one less than the code number I. When the code lengths are arranged in an ascending order, differences between neighboring code lengths are mostly small. Therefore, it is possible to define the code lengths, starting with the smallest code length and then progressing to increasingly larger code lengths, by defining the code length CL(I) using the difference D(I). The difference D(I) can be represented with fewer bits than the number of bits of the code length CL(I). It is possible to implement the configuration information representing the code length CL(I) of each of all the code word detectors 321 with fewer bits, by combining direct definition of the code length CL(I) and relative definition of the code length CL(I).

In the example of FIG. 5, the code length of each of the code word detectors 321-0, 321-1, and 321-9 is represented with 4 bits, while the code length of each of the remaining code word detectors 321 is defined using the difference D, whereby the representation of all the code lengths is implemented with fewer bits. A difference in code length between the code numbers 0 and 1 is often large, and the code number 9 is approximately at the middle of the seventeen code numbers. Accordingly, the code length itself is held for the code word detectors 321-1 and 321-9. The difference D is represented with 2 bits for the code word detectors 321-2, 321-3, 321-5, and 321-7, while the difference D is represented with 1 bit for each of the remaining code word detectors 321. This takes advantage of a characteristic feature of the variable-length code, that variations in code length are greater for smaller code numbers and slighter for larger code numbers.

As described above, the combined use of the N code word detectors 321 and the decoded code word determination block 330 achieves the determination of a code word (i.e., the decoded code number DID, a decoded code value DCW, and a decoded code length DCL) at the top of the stream data STREAM(t). Then, the decoding information corresponding to that code word is generated to complete the decoding of that code word. Thereafter, a read position t in the stream data is moved forward by the number of bits corresponding to the decoded code length DCL, and t is updated to t+DCL, so that a next code word is placed at the top of STREAM(t). This operation is repeated in a similar manner with each subsequent code word to accomplish the decoding of the entire stream data. The above processes are referred to as a decoding process RVLD (Reconfigurable Variable Length Decoding).

In the case where the decoded code number DID is EID, the code length DCL is 0, and therefore the read position is not moved forward in the stream data in the decoding process RVLD. Accordingly, in the case of EID, new configuration information that defines remaining code words in the code table is prepared, and this new configuration information is applied to perform the decoding process RVLD in a similar manner, or alternatively, another method of the decoding process is employed to determine the code word and move the read position in the stream data forward by the number of bits corresponding to the code length of that code word. The processor 120 according to this embodiment of the present invention has, as the instruction set, a collection of instructions designed to perform the decoding process RVLD and other "instructions effective for the decoding of the variable-length code." The configuration information register file 270 in the processor 120 stores one or more pieces of configuration information.

Here, the case will be considered where a prefix of a plurality of code words is assigned as the code word to the code word detector 321 and it represents the plurality of code words. In this case, suffixes of the code words, i.e., the remaining parts of the code words excluding the prefix, are often approximately of the same length, or differ in length only by one or so bits, and often can thus be handled as fixed-length codes of two or so types of lengths. In such a case, a binary symbol string of a length corresponding to the number of bits of the longest code word is read from the code buffer 281, and an actual length is calculated based on the read binary symbol string, and then the read position is moved forward only by that length in the code buffer 281, for example. In this manner, the decoding process can often be accomplished with use of a table that contains limited redundancy and with simple processing. Accordingly, it is assumed that an instruction to perform process SHOWBITS for fetching a specified number of bits from the code buffer 281 and an instruction to perform process GETBITS for moving the read position in the code buffer 281 forward by that number of bits in conjunction with the process SHOWBITS are prepared as two of the "instructions effective for the decoding of the variable-length code."

Further, it is assumed that the processor 120 has, as one of the "instructions effective for the decoding of the variable-length code," a branch instruction to refer to the condition code register 260 and, if a specified condition is satisfied, cause a branch to a specified memory address. As noted previously, the condition code bitmap CCMAP is a register that stores N+1 pieces of condition code information, which are composed of N pieces of condition code information corresponding to the N code numbers and one piece of condition code information corresponding to the exception code number EID, which is used when no detection has occurred. Each piece of condition code information is used to set a value in the condition code register 260. It is assumed that each piece of condition code information is represented as CCMAP(ID). Upon execution of the instruction to perform the decoding process RVLD, a value is set in the condition code register 260 based on condition code information CCMAP(DID) for DID. The condition code bitmap CCMAP can be implemented simply, for example, by storing N+1 bits of information, each bit for a separate ID, that represent whether a branch is to be caused, and causing CCMAP(ID) to be written into the condition code register 260. The provision of the instruction (a vld_decode instruction, which will be described later) to set a condition code for branching in conjunction with the decoding process RVLD makes it possible to reduce the number of instructions related to a comparing process performed when the processor 120 performs a process of comparing code numbers. The condition code register 260 may be more than 1 bit long. In this case, the instruction to set the condition code specifies a bit where a setting is to be made, and in the branch instruction for reference, a bit that is to be referred to for branching is specified. Further, the condition code register 260 may allow simultaneous setting of a plurality of bits. One conceivable application in this case is to set information that represents EID in a separate bit in the condition code register 260 in the event of EID, independently of the condition code information as set by CCMAP.

Next, there are broadly two types of methods for addressing the case where the code table has more than N code words and a single piece of configuration information does not suffice. A first method is to perform the decoding process RVLD once and thereafter decode the remaining part using another technique. A second method is to perform the decoding process RVLD multiple times using different pieces of configuration information, thereby accomplishing the decoding.

The first method will be described first. Suppose that the symbol strings defined by the configuration information set in the decoding process RVLD are composed of a mixture of CODELEAF, which represents actual code words themselves, and CODENODE, which represents symbol strings that form a prefix of a plurality of code words. In the case of CODELEAF, the decoding information table prepared separately is referred to in accordance with the decoded code number DID to output the decoding information. In the case of CODENODE, since only a part of the code word is determined, it is necessary to refer to a subsequent symbol string to determine the whole code word. In this case, a subsequent symbol string of a reasonable length is acquired with SHOWBITS, and based on this symbol string, the length (i.e., a code length residual) of the suffix of the code word, i.e., the remaining part of the code word, is determined by referring to a code length residual table, which is prepared separately. Then, the read position is moved forward by that length with GETBITS, and the decoding information table prepared separately is referred to in accordance with the symbol string acquired with SHOWBITS to output the decoding information. In connection with CODENODE, configuration information symbol strings can sometimes be defined such that all code length residuals have the same value. In that case, the code length residual is determined instantly with CODENODE, and accordingly the read position is moved forward simply by that code length residual with GETBITS.

As described above, the first method requires the branch instruction because different processes are to be performed after the decoding process RVLD depending on whether the symbol string is CODELEAF or CODENODE. A simple determination of whether the symbol string is CODELEAF or CODENODE requires a process of, based on DID, referring to a table containing information indicating which process is to be performed, and comparing a value obtained by this reference. As such, in this embodiment of the present invention, information indicating whether or not a branch is to be caused is set in CCMAP in order to allow calculation of a branch condition during the decoding process RVLD. This eliminates the need for a comparing process and a comparison-use table.

Next, the second method will now be described below. A cascade function is used to perform the decoding process RVLD using a plurality of pieces of configuration information. The cascade function refers to a function of performing the decoding process RVLD multiple times in succession using different pieces of configuration information. When any other code word than EID is decoded in a previous instance of the decoding process RVLD, subsequent instances of the decoding process RVLD performed with the cascade function valid are ignored. In other words, in the case where detection results have been obtained successively by the code word detectors 321 using different pieces of configuration information, only when no match has been detected in the previous detection results, the decoded code word is determined based on a subsequent detection result. A branch process can be accomplished in this manner without the use of the branch instruction. Also, even in the case where the branch instruction is used, the decoding process RVLD can be performed before the branch instruction.

Addition of different offset values to the code number in different instances of the decoding process RVLD makes it possible to distinguish the code numbers obtained as a result of the different instances of the decoding process RVLD. As such, the decoding process RVLD is broken into three processes: VLD_DECODE for determining the decoded code number DID and generating the condition code information; VLD_SHOW for adding an offset value to the decoded code number DID; and VLD_GET for moving the read position in the stream data forward by the number of bits corresponding to the code length DCL in conjunction with VLD_SHOW. Here, VLD_SHOW and VLD_GET may be configured to set a particular value when the decoded code number DID is EID. The above enables the process to be performed using the plurality of pieces of configuration information as if there were more than N code word detectors 321.

Although the offset code numbers may be used as mere numbers for distinguishing the codes, greater efficiency can be achieved by arranging for the offset code number to be used when searching a table that contains pieces of decoding information to refer to the decoding information corresponding to the corresponding code word. Suppose that each piece of decoding information can be represented with 4 bytes or less, and that the decoding information table uses 4 bytes for each piece of decoding information. If an address of a first element of the table is a base address, an address of a table element corresponding to a given code number can be obtained by adding four times the code number to the base address. A shift instruction to multiply the code number by four and an add instruction to add the result to the base address are necessary. These instructions can be implemented by VLD_SHOW and VLD_GET, whereby the total number of instructions can be reduced by two.

Specifications such as MPEG have a code table in which the last bit of the code word represents a sign (positive or negative) of the decoding information. For this type of code tables, the configuration information may be set considering a code table in which the last bit of each code word is omitted, and in VLD_SHOW and VLD_GET, the last bit may be referred to modify the code number based on the value of the last bit for differentiation (VLD_SHOW_S and VLD_GET_S, which will be described later). For example, the differentiation between the positive and negative of even and odd numbers can be achieved by multiplying the code number by two and adding the value referred to the result as its last bit. It is possible to eliminate the need to move the read position forward by one bit in GETBITS, by additionally moving the read position forward by an extra bit with VLD_GET.

Moreover, that type of VLD_SHOW and VLD_GET are conceivable which add four times the code number to the last two bits, instead of the last one bit, referred to (VLD_SHOW_SS and VLD_GET_SS, which will be described later). This type of VLD_SHOW and VLD_GET are suitable for use in the case where the code tree has, at its ends, a number of complete trees of a height of two. In this case, VLD_GET additionally moves the read position forward by extra two bits.

FIG. 9 illustrates the instructions related to the decoding of the variable-length code in the instruction set possessed by the processor 120 according to this embodiment of the present invention. While descriptions of common instructions will be omitted, it is assumed that there is prepared a separate instruction set that is sufficient for efficient support of a high-level language such as the C language. An example of this instruction set is an instruction set of an RISC processor such as the R3000 or ARM7.

A "vld_decode" instruction is an instruction to determine the decoded code number and generate the condition code information without the use of the cascade function. Operands of the "vld_decode" instruction are cc and vrs, both of which are 3 bits long. Here, cc is a parameter that is used to indicate the address of the condition code register 260, and vrs is a parameter that is used to indicate the address of the configuration information register file 270. An operation of the "vld_decode" instruction is to perform the process "VLD_DECODE" while making a setting ("No") not to use the cascade function, and thereafter add "4" to the program counter 210.

A "vld_decode_cascade" instruction is an instruction to determine the decoded code number and generate the condition code information with the use of the cascade function. As with the "vld_decode" instruction, operands of the "vld_decode_cascade" instruction are cc and vrs, both of which are 3 bits long. An operation of the "vld_decode_cascade" instruction is to perform the process "VLD_DECODE" while making a setting ("Yes") to use the cascade function, and thereafter add "4" to the program counter 210.

A "vld_baseaddr" instruction is an instruction to set the base address of the decoding information table. An operand of the "vld_baseaddr" instruction is rs, which is 5 bits long. Here, rs is a parameter that is used to indicate the address of the general purpose register file 220. An operation of the "vld_baseaddr" instruction is to assign, to table_base, a content of a register indicated by rs in the general purpose register file 220, and thereafter add "4" to the program counter 210.

A "vld_show" instruction is an instruction to add the offset value to the decoded code number. Operands of the "vld_show" instruction are rd, offset, and except, which are 5, 8, and 8 bits long, respectively. Here, rd is a parameter that is used to indicate the address of the general purpose register file 220, offset is a parameter that is used to indicate the offset value in the decoding information table, and except is a parameter that is used to indicate a relative position within the decoding information table in the case where no code word match has been detected. An operation of the "vld_show" instruction is to perform the process "VLD_SHOW" and thereafter add "4" to the program counter 210.

A "vld_show_s" instruction is an instruction to add the offset value to the decoded code number while considering the last bit of the code word. As with the "vld_show" instruction, operands of the "vld_show_s" instruction are rd, offset, and except, which are 5, 8, and 8 bits long, respectively. An operation of the "vld_show_s" instruction is to perform the process "VLD_SHOW_S" and thereafter add "4" to the program counter 210.

A "vld_show_ss" instruction is an instruction to add the offset value to the decoded code number while considering the last two bits of the code word. As with the "vld_show" instruction, operands of the "vld_show_ss" instruction are rd, offset, and except, which are 5, 8, and 8 bits long, respectively. An operation of the "vld_show_ss" instruction is to perform the process "VLD_SHOW_SS" and thereafter add "4" to the program counter 210.

A "vld_get" instruction is an instruction to move the read position in the stream data forward by the number of bits corresponding to the code length in conjunction with the operation of the "vld_show" instruction. As with the "vld_show" instruction, operands of the "vld_get" instruction are rd, offset, and except, which are 5, 8, and 8 bits long, respectively. An operation of the "vld_get" instruction is to perform the process "VLD_GET" and thereafter add "4" to the program counter 210.

A "vld_get_s" instruction is an instruction to move the read position in the stream data forward by the number of bits corresponding to the code length in conjunction with the operation of the "vld_show_s" instruction. As with the "vld_show" instruction, operands of the "vld_get_s" instruction are rd, offset, and except, which are 5, 8, and 8 bits long, respectively. An operation of the "vld_get_s" instruction is to perform the process "VLD_GET_S" and thereafter add "4" to the program counter 210.

A "vld_get_ss" instruction is an instruction to move the read position in the stream data forward by the number of bits corresponding to the code length in conjunction with the operation of the "vld_show_ss" instruction. As with the "vld_show" instruction, operands of the "vld_get_ss" instruction are rd, offset, and except, which are 5, 8, and 8 bits long, respectively. An operation of the "vld_get_ss" instruction is to perform the process "VLD_GET_SS" and thereafter add "4" to the program counter 210.

A "showbits" instruction is an instruction to fetch the specified number of bits from the code buffer 281. Operands of the "showbits" instruction are rd and rs, both of which are 5 bits long. Here, rd and rs are parameters that are used to indicate the address of the general purpose register file 220. An operation of the "showbits" instruction is to perform the process "SHOWBITS" and thereafter add "4" to the program counter 210.

A "getbits" instruction is an instruction to move the read position in the code buffer 281 forward by an appropriate number of bits in conjunction with the process "SHOW-BITS." As with the "showbits" instruction, operands of the "getbits" instruction are rd and rs, both of which are 5 bits long. An operation of the "getbits" instruction is to perform the process "GETBITS" and thereafter add "4" to the program counter 210.

A "get_stream" instruction is an instruction to transfer the stream data to the code buffer 281. Operands of the "get_stream" instruction are rs and rt, both of which are 5 bits long. Here, rs and rt are parameters that are used to indicate the address of the general purpose register file 220. An operation of the "get_stream" instruction is to clear the code buffer 281, and configure the DMAC with the starting address of the stream data as a general purpose register R[rs] and the size thereof as a general purpose register R[rt], thereby starting to fill the code buffer 281 with the stream data, and thereafter add "4" to the program counter 210.

A "load_v" instruction is an instruction to load data from the memory 140 to the configuration information register file 270. Operands of the "load_v" instruction are vrd, rs, and offset, which are 5, 5, and 16 bits long, respectively. Here, vrd is a parameter that is used to indicate the address of the configuration information register file 270, rs is a parameter that is used to indicate the address of the general purpose register file 220, and offset is a parameter that is used to indicate the offset value for the address of the memory 140. An operation of the "load_v" instruction is to read 16 bytes of data from address offset+R[rs] on the memory 140 and store the data at VR[vrd] in the configuration information register file 270, and thereafter add "4" to the program counter 210.

A "store_v" instruction is an instruction to write data from the configuration information register file 270 into the memory 140. As with the "load_v" instruction, operands of the "store_v" instruction are vrd, rs, and offset, which are 5, 5, and 16 bits long, respectively. An operation of the "store_v" instruction is to refer to a content of VR[vrs] in the configuration information register file 270 and write the content into a 16-byte area, starting with address offset+R[base], on the memory 140, and thereafter add "4" to the program counter 210.

A "vld_br" instruction is an instruction to perform the branch process depending on the value of the condition code register 260. Operands of the "vld_br" instruction are tf, which is 1 bit long, cc, which is 3 bits long, and offset, which is 16 bits long with a sign bit. Here, tf is a parameter that indicates whether a branch is to be caused when the value of the condition code register 260 is "0" or whether a branch is to be caused when the value of the condition code register 260 is "1"; cc is a parameter that is used to indicate the address of the condition code register 260; and offset is a parameter that is used to indicate an offset for a branch target. An operation of the "vld_br" instruction is to add four times offset to the program counter 210 and cause a branch if CCR[cc] of the condition code register 260 coincides with tf, or to add "4" to the program counter 210 if CCR[cc] of the condition code register 260 does not coincide with tf.

Hereinafter, exemplary procedures of various processes will be described, and they can be implemented in electronic circuitry. Sequential processing and loop processing as described below may be implemented in electronic circuitry such that those parts of the processing that can operate in parallel are caused to operate in parallel.

FIG. 10 illustrates an exemplary procedure of process "INIT" according to this embodiment of the present invention. The process "INIT" is a process that is performed when initializing the processor 120, for example.

In the process "INIT," variable flag_cascade, which indicates whether the cascade function is valid or not, is set to "No," and variable idx_valid, which indicates whether or not any code word has been detected, is set to "No" (step S811). Then, t, which indicates the top position of read in the code buffer 281, is reset to "0" (step S812).

FIG. 11 illustrates an exemplary procedure of the process "VLD_DECODE" according to this embodiment of the present invention. In this process "VLD_DECODE," cc, vrs, and cascade are used as the operands. Here, cc is a parameter that is used to indicate the address of the condition code register 260, vrs is a parameter that is used to indicate the address of the configuration information register file 270, and cascade is a parameter that is used to indicate whether or not the cascade function is to be employed. In the "vld_decode" instruction, cascade is set to "No," whereas in the "vld_decode_cascade" instruction, cascade is set to "Yes."

First, a content (128 bits) of one of the registers in the configuration information register file 270 is assigned to the variables CCMAP and VLDCTX as illustrated in FIG. 5 (step S821). Then, process "VLD_DEC" is performed with VLDCTX as a parameter. As a result, the code number ID and the code length len are obtained as return values (step S822).

Then, CCMAP corresponding to the code number ID is set in variable cond, and at the same time, if the code number ID is the code number EID, which indicates that no match has been detected, "1" is set in variable condex, whereas if the code number ID is not the code number EID, "0" is set in the variable condex (step S823).

Unless the parameter cascade is "Yes" and the variable idx_valid is "Yes," i.e., when the parameter cascade is "No" or the variable idx_valid is "No," the value of the code length len is set in variable v_len (step S825). The variable v_len is a variable that holds an effective code length.

Then, the process "SHOWBITS" is performed with len+2 as a parameter (step S826). As a result, reference is made up to two bits farther than data corresponding to the detected code length, and bit data ret_bits is obtained as a return value.

Then, the value of the parameter cascade is set in the variable flag_cascade, and the last two digits of the bit data ret_bits are set in variable xbit (step S827). In other words, data of the two bits that follow the data corresponding to the detected code length is held in the variable xbit.

Then, as a return value, the value of the variable cond is set in a register that is indicated by cc in the condition code register 260, and the value of the variable condex is set in a register that is indicated by cc+1 in the condition code register 260 (step S828).

Figure 12:
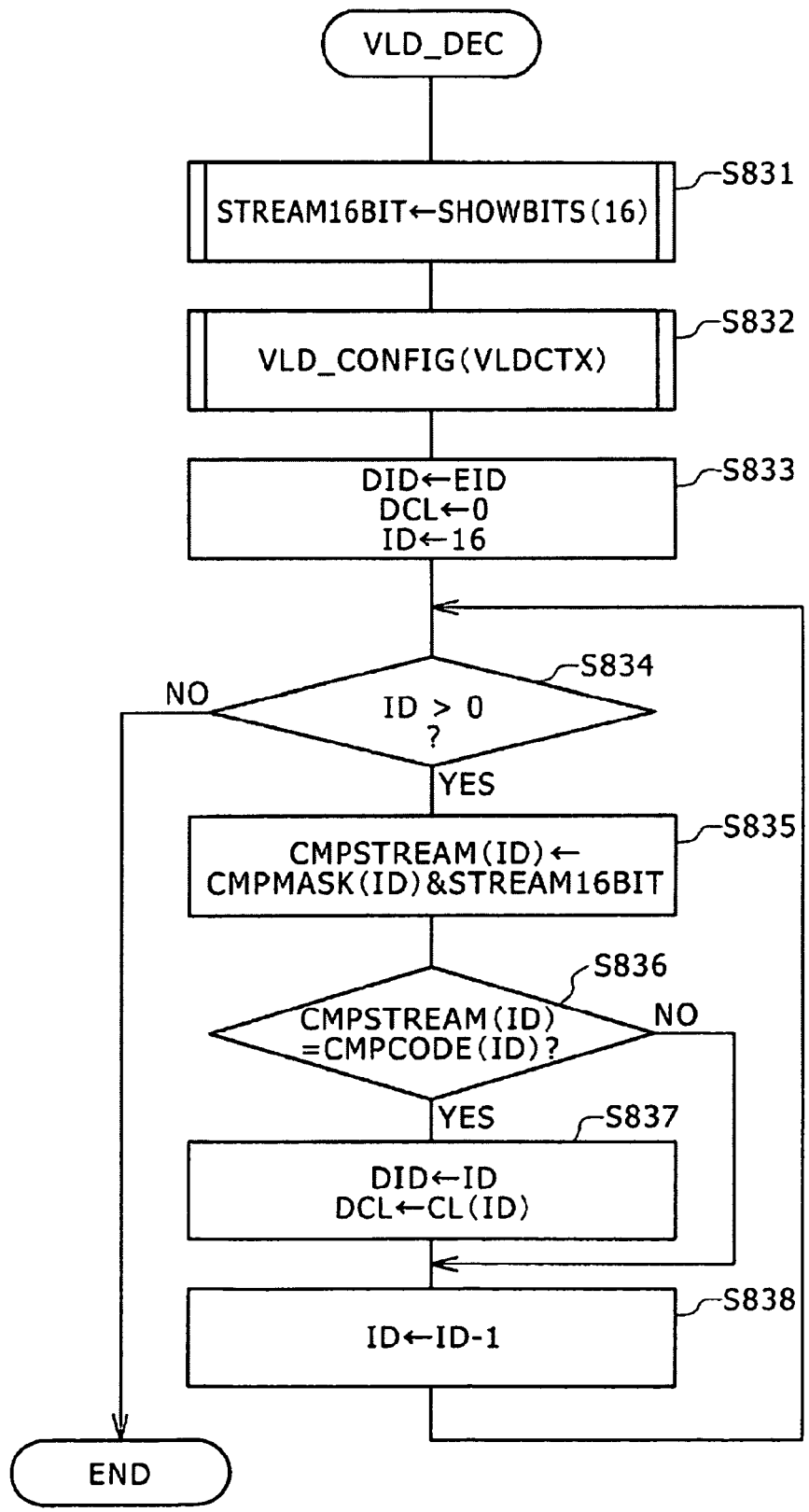
FIG. 12 illustrates an exemplary procedure of process "VLD_DEC" according to this embodiment of the present invention.

FIG. 12 illustrates an exemplary procedure of the process "VLD_DEC" according to this embodiment of the present invention. In the process "VLD_DEC," variable VLDCTX is used as an operand. The variable VLDCTX is information, among the configuration information, that represents the configuration of the code word detectors 321.

First, the process "SHOWBITS" is performed with "16" as a parameter (step S831). As a result, 16 bits of stream data are obtained as a return value and set in variable STREAM16BIT. Then, process "VLD_CONFIG" is performed with the variable VLDCTX as a parameter (step S832). As a result, the configuration of the code word detectors 321 is set. Then, the code number EID, which indicates that no match has been detected, is set in variable DID, which indicates the code number. In addition, "0" is set in variable DCL, which indicates the code length, and "16" is set in a counter ID for the code number (step S833).

Thereafter, a procedure described below is repeated until the counter ID reaches "0" (step S834). A result of an AND operation on the variables STREAM16BIT and CMPMASK (ID) is set in variable CMPSTREAM(ID), which indicates comparison-target stream data (step S835). If the value of variable CMPCODE(ID), which indicates the code word detected by the IDth code word detector 321, coincides with the value of the variable CMPSTREAM(ID) (step S836), the current value of the variable ID is set in the variable DID, and the code length CL(ID) corresponding to the variable ID is set in the variable DCL (step S837). Thereafter, the value of the variable ID is decremented by 1 (step S838).

As return values of the process "VLD_DEC," the value of the variable DID, which indicates the code number, and the value of the variable DCL, which indicates the code length, are outputted (see step S822).

Figure 13:
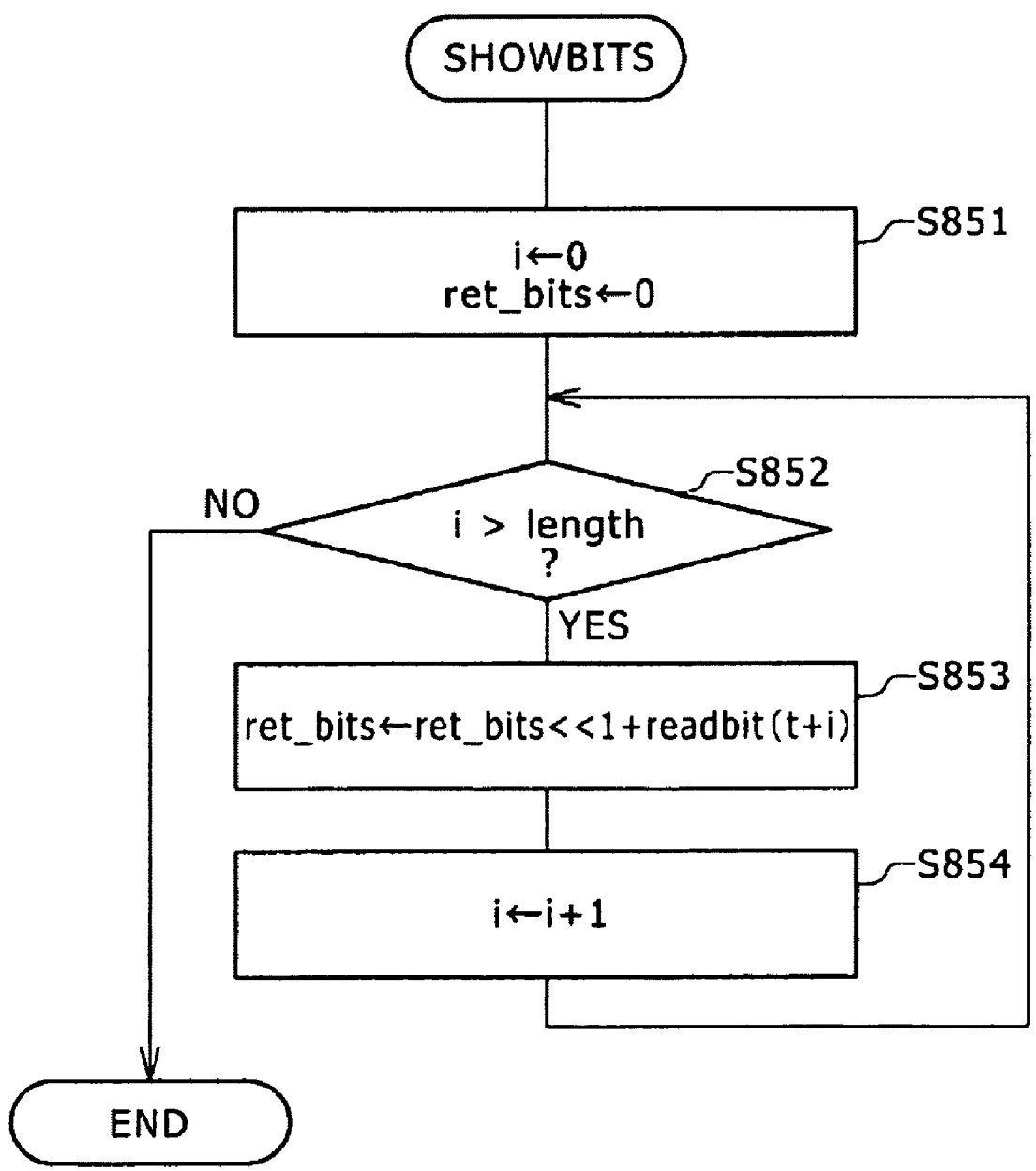
FIG. 13 illustrates an exemplary procedure of process "SHOWBITS" according to this embodiment of the present invention.

FIG. 13 illustrates an exemplary procedure of the process "SHOWBITS" according to this embodiment of the present invention. In the process "SHOWBITS," variable length is used as an operand. The variable length is a variable that indicates the number of bits that are to be read from the code buffer 281.

First, both counter i for counting the number of bits and variable ret_bits for holding stream data read are reset to "0" (step S851). Then, while the counter i is incremented by 1 in each iteration (step S854), a process described below is repeated until the counter i reaches the value of the variable length (step S852). That is, a (t+i)th bit in the stream data is read from the code buffer 281, and a least significant bit that is lacking as a result of shifting the variable ret_bits to the left by one bit is filled with the read stream data (step S853). It is assumed that top data of the stream data in the code buffer 281 is a 0th bit.

As a return value of the process "SHOWBITS," the value of the variable ret_bits is outputted (see step S831).

Figure 14:
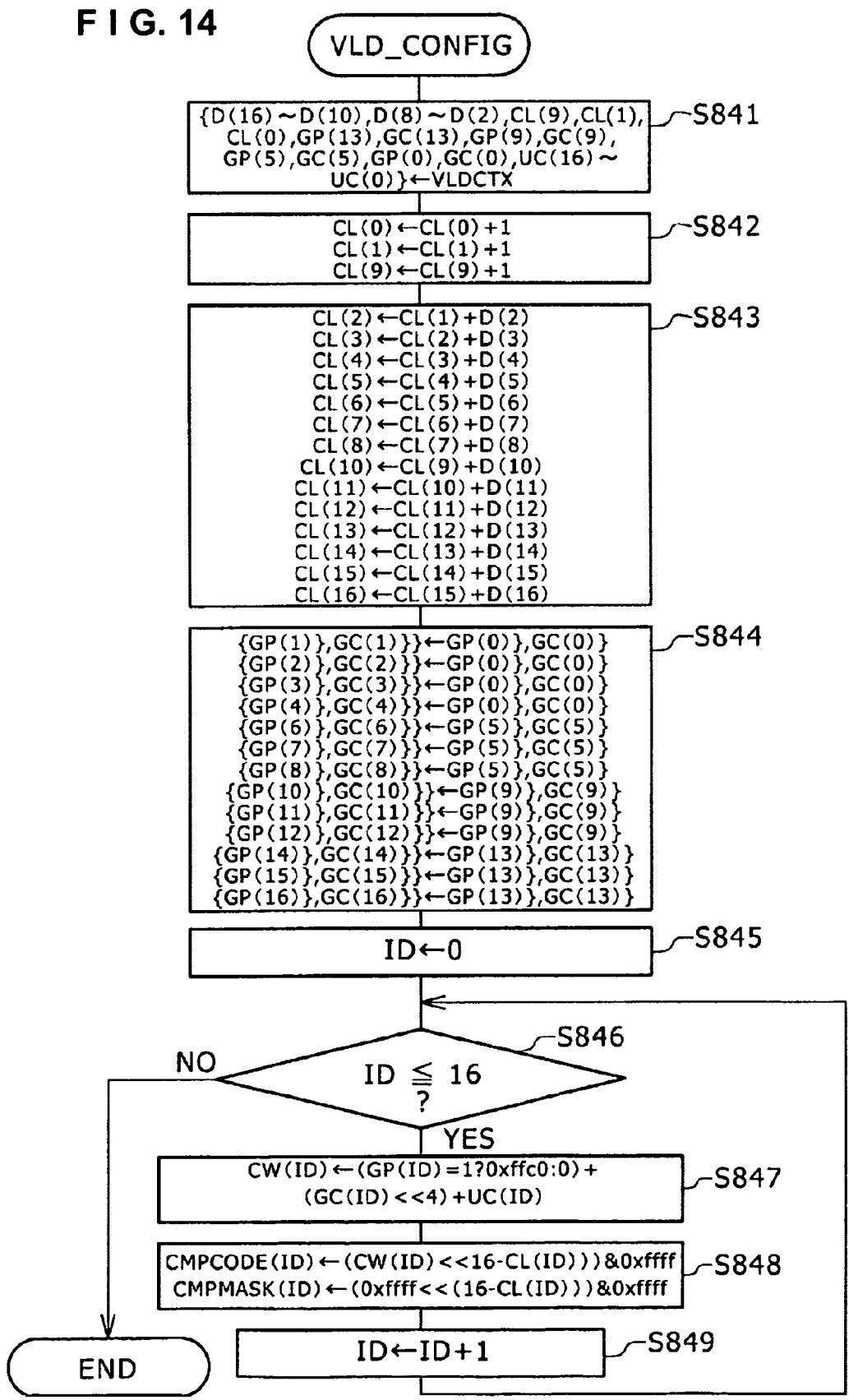
FIG. 14 illustrates an exemplary procedure of process "VLD_CONFIG" according to this embodiment of the present invention.

FIG. 14 illustrates an exemplary procedure of the process "VLD_CONFIG" according to this embodiment of the present invention. In the process "VLD_CONFIG," the variable VLDCTX is used as an operand. The variable VLDCTX is information, among the configuration information, that represents the configuration of the code word detectors 321.

First, values of the variable VLDCTX are set in variables D(16) to D(10), D(8) to D(2), CL(9), CL(1), CL(0), GP(13), GC(13), GP(9), GC(9), GP(5), GC(5), GP(0), GC(0), and UC(16) to UC(0) (step S841). This operation amounts to developing the configuration information as illustrated in FIG. 5 as the variables. The variable D is a variable that indicates the difference. The variable CL is a variable that indicates the code length. The variables GP, GC, and UC are variables that indicate the code word as described above with reference to FIG. 4.

Then, "1" is added to each of the variables CL(0), CL(1), and CL(9) (step S842). This is because the data is held in (code length−1) form in the configuration information in order to save a storage area. The variable D is added to the remaining variable CL considering the difference (step S843). This is because, for all the code lengths except the 0th, 1st, and 9th code lengths, only the differences are held in the configuration information, in order to save the storage area. The code lengths are thus restored based on the differences.

Values shared by the code word detectors 321 belonging to the same group are set in the variable GP and the variable GC (step S844). This is because, for the variable GP and the variable GC, only the values that represent each group are held in the configuration information, in order to save the storage area.

Then, the counter ID, which indicates the code number, is reset to "0" (step S845), and thereafter, while the counter ID is incremented by 1 (step S849) in each iteration, a procedure described below is repeated until the counter ID exceeds "16" (step S846). That is, if GP(ID) is "1" in the variable CW(ID), which indicates the code word, "0xffc0" is set on the MSB side, whereas if GP(ID) is "0," "0" is set on the MSB side. As a result, the bit value that occurs continuously is restored based on GP(ID). In addition, GC(ID) is shifted to the left by 4 bits, and UC(ID) is set in the resulting vacant lowest-order 4 bits, whereby UC(ID) is added to the variable CW(ID) (step S847). Further, the variable CW(ID) is shifted to the left by the number of bits corresponding to a value obtained by subtracting the value of the variable CL(ID) from "16," and thus set in the variable CMPCODE(ID) as 16-bit data (step S848). Still further, "0xffff" (where a number following "0x" is in hexadecimal, hereinafter) is shifted to the left by the number of bits corresponding to the value obtained by subtracting the value of the variable CL(ID) from "16," and thus set in the variable CMPMASK(ID) as 16-bit data (step S848).

Figure 15:
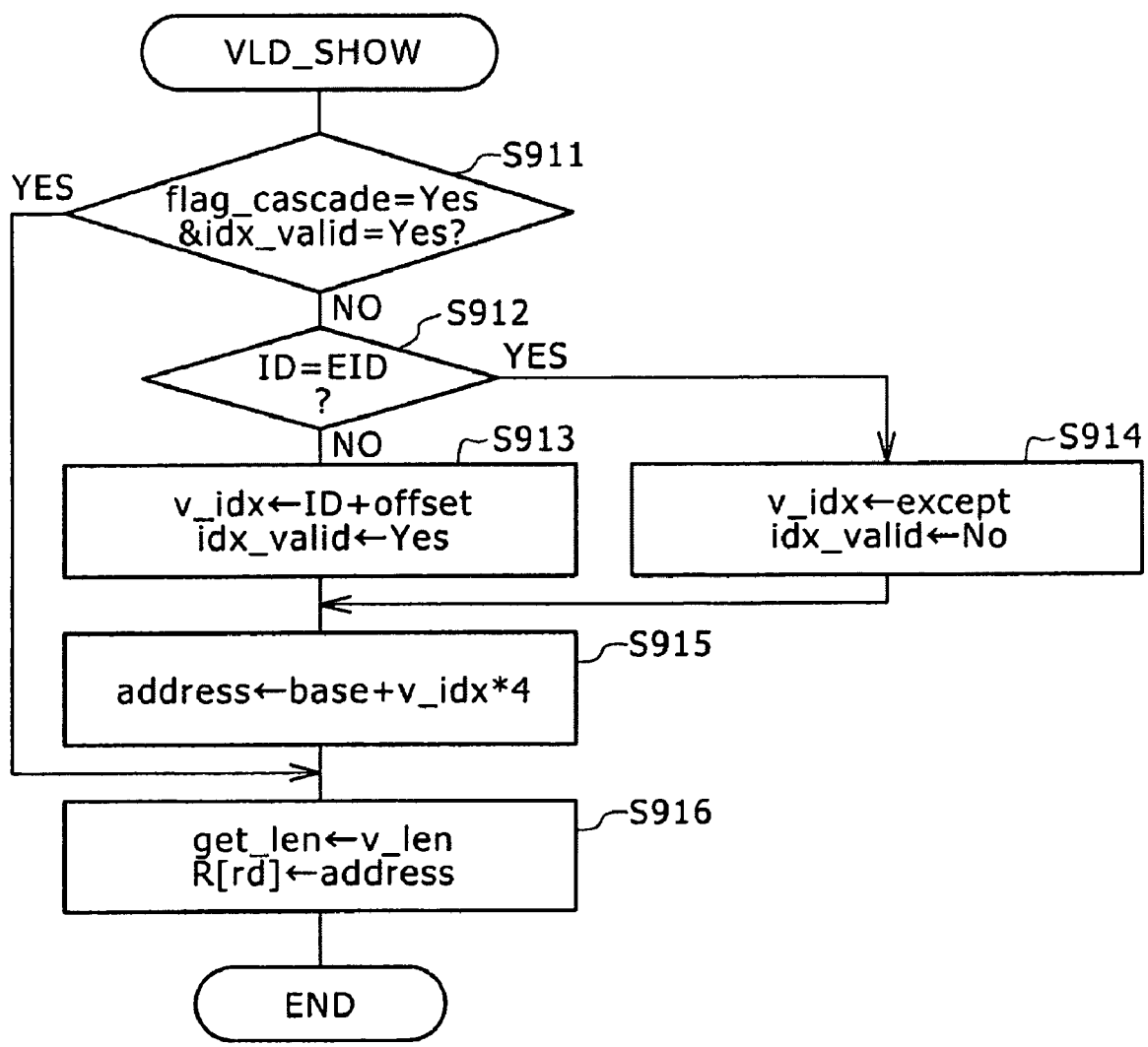
FIG. 15 illustrates an exemplary procedure of process "VLD_SHOW" according to this embodiment of the present invention.

FIG. 15 illustrates an exemplary procedure of the process "VLD_SHOW" according to this embodiment of the present invention. In the process "VLD_SHOW," the variables rd, base, offset, and except are used as operands. The variable rd is a parameter that is used to indicate the address of the general purpose register file 220. The variable base is a parameter that is used to indicate the base address of the decoding information table. The variable offset is a parameter that is used to indicate the offset value in the decoding information table. The variable except is a parameter that is used to indicate the relative position within the decoding information table in the case where no code word match has been detected.

First, if the value of the variable flag_cascade is "Yes" and the value of the variable idx_valid is "Yes" (step S911), processes of steps S912 to S915 are skipped.

If the variable ID is EID (step S912), the value of the variable except is set in the variable v_idx, and "% No" is set in the variable idx_valid (step S914). On the other hand, if the variable ID is not EID (step S912), the sum of the value of the variable ID and the value of the variable offset is set in the variable v_idx, and "Yes" is set in the variable idx_valid (step S913).

In addition, the sum of four times the variable v_idx and the value of the variable base is set in variable address (step S915). In other words, an address (i.e., a table address), in the memory 140, corresponding to the code word in the decoding information table is held in the variable address.

Then, the value of the variable v_len is set in the variable get_len, and the value of the variable address is set in a register that is indicated by the address rd in the general purpose register file 220 (step S916).

Figure 16:
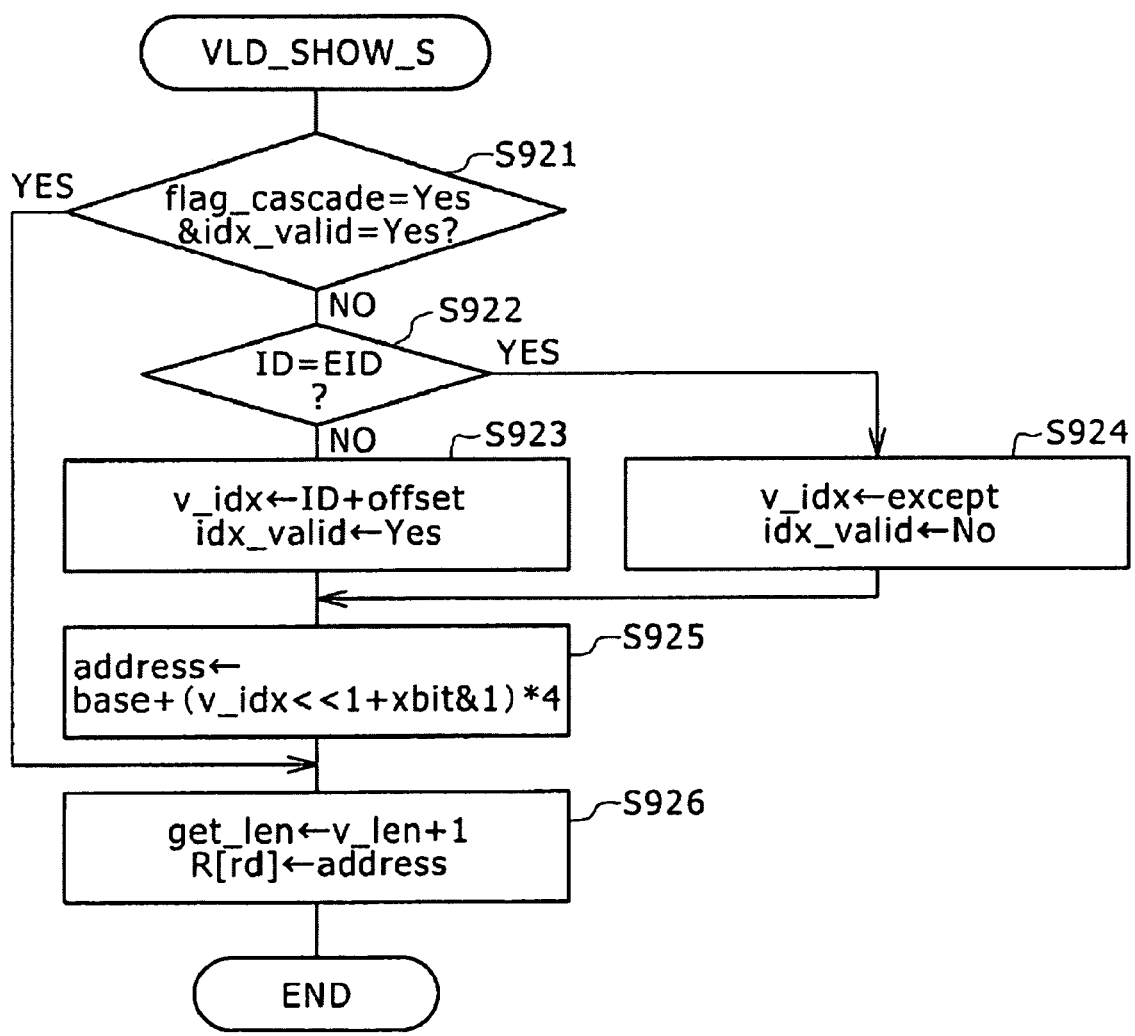
FIG. 16 illustrates an exemplary procedure of process "VLD_SHOW_S" according to this embodiment of the present invention.

FIG. 16 illustrates an exemplary procedure of the process "VLD_SHOW_S" according to this embodiment of the present invention. In the process "VLD_SHOW_S," as with the process "VLD_SHOW," the variables rd, base, offset, and except are used as operands.

First, if the value of the variable flag_cascade is "Yes" and the value of the variable idx_valid is "Yes" (step S921), processes of steps S922 to S925 are skipped.

If the variable ID is EID (step S922), the value of the variable except is set in the variable v_idx, and "No" is set in the variable idx_valid (step S924). On the other hand, if the variable ID is not EID (step S922), the sum of the value of the variable ID and the value of the variable offset is set in the variable v_idx, and "Yes" is set in the variable idx_valid (step S923). Until this stage, this procedure is identical to that of the process "VLD_SHOW."

In addition, the variable v_idx is shifted to the left by one bit, and the lowest-order bit of the variable xbit is set in the resulting vacant lowest-order bit. The sum of four times this value and the value of the variable base is set in the variable address (step S925). In other words, an address (i.e., a table address), in the memory 140, corresponding to the code word in the decoding information table, when a read of an additional one bit has been done, is held in the variable address.

Then, the sum of the value of the variable v_len and "1" is set in the variable get_len, and the value of the variable address is set in the register that is indicated by the address rd in the general purpose register file 220 (step S926).

FIG. 17 illustrates an exemplary procedure of the process "VLD_SHOW_SS" according to this embodiment of the present invention. In the process "VLD_SHOW_SS," as with the process "VLD_SHOW," the variables rd, base, offset, and except are used as operands.

First, if the value of the variable flag_cascade is "Yes" and the value of the variable idx_valid is "Yes" (step S931), processes of steps S932 to S935 are skipped.

If the variable ID is EID (step S932), the value of the variable except is set in the variable v_idx, and "No" is set in the variable idx_valid (step S934). On the other hand, if the variable ID is not EID (step S932), the sum of the value of the variable ID and the value of the variable offset is set in the variable v_idx, and "Yes" is set in the variable idx_valid (step S933). Until this stage, this procedure is identical to that of the process "VLD_SHOW."

In addition, the variable v_idx is shifted to the left by two bits, and the lowest-order 2 bits of the variable xbit is set in the resulting vacant lowest-order 2 bits. The sum of four times this value and the value of the variable base is set in the variable address (step S935). In other words, an address (i.e., a table address), in the memory 140, corresponding to the code word in the decoding information table, when a read of additional two bits has been done, is held in the variable address.

Then, the sum of the value of the variable v_len and "2" is set in the variable get_len, and the value of the variable address is set in the register that is indicated by the address rd in the general purpose register file 220 (step S936).

FIG. 18 illustrates an exemplary procedure of the process "VLD_GET" according to this embodiment of the present invention. In the process "VLD_GET," as with the process "VLD_SHOW," the variables rd, base, offset, and except are used as operands.

In the process "VLD_GET," the process "VLD_SHOW" as described above with reference to FIG. 15 is performed (step S941), and in addition, the process "GETBITS" is performed (step S942).

FIG. 19 illustrates an exemplary procedure of the process "GETBITS" according to this embodiment of the present invention. In the process "GETBITS," the variable length is used as an operand. The variable length is a parameter that is used to indicate the code length.

In the process "GETBITS," the process "SHOWBITS" as described above with reference to FIG. 13 is performed (step S861), and in addition, the value of the variable length is added to the read position t in the stream data (step S862). That is, not only the stream data is read by the process "SHOWBITS," but also the read position is updated.

Figure 20:
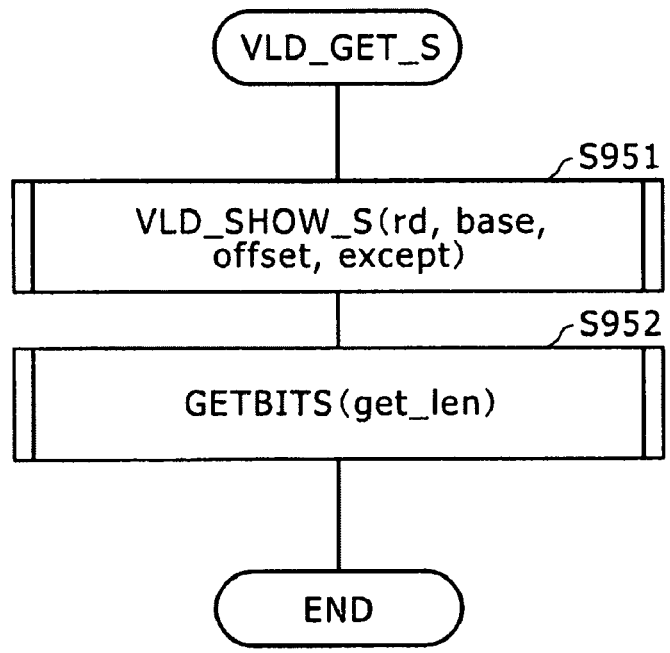
FIG. 20 illustrates an exemplary procedure of process "VLD_GET_S" according to this embodiment of the present invention.

FIG. 20 illustrates an exemplary procedure of the process "VLD_GET_S" according to this embodiment of the present invention. In the process "VLD_GET_S," as with the process "VLD_SHOW," the variables rd, base, offset, and except are used as operands.

In the process "VLD_GET_S," the process "VLD_SHOW_S" as described above with reference to FIG. 16 is performed (step S951), and in addition, the process "GETBITS" is performed (step S952).

Figure 21:
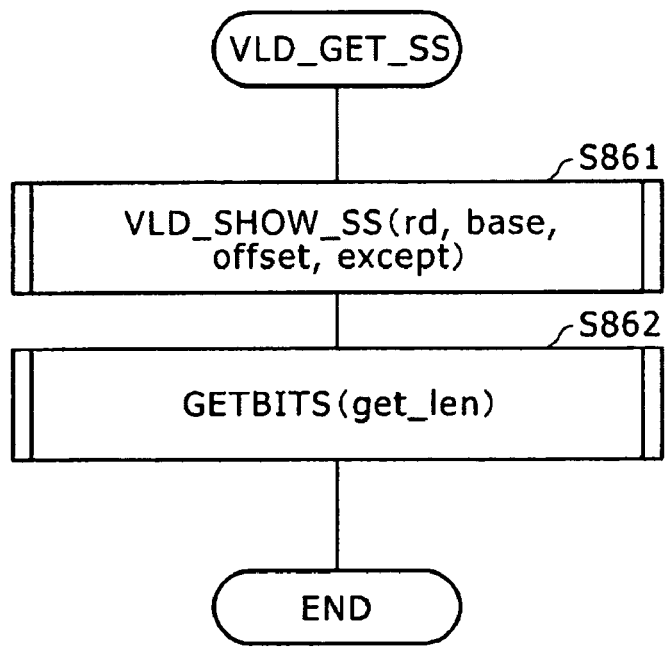
FIG. 21 illustrates an exemplary procedure of process "VLD_GET_SS" according to this embodiment of the present invention.

FIG. 21 illustrates an exemplary procedure of the process "VLD_GET_SS" according to this embodiment of the present invention. In the process "VLD_GET_SS," as with the process "VLD_SHOW," the variables rd, base, offset, and except are used as operands.

In the process "VLD_GET_SS," the process "VLD_SHOW_SS" as described above with reference to FIG. 17 is performed (step S961), and in addition, the process "GETBITS" is performed (step S962).

FIG. 22 illustrates exemplary built-in functions of a C language compiler supposing the instruction set according to this embodiment of the present invention. After automatic register assignment, these built-in functions are replaced with their corresponding assembler instructions. It is assumed that the vld_br instruction is generated for an if statement that causes a branch based on the condition code register 260. It is assumed that the compiler automatically interprets int type variables cond0 and cond2 in a program to be CC[0] and CC[2] of the condition code register 260.

Function "void vld_baseaddr(int*addr)" stores variable addr in R[rs] of the general purpose register file 220, and thereafter executes instruction "vld_baseaddr rs."

Function "int vld_decode(int ctx)" executes instruction "vld_decode cc, vrs," with a register number indicated by variable ctx as vrs. This function returns CCR[cc] and CCR[cc+1] as return values.

Function "int vld_decode_cascade(int ctx)" executes instruction "vld_decode_cascade cc, vrs," with the register number indicated by the variable ctx as vrs. This function returns CCR[cc] and CCR[cc+1] as return values.

Function "int vld_get(int offset, int except)" executes instruction "vld_get rd, offset, except." This function returns the value of R[rd] of the general purpose register file 220 as a return value.

Function "int vld_get_s(int offset, int except)" executes instruction "vld_get_s rd, offset, except." This function returns the value of R[rd] of the general purpose register file 220 as a return value.

Function "int vld_show(int offset, int except)" executes instruction "vld_show rd, offset, except." This function returns the value of R[rd] of the general purpose register file 220 as a return value.

Function "int vld_show_s(int offset, int except)" executes instruction "vld_show_s rd, offset, except." This function returns the value of R[rd] of the general purpose register file 220 as a return value.

Function "int showbits(int len)" stores the variable len in R[rs] of the general purpose register file 220, and thereafter executes instruction "showbits rd, rs." This function returns the value of R[rd] of the general purpose register file 220 as a return value.

Function "int getbits(int len)" stores the variable len in R[rs] of the general purpose register file 220, and thereafter executes instruction "getbits rd, rs." This function returns the value of R[rd] of the general purpose register file 220 as a return value.

Function "void load_v(int ctx, int*addr)" sets the variable offset and R[rs] of the general purpose register file 220 so that the value of offset+R[rs] will coincide with the value of the variable addr, with the register number indicated by the variable ctx as vrd, and executes instruction "load_v vrd, offset(rs)."

Function "void store_v(int ctx, int*addr)" sets the variable offset and R[rs] of the general purpose register file 220 so that the value of offset+R[rs] will coincide with the value of the variable addr, with the register number indicated by the variable ctx as vrs, and executes instruction "store_v vrs, offset(rs)."

Use of these built-in functions allows programming in the C language while accommodating the machine language instructions as illustrated in FIG. 9.

FIG. 23 illustrates a code table of MacroBlock Address Increment (MBAI) defined in the MPEG standard, as an exemplary code that is to be decoded in this embodiment of the present invention. MBAI represents a difference (an increment value) in absolute address between a given macroblock and an immediately previous macroblock. This code table illustrates correspondences between pieces of decoding information representing MBAI and their code words. Here, macroblock stuffing (MS) and macroblock escape (ME) are assigned to pieces of decoding information "34" and "35," respectively.

Figure 24A:
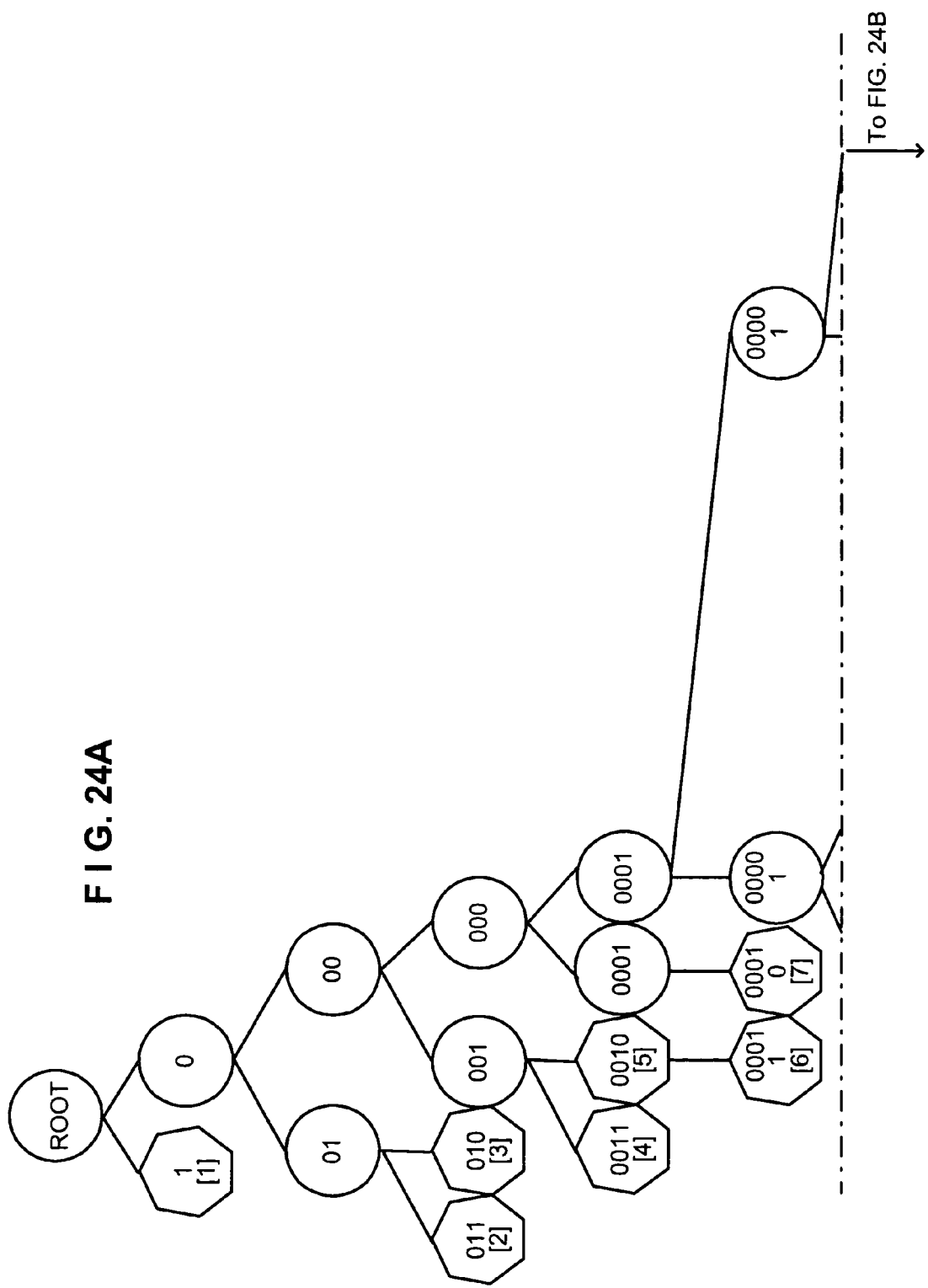
FIG. 24 illustrates an exemplary code tree representing the code table of FIG. 23.
Figure 24B:
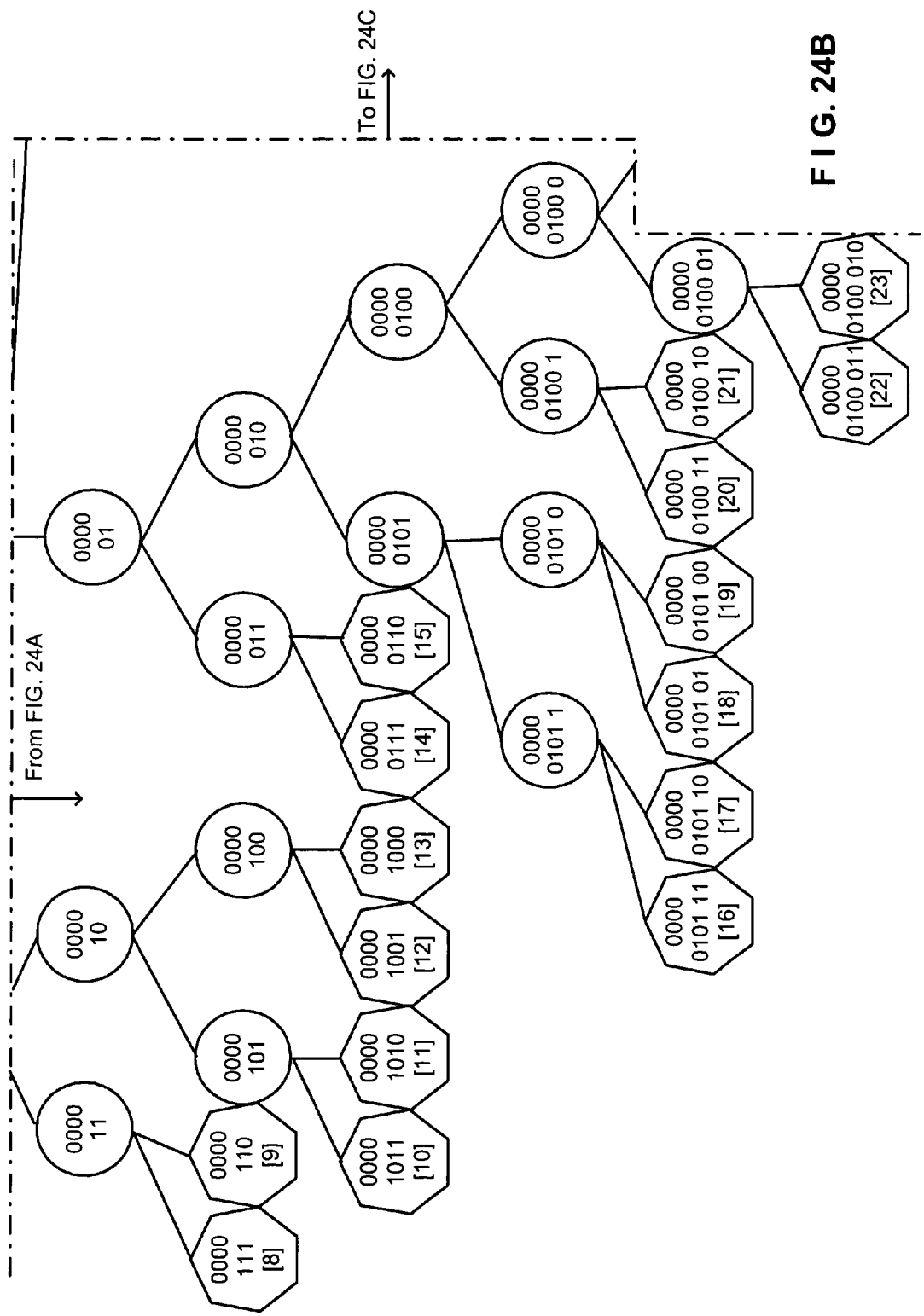
Figure 24C:
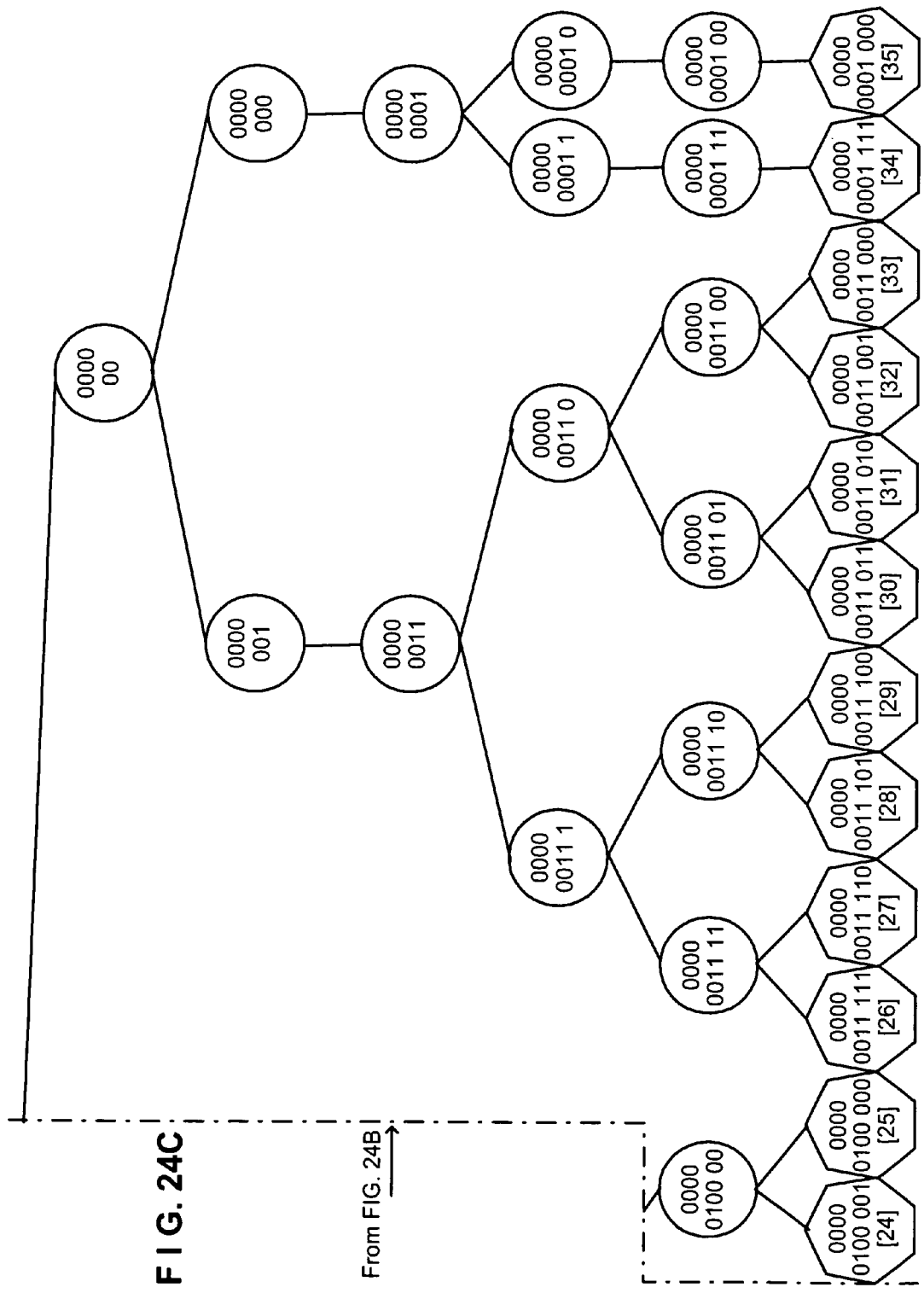

FIG. 24 illustrates an exemplary code tree representing the code table as illustrated in FIG. 23. A root is an empty symbol string of a length of "0." The code tree starts with the root, and each time the length increases by one, a binary symbol {0, 1} is added, resulting in two child nodes with 0 and 1, respectively, added. The node may have only one child depending on the code table. Any symbol string that has a corresponding code word in the code table becomes a leaf without a child node. Here, the nodes are represented by a circle, whereas the leaves are represented by a heptagon. The code table can be represented by the code tree in this manner.

Consideration will now be given to how large an amount of information is required to represent a binary tree. When it is not known whether each of all nodes has a child, the probability that the node has a child is 0.5. Therefore, information about whether "the node has a child" can be expressed with "−log(0.5)/log 2=1" bit, a minimum size equal to entropy. It is assumed, for example, that "1" is assigned as a symbol to indicate that the node has a child, while "0" is assigned as a symbol to indicate that the node is a leaf. After the root node, its child nodes are coded sequentially. In the case of "1," child nodes of the left-branch child node are coded sequentially. Once coding of all subtrees below the left-branch child node is completed, subtrees below the right-branch child node are coded. That is, left-hand search is performed sequentially, from the leftmost branch toward right-hand branches of the tree, to code all the nodes sequentially.

In view of this, consideration will be given to how many bits are required to represent the code tree of FIG. 24. The code tree of FIG. 24 has nodes with only one child node, and for that type of nodes, a leaf is added as a child node for the other branch for coding. Since the number of nodes and leaves is 75, and six leaves are added, the code tree can be represented with a total of 81 bits. That is, the code table of FIG. 23 can ideally be defined with approximately 81 bits.

However, in the case where the code value and the code length are simply represented by fixed-length codes, 11 bits are required for the code value, and 4 bits are required to represent the maximum code length of 11. Therefore, a total of 15 bits are required for each code word. Because there are 35 code words, 15×35=525 bits are required. On the other hand, in the case of the above-described representation using 81 bits, the code word cannot be identified without decoding the entire tree, and the process of decoding the tree is so complicated that high-speed processing is difficult to accomplish even by hardware implementation. Meanwhile, in the case of the representation using 525 bits, the code word can be identified quickly by referring to a table representing the code table, and only searching the table suffices.

In contrast, in the representation of the configuration information as illustrated in FIG. 5, the configuration VLDCTX is composed of 110 bits. In this embodiment of the present invention, high-speed processing is accomplished even by hardware implementation, and therefore if the most part of FIG. 23 is represented by the single piece of configuration information, it can be said that efficient representation is accomplished.

FIGS. 25A, 25B, 25C, and 25D illustrate an example of correspondences between the configuration information, the decoded code values, the decoding information, and the code words, when the code defined by the code table of FIG. 23 is decoded. FIG. 25A illustrates the configuration information, which is to be processed in the decoding process RVLD. Any code word that is not decoded with the configuration information of FIG. 25A is classified as a node (CODENODE), and only the prefix of the code word is decoded, while the remaining part thereof is processed with FIGS. 25B to 25D. Specifically, in the case where the decoded code number is "7," the table of FIG. 25B is used to decide on one of the pieces of decoding information "16" to "25." In the case where the decoded code number is "10," the table of FIG. 25C is used to decide on one of the pieces of decoding information "26" to "33." In the case where the decoded code number is "32," the table of FIG. 25D is used to decide on one of the pieces of decoding information "34" and "35."

Figure 26A:
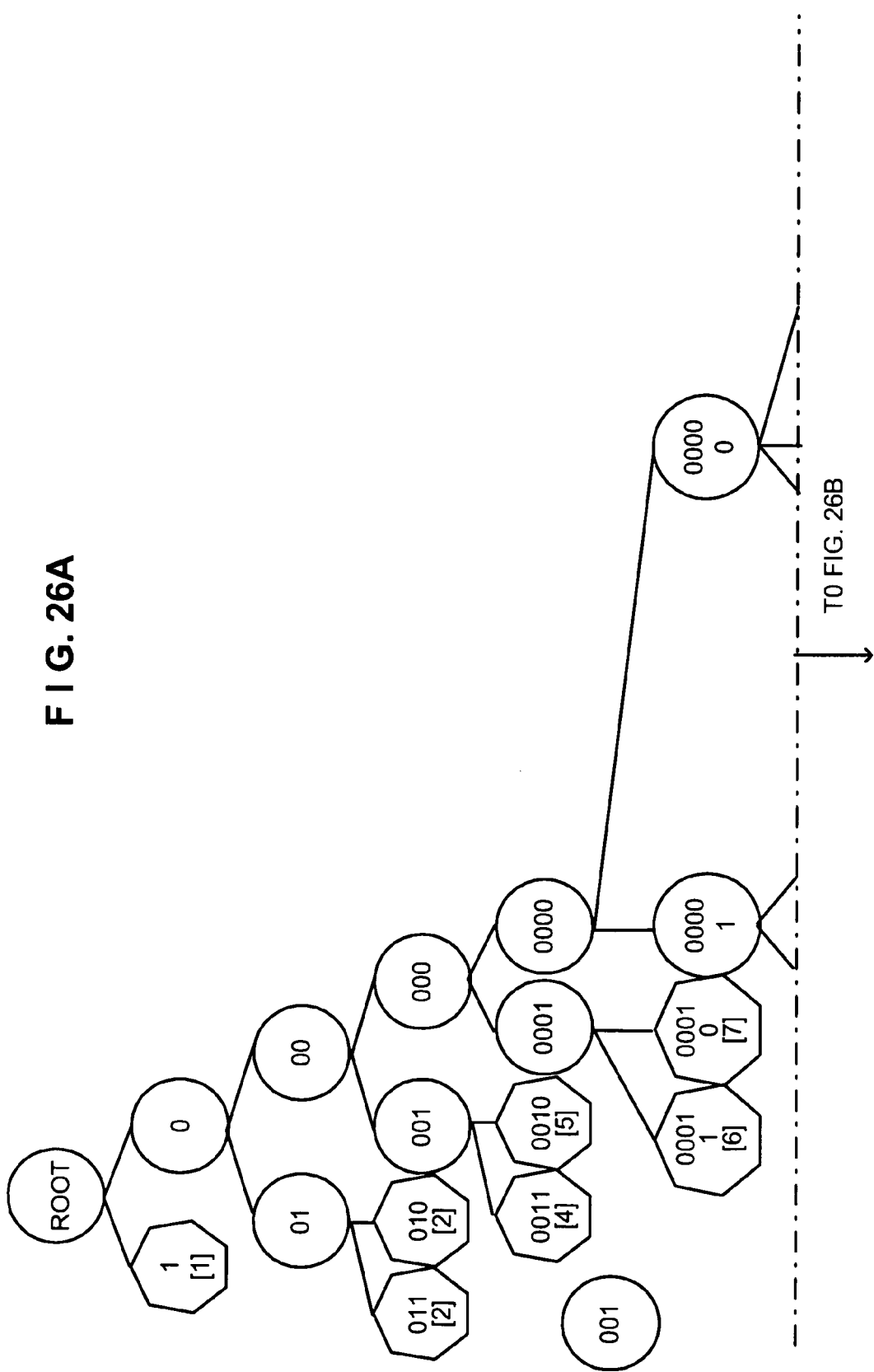
FIG. 26 illustrates an exemplary code tree corresponding to the table of FIG. 25A.
Figure 26B:
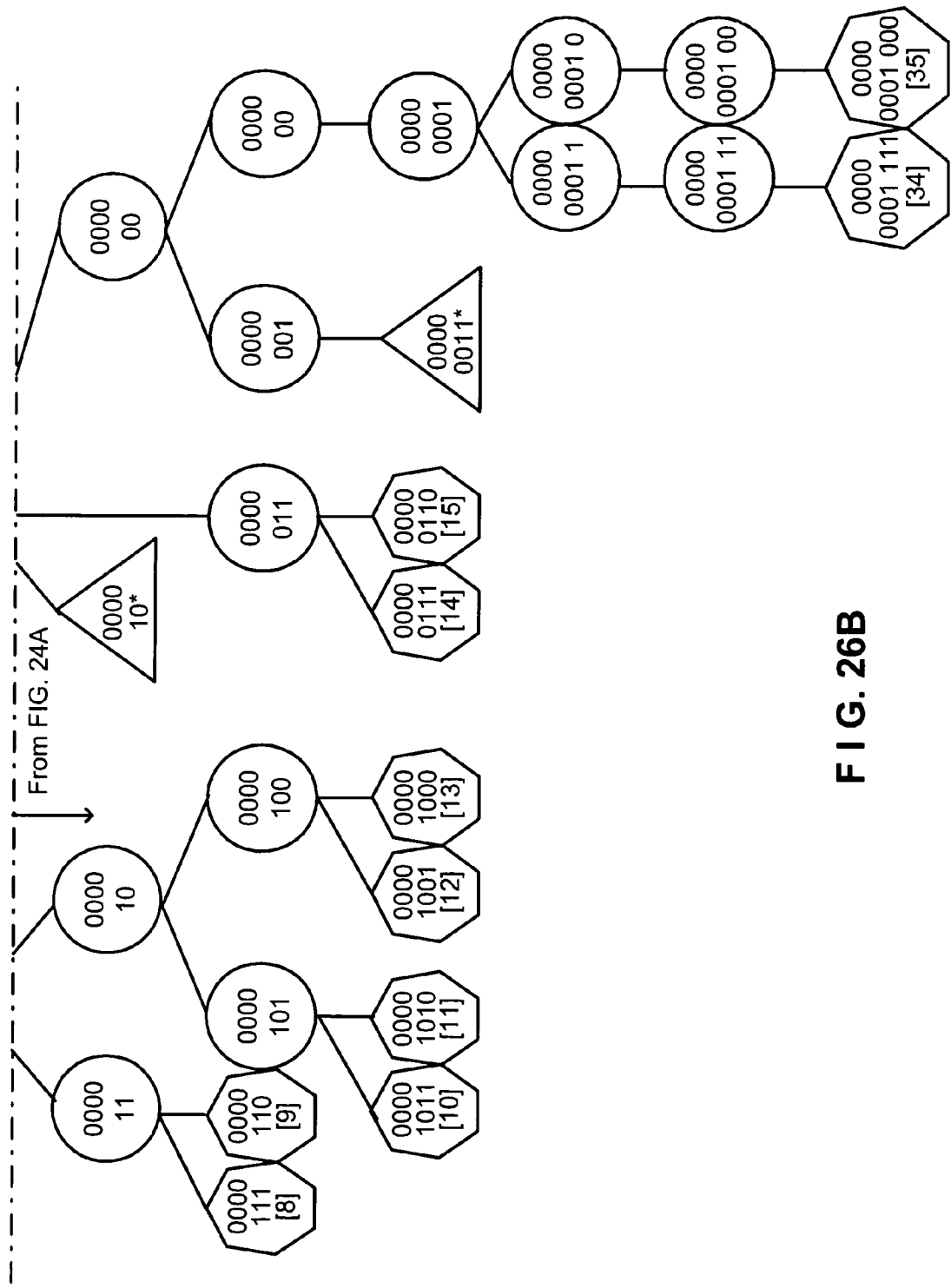
Figure 27:
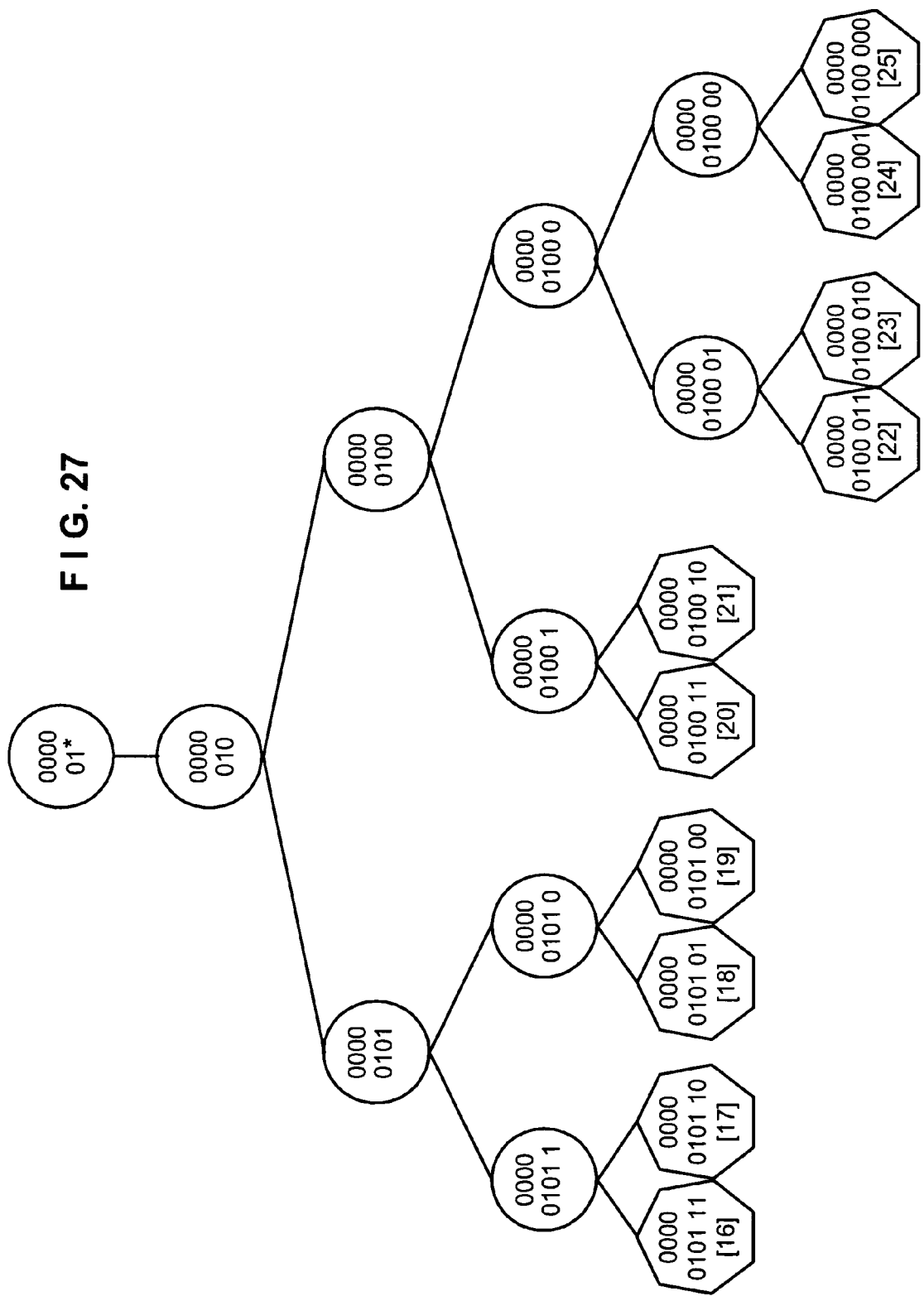
FIG. 27 illustrates an exemplary code tree corresponding to the tables of FIGS. 25B and 25D.
Figure 28:
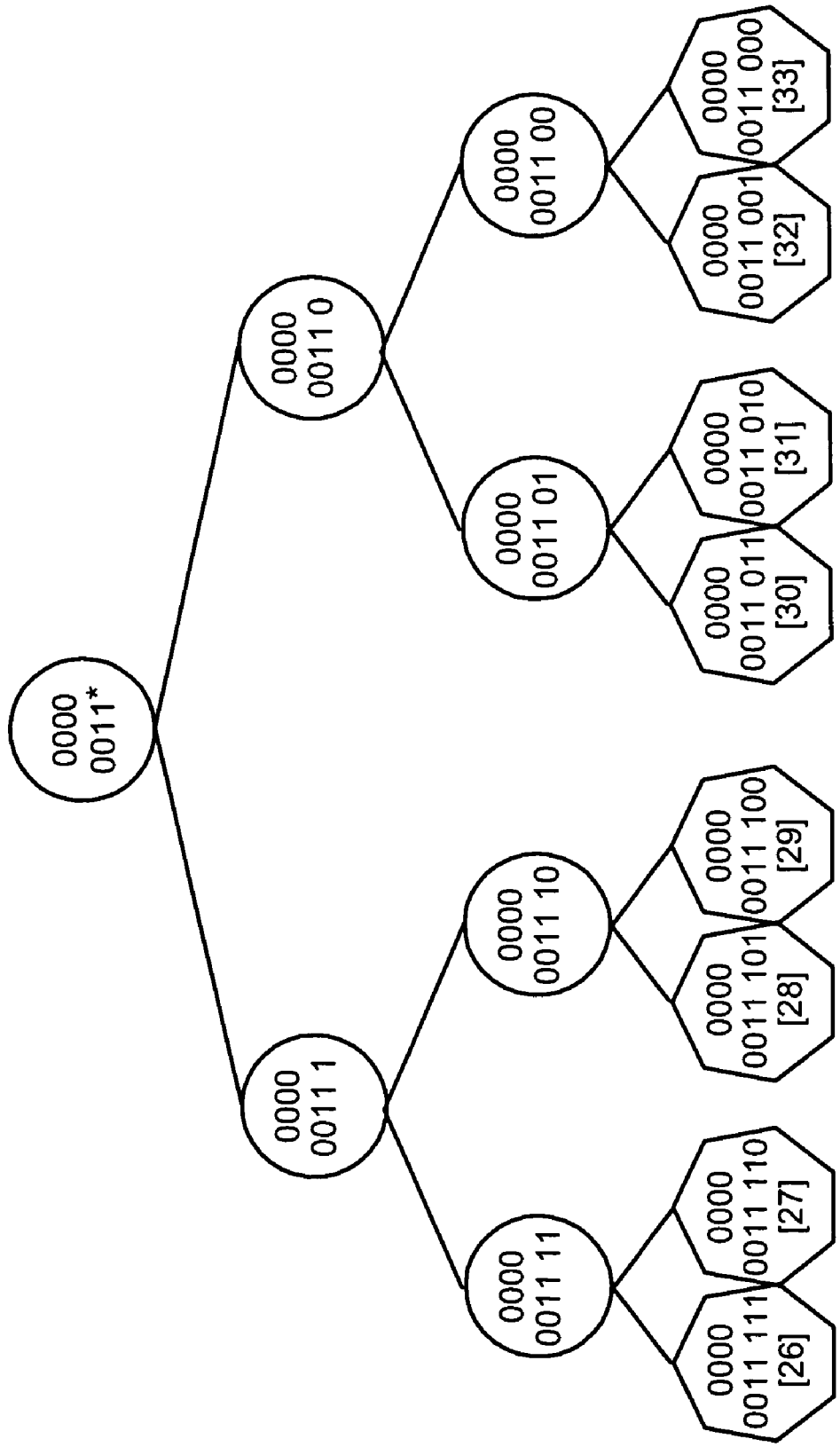
FIG. 28 illustrates an exemplary code tree corresponding to the table of FIG. 25C.

FIG. 26 illustrates an exemplary code tree corresponding to the table of FIG. 25A. FIG. 27 illustrates an exemplary code tree corresponding to the tables of FIGS. 25B and 25D. FIG. 28 illustrates an exemplary code tree corresponding to the table of FIG. 25C.

FIG. 29 illustrates an exemplary C language program for decoding the code that is defined by the code table of FIG. 23. In this exemplary program, the most part of the tree is represented by the single piece of configuration information as illustrated in FIG. 25, while the remaining part of the tree is decoded by simple processing.

In this exemplary program, function vld is a main function for decoding the code words in the code table of FIG. 23. The function vld returns a value in the decoding information table in the case of classification as a leaf (CODELEAF), whereas in the case of classification as a node (CODENODE) or the absence of a match (EID), the function vld decodes the suffix by a separate function call. In the "if(cond0)" portion, a branch is caused depending on the condition code generated from CCMAP, to determine whether or not the code is a leaf (CODELEAF). As a machine language instruction for this portion, the vld_br instruction, which is a branch instruction, is used.

Function decEID is a function for carrying out the decoding with the table of FIG. 25D, in the case where the decoded code number is "32." Specifically, the function decEID moves the read position forward by 8 bits, and returns "34" as a function value if a match with "0x0f" is found, and otherwise returns "35" as a function value.

Function dec7 is a function for carrying out the decoding with the table of FIG. 25B, in the case where the decoded code number is "7." Specifically, the function dec7 subtracts twice the 3-bit suffix from "25," and, if the 3-bit suffix is "000," moves the read position forward by 2 bits, or otherwise moves the read position forward by 1 bit, and then further subtracts the number over which the read position has been moved. As a result, the function dec7 returns one of "16" to "25" as a function value.

Function dec10 is a function for carrying out the decoding with the table of FIG. 25C, in the case where the decoded code number is "10." Specifically, the function dec10 returns a value obtained by subtracting the 3-bit suffix from "33" as a function value.

Variable VCTX0 is a variable that holds the address in the memory 140 where the configuration information of FIG. 5 is stored. Note that the value of the variable VCTX0 is given by four constants C0, C1, C2, and C3.

Variable VLDTBL is a variable defined as a union, and assigned to the same memory area as array vld_table[18] that has an integer or function pointer as an element. The array vld_table[18] is the decoding information table, and holds the decoding information in the second column from the left in the table of FIG. 25A or the function pointer. Thus, in the case of the classification as a node (CODENODE) or the absence of a match (EID), one of the functions decEID, dec7, and dec10 is called, whereas in the case of the classification as a leaf (CODELEAF), the decoding information (i.e., the integer value) is outputted as a function value.

Function vld_baseaddr is a built-in function for setting the base address of the decoding information table. Function load_v is a built-in function for loading the configuration information into the configuration information register file 270.

Function vld_decode is a built-in function for determining the decoded code number and generating the condition code information. To the variable cond0, the value of CCMAP(ID) of the corresponding decoded code number ID is outputted as a function value.

Function vld_get is a built-in function for adding the offset value ("1" in the case of this example) to the decoded code number and acquiring the address in the decoding information table, and moving the read point in the stream data forward by the number of bits corresponding to the code length. To variable tblp, the address (pointer) in the decoding information table is outputted as a function value.

As described above, the decoding of any code word in the code table of FIG. 23 is accomplished by the use of the simple program and the single piece of configuration information.

FIGS. 30A, 30B, 30C, 30D, 30E, 30F, 30G, and 30H illustrate another example of the correspondences between the configuration information, the decoded code values, the decoding information, and the code words, when the code defined by the code table of FIG. 23 is decoded. This example is so configured that the most part of the tree is represented by two pieces of configuration information as illustrated in FIGS. 30A and 30C while a suffix of each of the remaining code words is represented with the same number of bits (i.e., 1 bit). Since all the suffixes are of the same length, a subsequent process can be shared by all of them. Therefore, there is no need to tabulate the functions as in the decoding information table of FIG. 29, and a simple branch process suffices.

FIG. 30A illustrates normal configuration information, and this configuration information is processed using the vld_decode instruction. FIG. 30C illustrates configuration information that supposes the cascade function, and this configuration information is processed using the vld_decode_cascade instruction. The settings of the offsets are so configured that continuous indexing of the 34 tables will be accomplished by use of these two pieces of configuration information.

FIGS. 30B, 30D, 30E, 30F, 30G, and 30H illustrate correspondences between code words classified as nodes (CODENODE) and suffixes. In the case where the decoded code number is "16," the table of FIG. 30B is used. In the case where the decoded code number is "16" in the normal configuration information, the table of FIG. 30B is used. In the case where the decoded code number is "0" in the configuration information that supposes the cascade function, the table of FIG. 30D is used. In the case where the decoded code number is "1" in the configuration information that supposes the cascade function, the table of FIG. 30E is used. In the case where the decoded code number is "2" in the configuration information that supposes the cascade function, the table of FIG. 30F is used. In the case where the decoded code number is "3" in the configuration information that supposes the cascade function, the table of FIG. 30G is used. In the case where the decoded code number is "4" in the configuration information that supposes the cascade function, the table of FIG. 30H is used. In all these tables, the residual code length is constantly "1." This represents an excellent example of program simplification achieved by using an additional piece of configuration information.

FIG. 31 illustrates another example of the C language program for decoding the code that is defined by the code table of FIG. 23. In this example program, the most part of the tree is represented by the two pieces of configuration information as illustrated in FIGS. 30A and 30C, while the remaining parts of the tree are decoded by simple processing.

Variables VCTX0 and VCTX1 are variables for holding addresses on the memory 140 where the two pieces of configuration information are stored. The value of the variable VCTX0 is given by four constants C0, C1, C2, and C3, whereas the value of the variable VCTX1 is given by four constants C4, C5, C6, and C7.

Array vld_table[17+17] is the decoding information table, and is so configured as to join the two pieces of decoding information as illustrated in FIGS. 30A and 30C.

As in the program as illustrated in FIG. 29, the function vld is a main function. In the function vld, the base address of the decoding information table is set by the function vld_baseaddr, and the two pieces of configuration information are loaded into the configuration information register file 270 by two functions load_v.

In this example, the cascade function is used, and the contents of the configuration information for the code word detectors 321 are changed to instantly perform the additional decoding process. The function vld_decode is executed using the first piece of configuration information, so that, to the variable cond0, the value of CCMAP(ID) of the corresponding decoded code number ID is outputted as a function value. The function vld_decode_cascade is executed using the second piece of configuration information, so that, to the variable cond2, the value of CCMAP(ID) of the corresponding decoded code number ID is outputted as a function value. The "if(cond1||cond2)" portion is processed by two vld_br instructions, using two bits in the condition code register 260.

Specifically, in the case where the value of CCMAP is "0," the decoding information is outputted as the function value, whereas in the case where the value of CCMAP is not "0," a number obtained by subtracting the suffix, i.e., an additional one bit obtained by moving the read position forward by one bit, from the decoding information is outputted as the function value. As described above, the suffix of a residual code can be employed to simplify the process.

FIG. 32 illustrates a second example of the code that is to be decoded in this embodiment of the present invention. In this example, there are 16 code words and the maximum code length is 6 bits, and therefore the code is represented properly by the configuration information as illustrated in FIG. 5, and an entire code tree is covered by the single piece of configuration information. In this example, the table can be represented with (6+3)×16=144 bits in the case where the table is formed with a fixed length.

Figure 33:
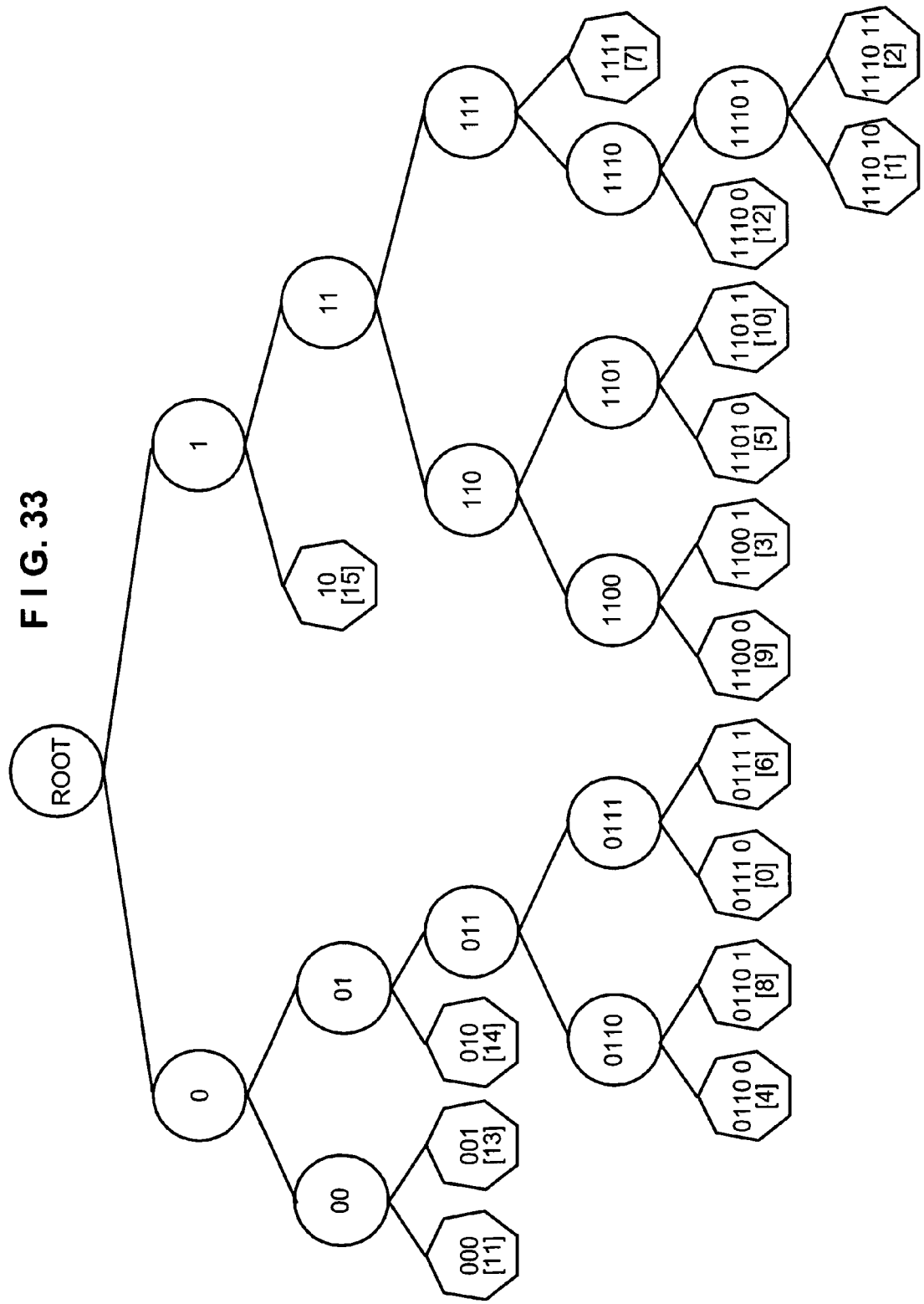
FIG. 33 illustrates an exemplary code tree that represents the code table of FIG. 32.

FIG. 33 illustrates an exemplary code tree that represents the code table as illustrated in FIG. 32. This code tree can be represented with 30 bits when coded.

FIG. 34 illustrates an example of correspondences between the configuration information, the decoded code values, the decoding information, and the code words, when the code defined by the code table of FIG. 32 is decoded. In this example, the number of code words is 16, and therefore when the number of code word detectors 321 is 17, one of the code word detectors 321 is superfluous. Accordingly, the code word detector 321 with the decoded code number of "16" is configured in the same manner as the code word detector 321 with the decoded code number of "15," which is higher in the order of priority. This prevents the code word detector 321 with the decoded code number of "16" from being selected.

FIG. 35 illustrates an exemplary C language program for decoding the code that is defined by the code table of FIG. 32. In this example, because the number of code words is small and all of them can be classified as leaves (CODELEAF), the use of CCMAP is not necessary and the program is simple.

Figure 37A:
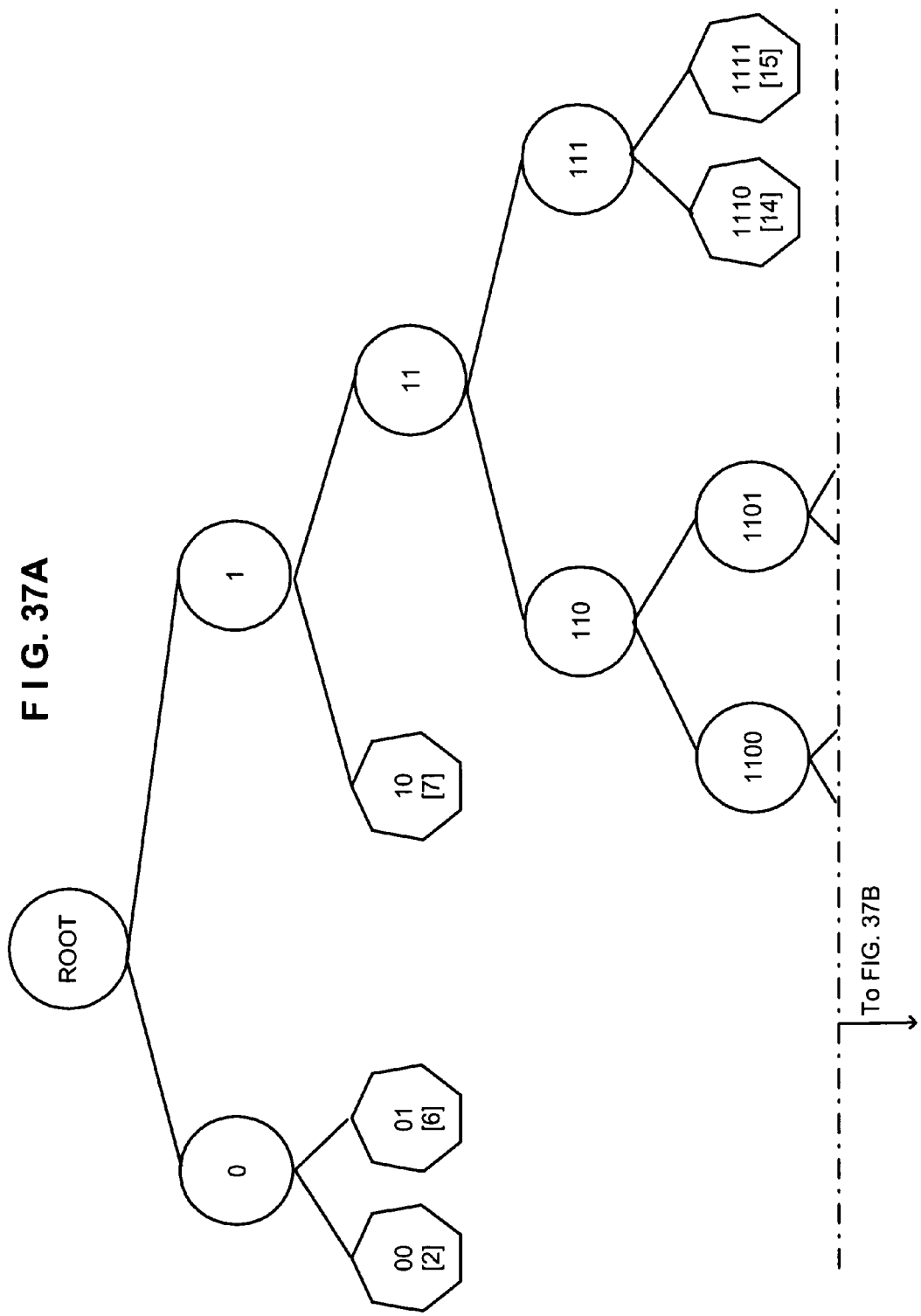
FIG. 37 illustrates an exemplary code tree that represents the code table of FIG. 36.
Figure 37B:
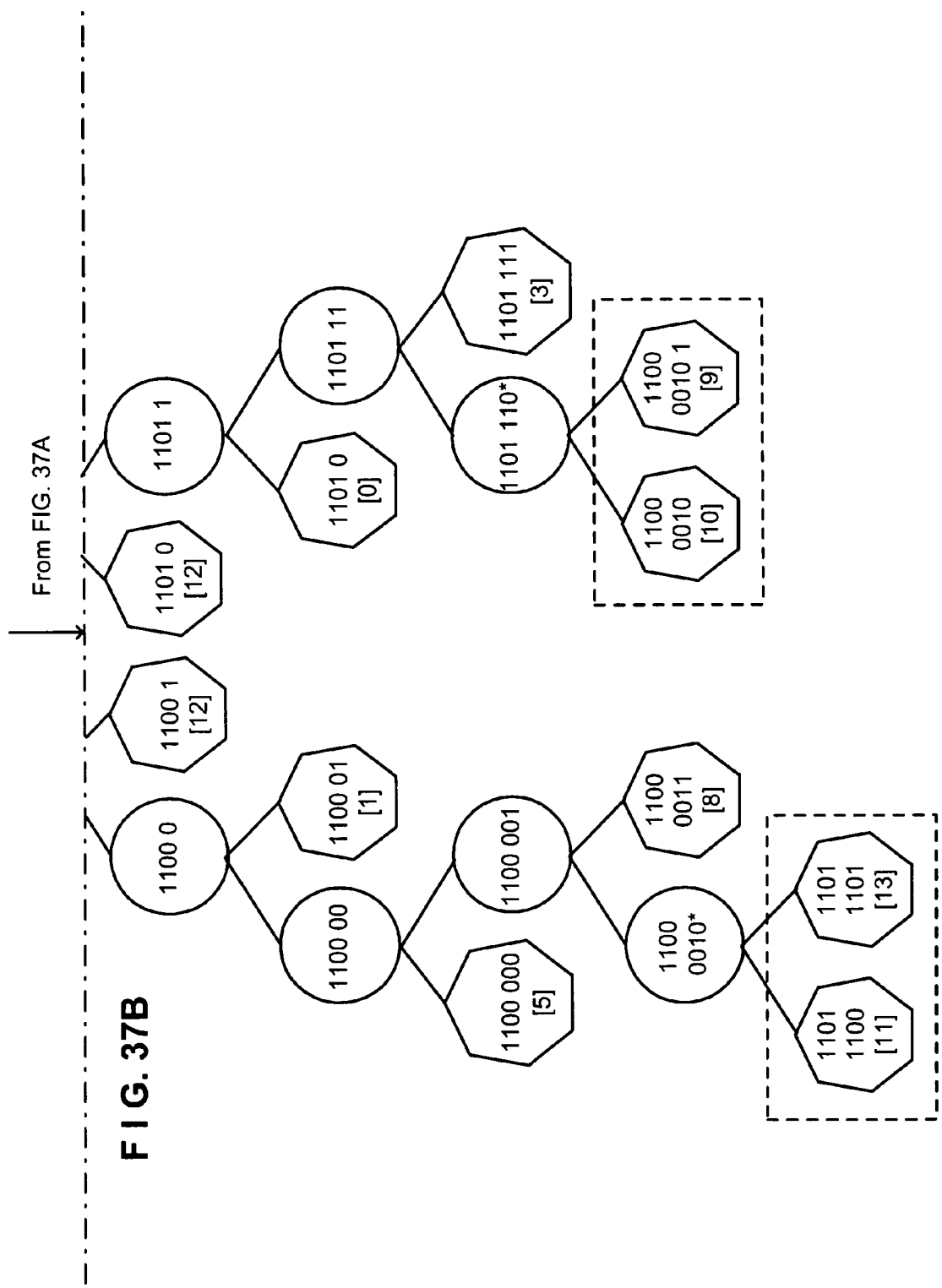

FIG. 36 illustrates a third example of the code that is to be decoded in this embodiment of the present invention. In this example, the number of code words is 16 as in the second example, but the maximum code length is 9 bits. FIG. 37 illustrates an exemplary code tree that represents the code table as illustrated in FIG. 36. This code tree can also be represented with 30 bits, but when the table is formed with the fixed length, (9+4)×16=208 bits are required. The code table of FIG. 36 can be coded with the same number of bits as the code table of FIG. 32, but in the case of the fixed-length table, the number of bits is 44% more than that of the code table of FIG. 32.

In this example, one code word has consecutive 0s on the MSB side, and other code words have consecutive 1s on the MSB side, and therefore, assigning different values of GP and GC to different groups is effective. However, the suffix, i.e., the remaining part of the code word excluding the consecutive bits on the MSB side, is a maximum of 7 bits long, which exceeds 6 bits, which GC (2 bits) and UC (4 bits) have in combination.

FIG. 37 illustrates an exemplary code tree that represents the code table of FIG. 36.

FIGS. 38A, 38B, and 38C illustrate an example of correspondences between the configuration information, the decoded code values, the decoding information, and the code words, when the code defined by the code table of FIG. 36 is decoded. FIG. 38A illustrates the configuration information, which is to be processed in the decoding process RVLD. Any code word that is not decoded with the configuration information of FIG. 38A is classified as a node (CODENODE), and only the prefix of the code word is decoded, while the suffix thereof is processed with one of the tables of FIGS. 38B and 38C. Specifically, in the case where the decoded code number is "11," the table of FIG. 38B is used to decide on one of the pieces of decoding information "11" and "13." Similarly, in the case where the decoded code number is "14," the table of FIG. 38C is used to decide on one of the pieces of decoding information "9" and "10." The portions classified as nodes (CODENODE) are enclosed by rectangles in FIG. 37.

Since this configuration information involves two nodes (CODENODE), three of the code word detectors 321 are superfluous, and accordingly, the decoded code numbers "12," "15," and "16" are set to dummy, taking advantage of the priority levels.

FIG. 39 illustrates an exemplary C language program for decoding the code that is defined by the code table of FIG. 36. This program performs the decoding process using the single piece of configuration information as illustrated in FIG. 38 and two functions. In the code according to the code table of FIG. 36, the number of bits of GC and UC is not sufficient, and therefore, despite the fact that the number of code words is smaller than the number of code word detectors 321, the entire tree cannot be represented by this single piece of configuration information. Accordingly, in this example, the portions classified as the nodes (CODENODE) are processed separately by a separate function. The "if(cond0)" portion of the program corresponds to the branch process using CCMAP which determines whether or not the separate function is to be executed for the process.

FIG. 40 illustrates a fourth example of the code that is to be decoded in this embodiment of the present invention. In this example, the last bit of each of all pieces of decoding information except the decoding information "0" represents the sign (positive or negative) of the decoding information. A tree that represents the code table of FIG. 40 can be represented with 130 bits when coded. A corresponding fixed-length table can be represented with (13+4)×65=1105 bits.

FIGS. 41A and 41B illustrate an example of correspondences between the configuration information, the decoded code values, the decoding information, and the code words, when the code defined by the code table of FIG. 40 is decoded. FIG. 41A illustrates normal configuration information, and FIG. 41B illustrates configuration information that supposes the cascade function. In this example, the configuration information is so configured that prefixes of code words whose suffix is 1 bit long form a majority, and the vld_show_s instruction and the vld_get_s instruction are used to accomplish efficient processing. In the configuration information, "CODENODE1" represents a code word whose suffix is 1 bit long, and "CODENODE2" represents a code word whose suffix is 2 bits long.

Figure 42A:
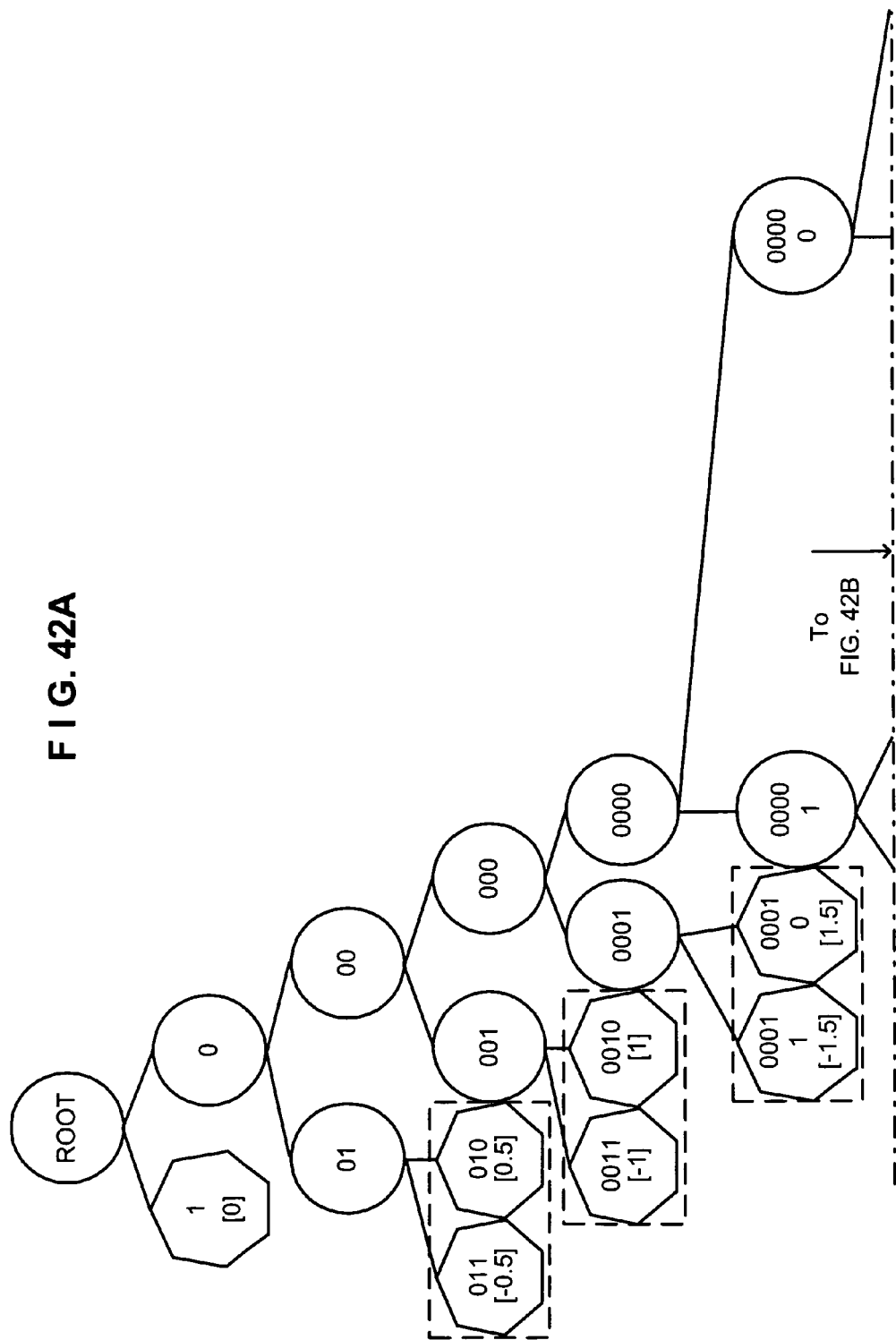
FIG. 42 illustrates the first half of an exemplary code tree that represents the code table of FIG. 40.
Figure 42B:
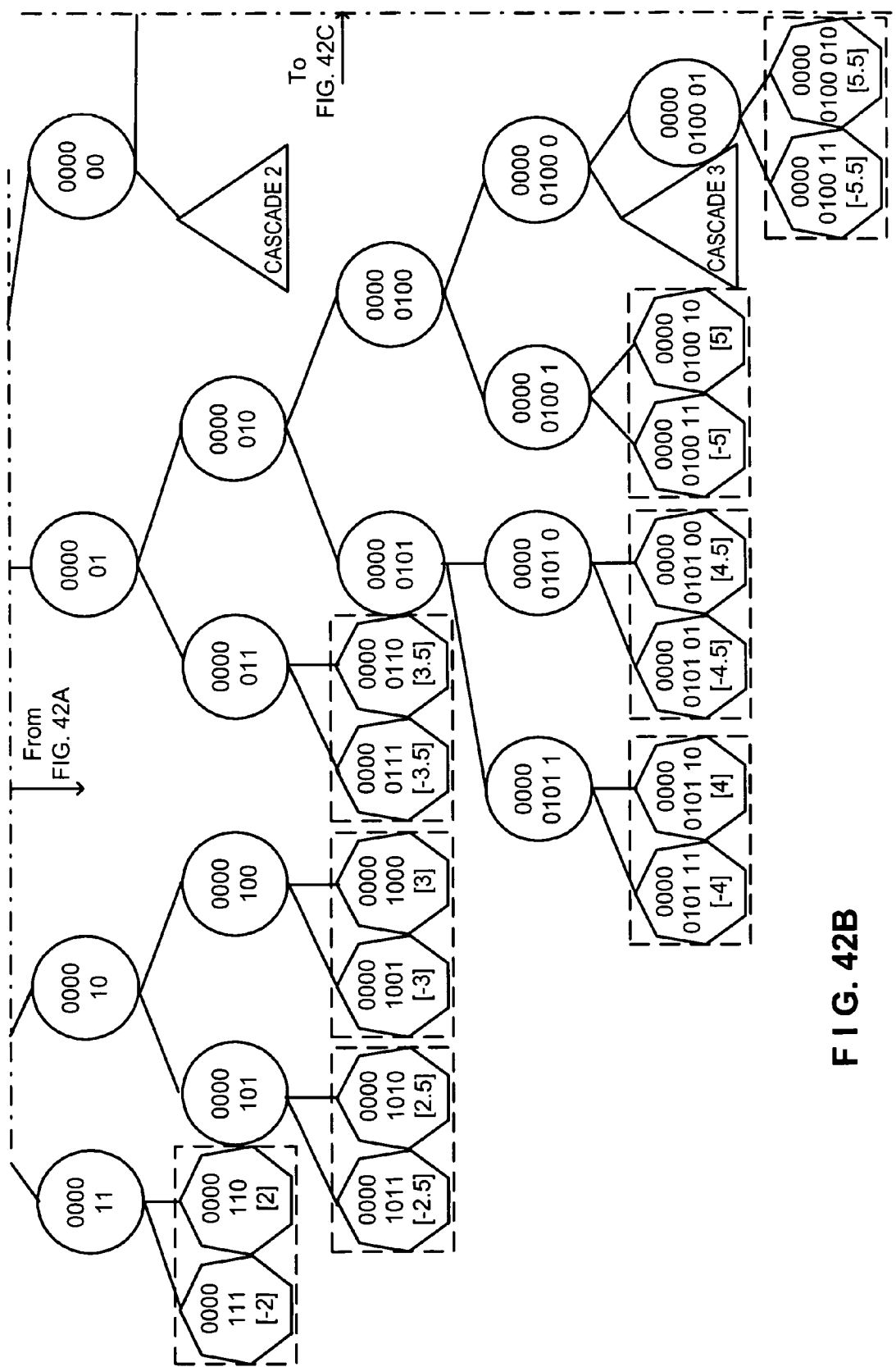
Figure 42C:
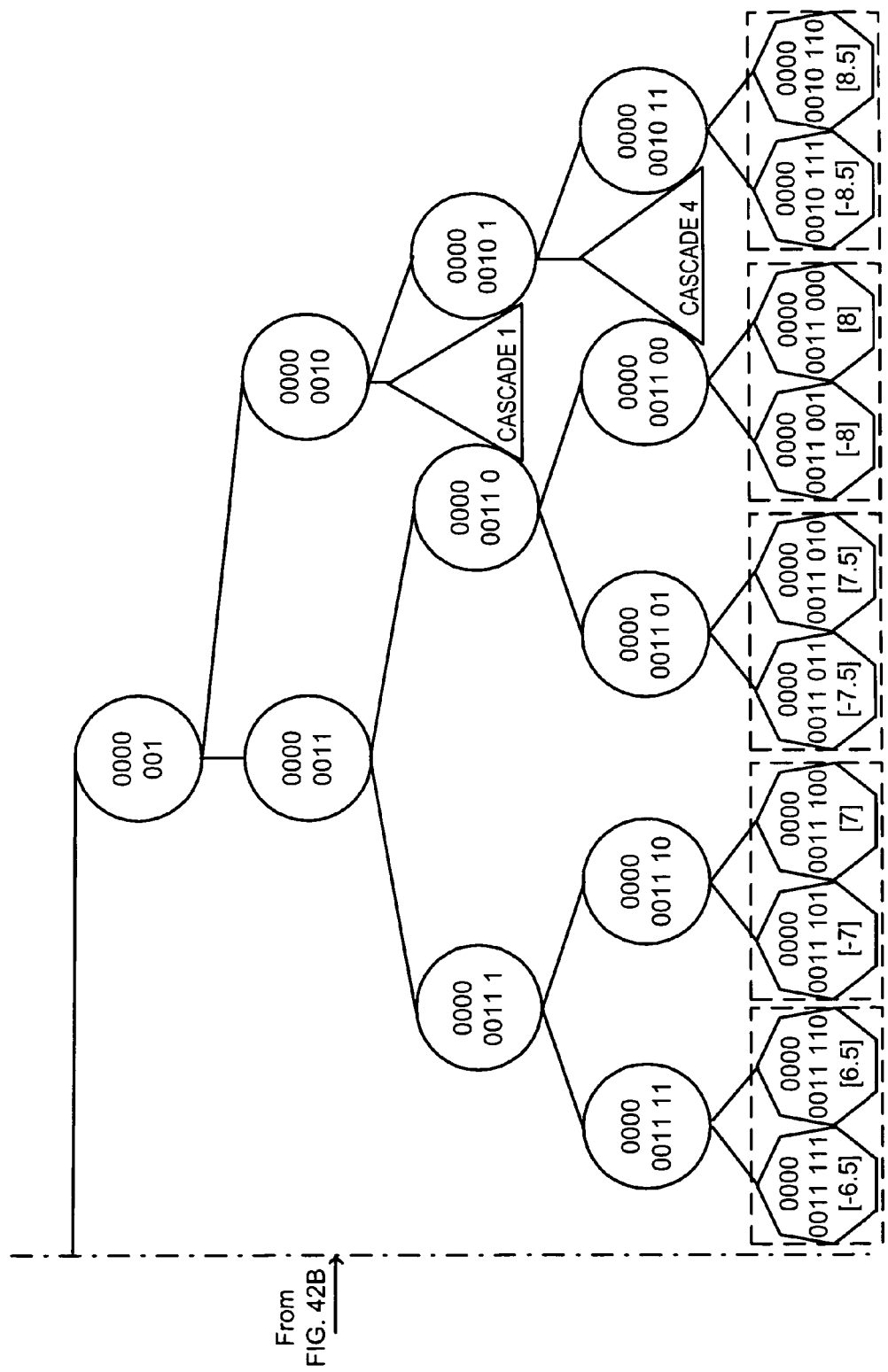
Figure 43A:
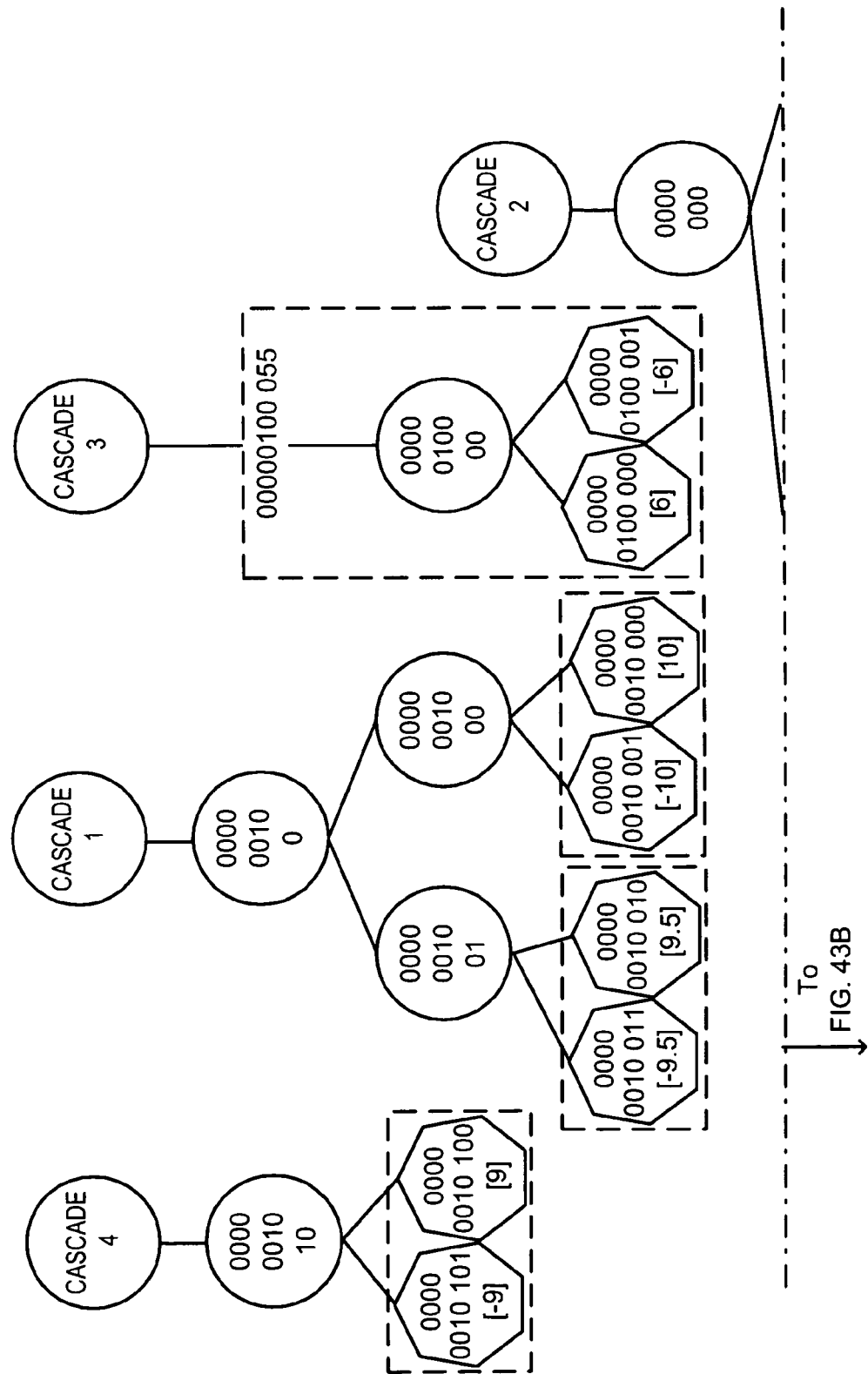
FIG. 43 illustrates the second half of the exemplary code tree that represents the code table of FIG. 40.
Figure 43B:
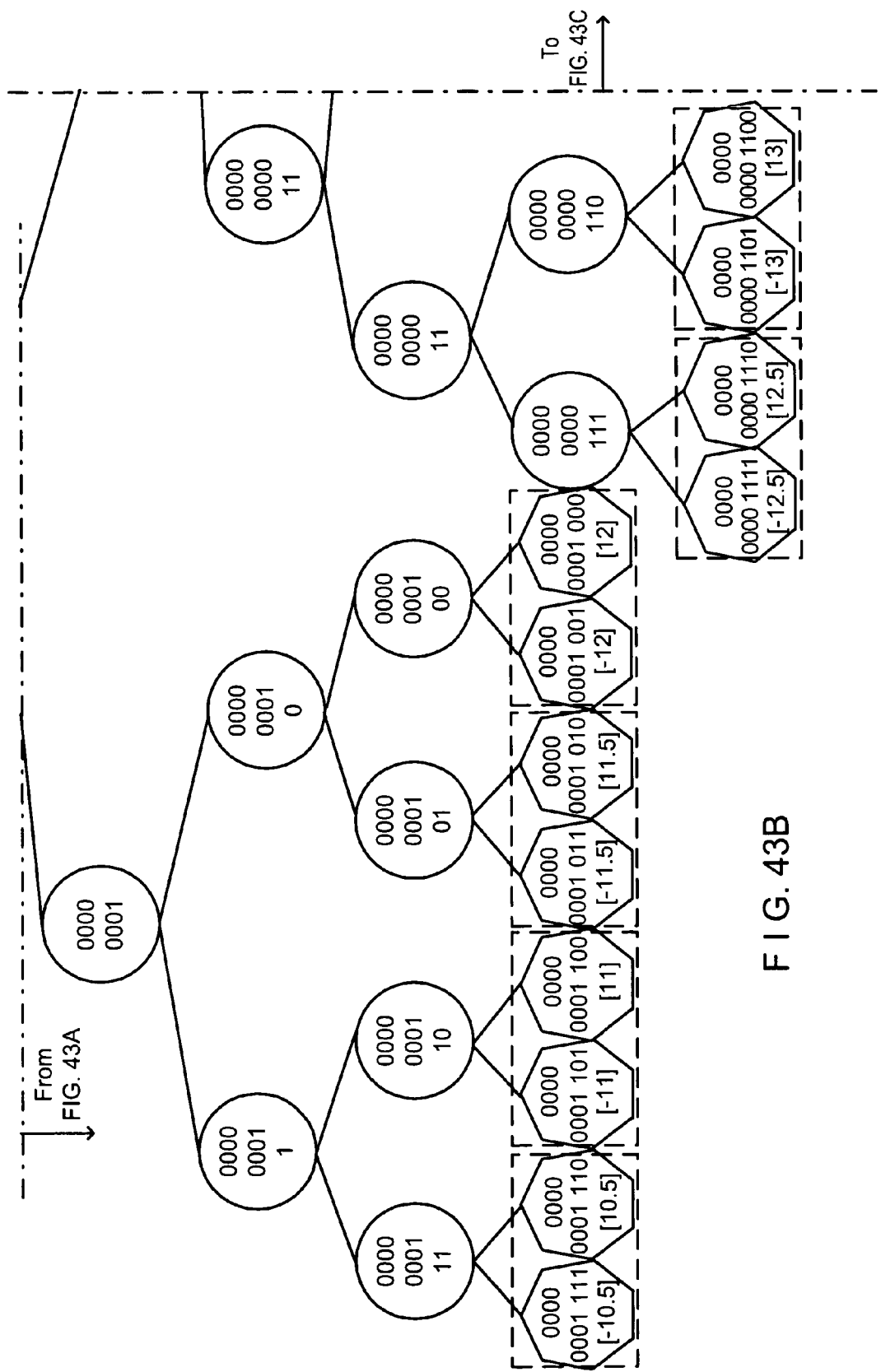
Figure 43C:
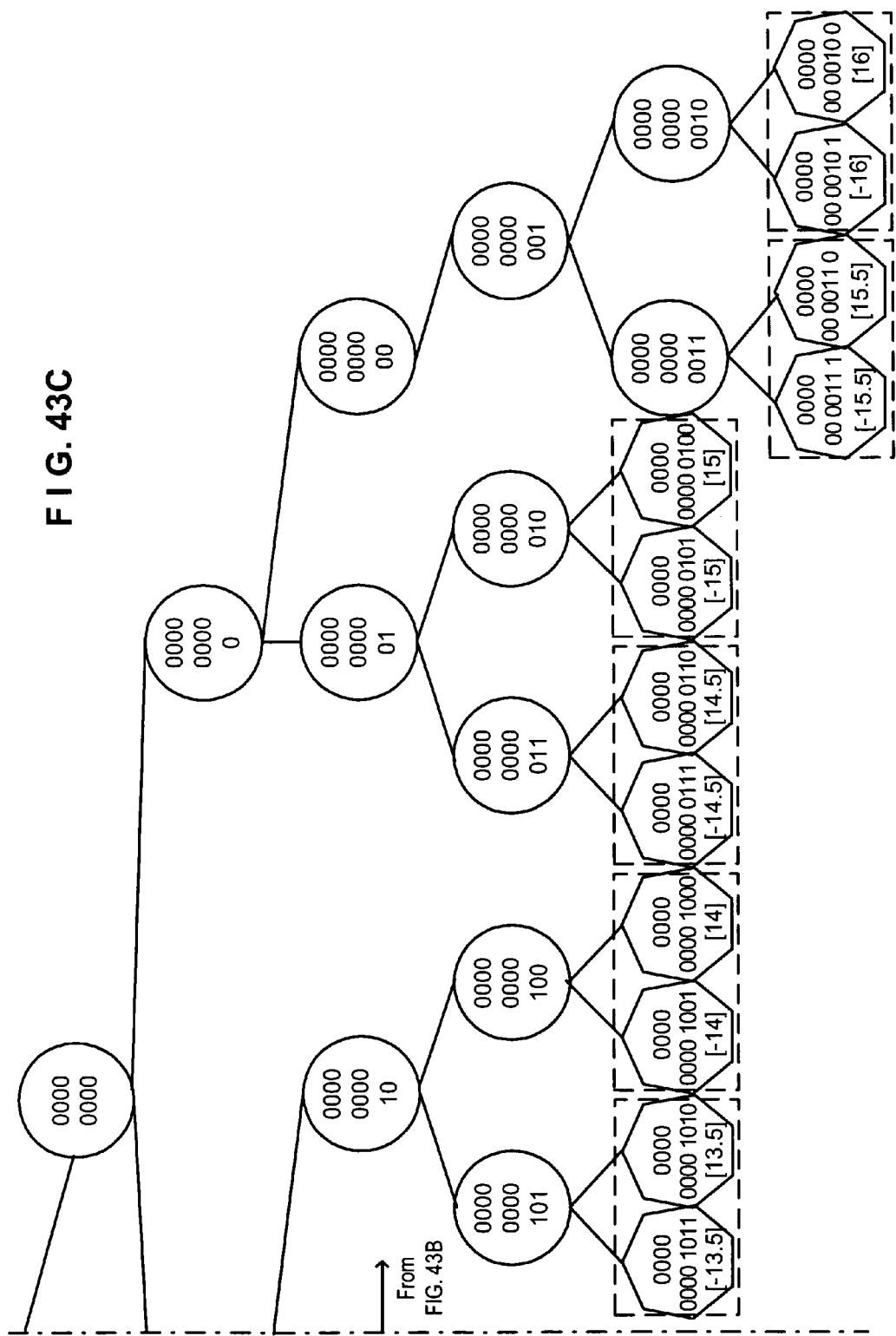

FIGS. 42 and 43 illustrate an exemplary code tree that represents the code table of FIG. 40. FIG. 42 illustrates a code tree for code words that are covered by the configuration information of FIG. 41A. Four nodes represented by a triangle in FIG. 42, cascade1, cascade2, cascade3, and cascade4, are not covered by the configuration information of FIG. 41A. The nodes cascade1, cascade2, cascade3, and cascade4 correspond to four code trees as illustrated in FIG. 43, and almost all of the code words therein are covered by the configuration information of FIG. 41B.

FIG. 44 illustrates an exemplary C language program for decoding the code that is defined by the code table of FIG. 40. In this program, the two pieces of configuration information are used with the cascade function, usage of CCMAP is varied depending on the configuration information, and "if(cond0)" and "if(cond2)" are nested one within the other to accomplish the process. As described above, the configuration information is so configured that the prefixes of the code words whose suffix is 1 bit long form a majority, but only one code word has a suffix that is 2 bits long. Accordingly, a branch is caused to process that exceptional code word separately by if(cond2).

The code tree starting with cascade3 as illustrated in FIG. 43 is classified as CODENODE2, and a portion enclosed by a rectangle corresponds to the suffixes that are not included in the configuration information. Since these suffixes are 2 bits long, the vld_get_s instruction and the getbits instruction are used to process the two bits one by one.

All leaves, except those in cascade3, that are enclosed by rectangles in FIGS. 42 and 43 correspond to the code words whose suffix is 1 bit long, and are processed by the vld_show_s instruction or the vld_get_s instruction. Availability of the vld_show_s instruction and the vld_get_s instruction makes it possible to adequately support code trees of a great height. Compared to other programs, the present program neither involves a significant increase in the number of branches and nor involves a significantly complicated process, leading to the expectation that the whole process can be accomplished with a fewer number of cycles. Sixty-five code words, i.e., approximately four times seventeen code words, are supported, while the most of them are covered by the two pieces of configuration information.

As described above, according to this embodiment of the present invention, in the decoding apparatus equipped with the plurality of code word detectors 321, the average decoding time can be shortened while the configuration information for each of the code word detectors 321 are compressed and held in the configuration information register file 270.

While, in this embodiment of the present invention, the code tree is represented by the configuration information of a small size, approximately 100 bits long, the program can be written with great efficiency without making the decoding process complicated. In video compression standards such as MPEG-1, MPEG-2, MPEG-4, H.263, and VC-1, the code table is often composed of 17 or less code words. Most code tables of such a small size can be processed with one or two instructions (e.g., the vld_decode instruction, the vld_show instruction, etc.) based on the seventeen code word detectors 321. Since each of the code word detectors 321 can be formed by circuitry containing a few simple computing units such as a shifter, an AND computing unit, a comparator, and an adder, the code word detector 321 can be implemented in low-latency circuitry even at high frequencies.

According to this embodiment of the present invention, in the case where the code table contains a great number of code words or where the code table does not allow the corresponding entire code tree to be represented well by a single piece of configuration information, some methods can be employed to handle such code tables, such as the method of applying the cascade function while employing a plurality of pieces of configuration information, and the method of processing the code tree corresponding to the prefixes with a single piece of configuration information while processing the suffixes with branching based on CCMAP. Moreover, these methods can be accomplished without complicating the program. By handling the code words that occur frequently and are therefore designed to have a short code length as the leaves in the code tree for the prefixes, it is possible to omit the process for the suffix with respect to those code words with a short code length. This makes it possible to decode the code words with a short code length in a smaller number of cycles than the code words with a long code length. This contributes to reducing the average number of cycles for the decoding process.

According to this embodiment of the present invention, by using the decoding information table with the use of the union as in the C language program as illustrated in FIG. 29, it is possible to write the program while combining the use of the function pointer for the subsequent process and the integer value for the decoding information that does not require the subsequent process. When this decoding information table is referred to, CCMAP can be used to decide on a function call or data reference. This makes it possible to write the program with great simplicity. This also eliminates the need to hold the function pointer and the integer value separately in the decoding information table. By adding the base address of the decoding information table and the index in the vld_get type instructions, it is possible to reduce the add instructions, the shift instructions, and the load instructions among general instructions. Moreover, the cascade function can be applied to reduce the branch processes.

When, on the assumption that the code lengths are arranged in an ascending order, the lengths of the code words in the configuration information are defined by differences in length, the differences can be represented with a small number of bits. According to this embodiment of the present invention, this characteristic can be taken advantage of to represent the configuration information with a smaller number of bits.

According to this embodiment of the present invention, the configuration information can be represented with a smaller number of bits by grouping and defining the configuration information such that the highest-order bits are common among the same group.

According to this embodiment of the present invention, the decoding process can be performed efficiently by adding minor circuitry and instructions to a general-purpose processor while making good use of the data cache and the general instructions originally provided in the processor. Further, since reconfiguration is allowed, a plurality of codecs can be supported easily by modifying the configuration information and the program.

The present application contains subject matter related to that disclosed in Japanese Priority Patent Application JP 2008-097062 filed in the Japan Patent Office on Apr. 3, 2008, the entire contents of which is hereby incorporated by reference.

Note that this embodiment of the present invention has been described by way of example. It should be understood by those skilled in the art that various modifications, combinations, sub-combinations and alterations may occur depending on design requirements and other factors insofar as they are within the scope of the appended claims or the equivalents thereof.

Although the processor 120 provided with the decoding unit 290 has been described in the above-described embodiment of the present invention, this is not essential to the present invention, and the processes performed by the decoding unit 290 may be implemented in software.

The procedures described above with reference to the above-described embodiment of the present invention can also be considered as a method that has a series of those procedures, a program for causing a computer to perform the series of those procedures, or a recording medium that has the program stored therein. Examples of such a recording medium include a compact disc (CD), a MiniDisc (MD), a digital versatile disk (DVD), a memory card, and a Blu-ray Disc®.

What is claimed is:

1. A variable-length code decoding apparatus, comprising:
   a code buffer configured to hold a variable-length code in which the same bit value continues for a given number of bits from the most significant bit;
   a plurality of code word detectors each of which is configured to read the variable-length code from said code buffer to detect whether or not the variable-length code matches a specified code word;
   a decoded code word determination block configured e word decoded, based on detection results of said plurality of code word detectors; and
   a configuration information holding section configured to hold configuration information containing the specified code words to be detected in said plurality of code word detectors and code lengths of the specified code words as arranged in an ascending order of code length,
   wherein, in the configuration information, only one bit is held for the bit value that continues for the given number of bits, and at least one of the code lengths is defined by a difference from another one of the code lengths.

2. The variable-length code decoding apparatus according to claim 1, wherein said plurality of code word detectors are classified into a plurality of groups, and in the configuration information, only one bit is held, for each group, for the bit value that continues for the given number of bits.

3. The variable-length code decoding apparatus according to claim 2, wherein in the configuration information, another given number of bits that follow the given number of bits of the same bit value are held for each group.

4. The variable-length code decoding apparatus according to claim 1, wherein said decoded code word determination block determines the code word decoded, in accordance with priority levels assigned to said plurality of code word detectors.

5. The variable-length code decoding apparatus according to claim 1, wherein, when the variable-length code does not match the specified code word in any of said plurality of code word detectors, said decoded code word determination block outputs information to that effect.

6. The variable-length code decoding apparatus according to claim 1, wherein, when detection results have been obtained successively by more than one of said plurality of code word detectors with different pieces of the configuration information, said decoded code word determination block determines the code word decoded based on a subsequent one of the detection results only when no match has been detected in any previous one of the detection results.

7. The variable-length code decoding apparatus according to claim 1, wherein said configuration information holding section is configured to further hold a condition code bitmap that stores, for each of said plurality of code word detectors, information about whether or not a branch is to be caused in a process when the specified code word has been detected, and stores information about whether or not a branch is to be caused in a process when the specified code word has not detected in any of said plurality of code word detectors.

8. A computer, comprising:
   a code buffer configured to hold a variable-length code in which the same bit value continues for a given number of bits from the most significant bit;
   a plurality of code word detectors each of which is configured to read the variable-length code from said code buffer to detect whether or not the variable-length code matches a specified code word;
   a decoded code word determination block configured to determine a code word decoded, based on detection results of said plurality of code word detectors; and
   a configuration information holding section configured to hold configuration information containing the specified code words to be detected in said plurality of code word detectors and code lengths of the specified code words as arranged in an ascending order of code length,
   wherein the computer executes an instruction to, in the configuration information, recover one or more of the code lengths that are defined by a difference from another one of the code lengths, and recover the given number of consecutive bits of the same bit value in accordance with the code length, based on one bit held for the bit value that continues for the given number of bits, and thereafter cause said plurality of code word detectors to perform the detection.

9. A program store on a readable non-transitory medium for causing a computer that includes
   a code buffer configured to hold a variable-length code in which the same bit value continues for a given number of bits from the most significant bit,
   a plurality of code word detectors each of which is configured to read the variable-length code from the code buffer to detect whether or not the variable-length code matches a specified code word,
   a decoded code word determination block configured to determine a code word decoded, based on detection results of the plurality of code word detectors, and
   a configuration information holding section configured to hold configuration information containing the specified code words to be detected in the plurality of code word detectors and code lengths of the specified code words as arranged in an ascending order of code length,
   the program, comprising the steps of:
   in the configuration information, recovering one or more of the code lengths that are defined by a difference from another one of the code lengths;
   in the configuration information, recovering the given number of consecutive bits of the same bit value in accordance with the code length, based on one bit held for the bit value that continues for the given number of bits; and
   causing the plurality of code word detectors to perform the detection.

10. A variable-length code decoding method employed in a variable-length code decoding apparatus that includes
    a code buffer configured to hold a variable-length code in which the same bit value continues for a given number of bits from the most significant bit,
    a plurality of code word detectors each of which is configured to read the variable-length code from the code buffer to detect whether or not the variable-length code matches a specified code word,
    a decoded code word determination block configured to determine a code word decoded, based on detection results of the plurality of code word detectors, and
    a configuration information holding section configured to hold configuration information containing the specified code words to be detected in the plurality of code word detectors and code lengths of the specified code words as arranged in an ascending order of code length,
    the method comprising the steps of:
    in the configuration information, recovering one or more of the code lengths that are defined by a difference from another one of the code lengths;
    in the configuration information, recovering the given number of consecutive bits of the same bit value in accordance with the code length, based on one bit held for the bit value that continues for the given number of bits; and
    causing the plurality of code word detectors to perform the detection.

* * * * *